US010005879B2

(12) United States Patent
Vaidyanathan et al.

(10) Patent No.: US 10,005,879 B2
(45) Date of Patent: Jun. 26, 2018

(54) METHOD FOR PRODUCING AN ORGANIC SEMICONDUCTOR DEVICE

(75) Inventors: Subramanian Vaidyanathan, Basel (CH); Marcel Kastler, Mannheim (DE); Bertha Tan, Hong Kong (CN); Mi Zhou, Singapore (SG)

(73) Assignee: BASF SE, Ludwigshafen (DE)

( * ) Notice: Subject to any disclaimer, the term of this patent is extended or adjusted under 35 U.S.C. 154(b) by 678 days.

(21) Appl. No.: 13/365,673

(22) Filed: Feb. 3, 2012

(65) Prior Publication Data

US 2013/0200336 A1    Aug. 8, 2013

(51) Int. Cl.
*H01L 51/00* (2006.01)
*C08G 61/12* (2006.01)
*H01L 51/05* (2006.01)

(52) U.S. Cl.
CPC ........ *C08G 61/126* (2013.01); *H01L 51/0036* (2013.01); *H01L 51/0043* (2013.01);
(Continued)

(58) Field of Classification Search
CPC ............. H01L 51/0035; H01L 51/0036; H01L 51/0039; H01L 51/0043; H01L 51/0558;
(Continued)

(56) References Cited

U.S. PATENT DOCUMENTS

2003/0130358 A1\* 7/2003 Sato ...................... A01N 25/22
514/706
2008/0087883 A1 4/2008 Suwa et al.
(Continued)

FOREIGN PATENT DOCUMENTS

CN     1742393 A    3/2006
CN   101162729 A    4/2008
(Continued)

OTHER PUBLICATIONS

U.S. Appl. No. 14/357,014, filed May 8, 2014, Kaihovitra, et al.
(Continued)

*Primary Examiner* — Dale E Page
*Assistant Examiner* — Quovaunda V Jefferson
(74) *Attorney, Agent, or Firm* — Oblon, McClelland, Maier & Neustadt, L.L.P.

(57) ABSTRACT

A method for producing an organic semiconductor device (110) having at least one organic semiconducting material (122) and at least two electrodes (114) adapted to support an electric charge carrier transport through the organic semiconducting material (122) is disclosed. The organic semiconducting material (122) intrinsically has ambipolar semiconducting properties. The method comprises at least one step of generating at least one intermediate layer (120) which at least partially is interposed between the organic semiconducting material (122) and at least one of the electrodes (114) of the organic semiconductor device (110). The intermediate layer (120) comprises at least one thiol compound having the general formula HS—R, wherein R is an organic residue. The thiol compound has an electric dipole moment pointing away from the SH-group of the thiol compound. The electric dipole moment has at least the same magnitude as the electric dipole moment in 4-Phenyl-thiophenol. By the intermediate layer (120) an ambipolar charge carrier transport between the electrodes (114) is suppressed in favor of a unipolar charge carrier transport.

18 Claims, 5 Drawing Sheets

(52) U.S. Cl.
CPC . *C08G 2261/124* (2013.01); *C08G 2261/146* (2013.01); *C08G 2261/1412* (2013.01); *C08G 2261/312* (2013.01); *C08G 2261/3223* (2013.01); *C08G 2261/3229* (2013.01); *C08G 2261/3246* (2013.01); *C08G 2261/334* (2013.01); *C08G 2261/3327* (2013.01); *C08G 2261/344* (2013.01); *C08G 2261/364* (2013.01); *C08G 2261/414* (2013.01); *C08G 2261/51* (2013.01); *C08G 2261/92* (2013.01); *H01L 51/0558* (2013.01)

(58) Field of Classification Search
CPC ............ C08G 61/126; C08G 2261/124; C08G 2261/146; C08G 2261/312; C08G 2261/3223; C08G 2261/3229; C08G 2261/334; C08G 2261/344; C08G 2261/364; C08G 2261/414; C08G 2261/51; C08G 2261/92; C08G 2261/1412
See application file for complete search history.

(56) References Cited

U.S. PATENT DOCUMENTS

| | | | |
|---|---|---|---|
| 2010/0176387 A1 | 7/2010 | Kuzumoto et al. | |
| 2010/0283047 A1* | 11/2010 | Facchetti et al. | 257/40 |
| 2010/0326527 A1 | 12/2010 | Facchetti et al. | |
| 2011/0120558 A1 | 5/2011 | Facchetti et al. | |

FOREIGN PATENT DOCUMENTS

| | | |
|---|---|---|
| CN | 101965374 A | 2/2011 |
| JP | 2008-91680 | 4/2008 |
| JP | 2010-161312 | 7/2010 |
| JP | 2011-051439 | 3/2011 |
| KR | 2010-00116786 A | 10/2010 |
| WO | WO 2009/098253 A1 | 8/2009 |
| WO | WO 2010/068619 * | 6/2010 |
| WO | WO 2011/148699 A | 12/2011 |
| WO | WO 2011/148699 A1 | 12/2011 |

OTHER PUBLICATIONS

Extended European Search Report dated Jul. 5, 2011, in Patent Application No. 11152010.2.

Xiaoyang Cheng, et al., "Controlling Electron and Hole Charge Injection in Ambipolar Organic Field-Effect Transistors by Self-Assembled Monolayers", Advanced Functional Materials, vol. 19, No. 15, XP001548749, Aug. 10, 2009, pp. 2407-2415.

Emanuele Orgiu, et al., "Tuning the charge injection of P3HT-based organic thin-film transistors through electrode functionalization with oligophenylene SAMs", Journal of Materials Chemistry, vol. 20, No. 48, Dec. 28, 2010, XP055000910, pp. 10798-10800.

Pablo Stoliar, et al., "Charge Injection across Self-Assembly Monolayers in Organic Field Effect Transistors: Odd-Even Effects", Journal of the American Chemical Society, vol. 129, No. 20, XP055000862, May 2, 2007, pp. S1-S7.

Combined Chinese Office Action and Search Report dated Mar. 24, 2016 in Patent Application No. 201280068246.1 (with Partial English translation and English translation of categories of cited documents).

Search Report in corresponding ROC (Taiwan) Patent Application No. 101103691, Date of Completion of Search: Jun. 25, 2015 (translation, only).

Communication pursuant to Rules 161(1) and 162 EPC in corresponding European Patent Application No. 12703061.7 dated Sep. 14, 2012.

Translation of the Notification of Reasons for Refusal in corresponding Japanese Patent Application No. 2014-555091, Dispatch Date: Sep. 7, 2015.

KIPO's Notice of Preliminary rejection (English Translation) in Korean Patent Application No. 10-2014-7024607.

U.S. Appl. No. 13/809,496, filed Jan. 10, 2013, Koehler, et al.

* cited by examiner

METHOD FOR PRODUCING AN ORGANIC SEMICONDUCTOR DEVICE

FIELD OF THE INVENTION

The invention relates to a method for producing an organic semiconductor device. In further aspects, the invention relates to an organic semiconductor device and to a use of an intermediate layer comprising at least one thiol compound for suppressing an ambipolar charge carrier transport in favor of a unipolar charge carrier transport in an organic semiconductor device. The method, the organic semiconductor device and the use according to the present invention preferably may be applied in the field of organic electronics in general or, more preferably, in the field of organic field effect transistors (OFETs).

RELATED ART

In recent years, organic semiconductors, such as polymeric semiconductors, monomeric semiconductors or oligomeric semiconductors, have received considerable attention as promising alternative materials to conventional semiconductors, such as silicon. Thus, in various fields of electronics, conventional, inorganic semiconducting materials may be replaced, or even new types of devices may be created by using organic semiconductors. Thus, organic diodes and light emitting diodes (OLEDs), organic photovoltaic devices (OPDs), and organic transistors, specifically organic field effect transistors (OFETs), may be mentioned. In the following, without restricting the scope of the present invention, the present invention mainly will be described with regard to potential uses in organic field effect transistors. However, other applications are possible.

One of the major advantages of organic semiconductors is their potential to be processed into thin films by using low cost techniques. Thus, specifically, polymeric materials may be processed into transistors with low manufacturing cost, specifically for low-end electronic applications. The key requirements of organic semiconductors, specifically of polymeric semiconductors, are excellent charge-transport characteristics, chemical stability, good solubility in organic solvents, and inexpensive low-temperature processing. In order to utilize organic materials in complementary circuit technologies for higher performance and lower power dissipation, such as complementary metal oxide semiconductors (CMOS), a complementary operation of distinct p-channel semiconductors (hole transporting semiconductors, in the following also referred to as p-type semiconductors) and n-channel semiconductors (electron transporting semiconductors, in the following also referred to as n-type semiconductors) in one CMOS device is required. In addition to the application in organic thin-film transistors (OTFTs), the combination of these two types of semiconducting materials may also be essential in OLED technology or OPV technology, specifically for efficient exciton formation or splitting.

A large number of organic materials for use in organic electronic devices are known and are being developed. In most cases, a key feature of the organic materials is an extended π-electron system, providing a delocalization of orbital wave functions and, thereby, a transport of positive and/or negative charge carriers. In comparison with inorganic semiconductors, typically, mobile positive charges in organic semiconductors are referred to as "holes", and mobile negative charges as "electrons". This nomenclature will be used in the following, even though it is known that charge carrier transport in organic materials is not fully comparable to charge carrier transport in conventional inorganic semiconductors. Similarly, the conduction band of conventional inorganic semiconductors typically is compared to the lowest unoccupied molecular orbital (LUMO) of the organic materials, and the valence band of inorganic semiconducting materials is typically compared to the highest occupied molecular orbital (HOMO) of the organic semiconductor, even though some shortcomings of these comparisons are known to exist.

Amongst the large number of organic materials known to have semiconducting properties, naphthalene-imide semiconductor polymers have received considerable attention in the past, specifically with regard to their potential use in organic transistor devices. Reference may be made to WO 2009/098253 A1, to Z. Chen et al.: Napththalenedicarboximide- vs Perylenedicarboximide-Based Copolymers. Synthesis and Semiconducting Properties in Bottom-Gate N-Channel Organic Transistors, J. Am. Chem. Soc. 2009, 131, 8-9, and to H. Yan et al.: A high-mobility electron-transporting polymer for printed transistors, Nature, Vol 457, 5 Feb. 2009, pages 679-686.

Specifically, poly{[N,N'-bis(2-octyldodecyl)-naphthalene-1,4,5,8-bis(dicarboximide)-2,6-diyl]-alt-5,5'-(2,2'-bithiophene)} (P(NDI2OD-T2)) has been known to exhibit a high n-channel mobility, i.e. a high mobility of negative charge carriers or electrons, in the range of 0.1 to 0.65 $cm^2V^{-1}s^{-1}$ in TGBC (top gate-bottom contact) thin-film transistor architectures with variation in dielectrics, substrate and semiconductor deposition process. It has also been measured under ambient atmosphere and was confirmed to be stable. Being an example of a low-bandgap semiconductor, specifically a donor-acceptor copolymer, it exhibits a certain degree of ambipolarity, whereby both holes and electrons can be injected and transported through the material, specifically in transistor and more specifically in OTFT device configurations. This can be observed when the semiconducting polymer is biased under negative voltage, wherein the measured p-channel mobility, i.e. the mobility of positive charge carriers, was observed to be in the range of 0.1 to 0.2 $cm^2V^{-1}s^{-1}$. Under certain bias conditions, there is a region where both holes and electrons are present in the channel. This ambipolar region, however, leads to several technical challenges. Thus, firstly, high or inconsistent threshold voltages are necessary in order to obtain a unipolar p-type or unipolar n-type regime. Further, secondly, complex effects of trapping of charge carriers occur, since one or both types of charge carriers are subject to different trapping, specifically due to their different chemical properties, such as different chemical moieties. Hence, a pronounced ambipolarity in many cases is undesirable, such as for applications such as display backplanes utilizing OTFTs.

Besides the technical challenges regarding the design of materials and charge transport, electrode design has known to be a key issue in improving the performance of organic electronic devices. Thus, in organic field effect transistors, while moving into smaller channel length regions to provide higher performance, contact resistance has become a more prominent problem. Thus, in many cases, the contact resistance issue has come forward due to the mismatch in energy level between the work function of the metal electrode and the HOMO of the organic semiconducting material (for hole injection) and/or due to the mismatch in energy level between the work function of the metal electrode and the LUMO of the organic semiconducting material (for electron injection). In devices having a larger channel length, this effect in most cases may be ignored, since the resistance of the charge transport along the channel is the more dominant effect. However, for small channel length devices, whose application will become more crucial in the near future, solutions of this problem will have to be found, such as by minimizing the misalignment of the energy levels.

Several approaches with regard to solving this problem are known from the literature. Thus, obviously, one approach may be the use of contact materials having appropriate energy levels, such as the use of low work function metals for electron injection or high work function metals for hole injection, and/or the design of organic materials having appropriate HOMO and/or LUMO levels. However, other approaches are known. Thus, intermediate layers in between the electrodes and the organic semiconductors may be used. Specifically, it is known from the literature that self-assembled monolayers (SAMs) in between the electrodes and the organic semiconductors may be used. It is known that SAMs on metal electrodes may affect the work function of the electrode. Thus, in M. Kitamura et al.: Threshold voltage control of bottom-contact n-channel organic thin-film transistors using modified drain/source electrodes, Applied Physics Letters 94, 083310 (2009), bottom-contact n-channel $C_{60}$ thin-film transistors with drain/source electrodes modified by benzenethiol derivatives are disclosed. Self-assembled monolayers are arranged between a regular electrode and an organic semiconducting material, introducing dipoles. The dipole moments are known to modify the interface to yield lower injection barriers for charges, either holes or electrons to be transported. Further, thiol compounds have been evaluated in adjusting the work function of materials, such as silver and gold. Thus, reference may be made to D. Boudinet et al.: Modification of gold source and drain electrodes by self-assembled monolayer in staggered n- and p-channel organic thin film transistors, Organic Electronics 11 (2010) 227-237, to X. Cheng et al.: Controlling Electron and Hole Charge Injection in Ambipolar Organic Field-Effect transistors by Self-Assembled Monolayers, Adv. Funct. Mater. 2009, 19, 2407-2415, and to J.-P. Hong et al.: Tuning of Ag work functions by self-assembled monolayers of aromatic thiols for an efficient hole injection for solution processed triisopropylsilylethynyl pentacene organic thin film transistors, Applied Physics Letters 92, 143311 (2008). Specifically, it is known that the use of self-assembled monolayers may lead to clean ambipolar characteristics with balanced electron and hole mobilities (see X. Cheng et al.).

However, as outlined above, ambipolarity of organic transistor devices in many technical applications is unwanted and leads to technical challenges. Specifically, control of transistor devices having ambipolar charge carrier transport is rather difficult. Further, many applications require the use of purely n-channel or purely p-channel transistor devices. Specifically, mainly due to the chemical stability of negative charges in organic materials, the design of n-type organic semiconducting materials and, thereby, the design of n-channel organic field effect transistors still remains an open issue.

Problem to be Solved

It is therefore an objective of the present invention to provide organic semiconductor devices and methods for producing organic semiconductor devices overcoming the challenges and problems of the methods and devices known from prior art. Specifically, an objective of the present invention is to provide unipolar devices having good charge carrier transport and charge carrier injection properties.

It was also an object of the present invention to provide a method of suppressing the ambipolar charge carrier transport in a device comprising an ambipolar organic semiconducting material.

SUMMARY OF THE INVENTION

This objective technical problem is solved by the subject-matter of the independent claims. Preferred embodiments of the present invention, which may be implemented in isolation or in arbitrary combination with other embodiments, are disclosed in the dependent claims.

In a first aspect of the present invention, a method for producing an organic semiconductor device is disclosed. The organic semiconductor device has at least one organic semiconducting material and at least two electrodes adapted to support an electric charge carrier transport through the organic semiconducting material. As used herein, the term organic semiconductor device refers to an electronic device having at least one organic semiconducting material. The organic semiconducting device may be a purely organic semiconducting device, solely consisting of organic materials. However, other embodiments are possible, such as organic semiconductor devices having at least one organic semiconducting material and at least one inorganic semiconducting material. The term semiconducting material refers to any material, which is suited to support a charge carrier transport, i.e. suited for providing an electric current. Preferably, the field effect mobility of the semiconducting material in a bulk state for at least one type of charge carriers, i.e. for negative charge carriers and/or positive charge carriers, preferably may be at least $10^{-5}$ cm$^2$V$^{-1}$s$^{-1}$, more preferably at least $10^{-4}$ cm$^2$V$^{-1}$s$^{-1}$ and even more preferably at least $10^{-3}$ cm$^2$V$^{-1}$s$^{-1}$.

Further, as used herein, the term electrode is used for an element which is adapted to be electrically contacted and which is adapted to inject negative and/or positive charge carriers into the organic semiconducting material and/or which is adapted to extract negative and/or positive charge carriers from the organic semiconducting material. Preferably, at least one of the electrodes may comprise at least one conductive material, such as a conductive material having a conductivity of at least $1 \times 10^5$ S/m, more preferably of at least $1 \times 10^6$ S/m and even more preferably of at least $5 \times 10^6$ S/m or even at least $20 \times 10^6$ S/m, measured in a bulk state. Thus, preferably, at least one of the electrodes may comprise at least one metal material, such as aluminum, silver, gold or combinations thereof.

Generally, the organic semiconductor device may be or may comprise any type of electronic device. Thus, the organic semiconductor device may be or may comprise at least one diode and/or at least one transistor. As outlined above, preferably, the organic semiconductor device is an organic field-effect transistor or comprises at least one organic field-effect transistor. As used herein, the term organic field-effect transistor (OFET) refers to a field-effect transistor using at least one organic semiconducting material as a channel material. Thus, the organic field effect transistor may comprise at least one source electrode and at least one drain electrode, and, further, at least one channel, wherein the organic field effect transistor is designed such that positive charge carriers and/or negative charge carriers may be transported through the channel from the source electrode to the drain electrode or vice versa. Further, an organic field effect transistor typically comprises at least one gate electrode, i.e. an electrode, which is designed to create an electric field adapted to influence the charge carrier density in the channel. Typically, the channel and the gate electrode are separated by at least one insulating material, such as by at least one insulating layer. By applying the electric field, the density of positive or negative charge carriers in the channel may be adjusted, providing a possibility of controlling positive or negative charge carriers in the channel, specifically providing a possibility of controlling positive or negative charge carrier transport from the source electrode to the drain electrode or vice versa. Preferred embodiments of the organic semiconductor device and, more preferably, of the organic field effect transistor, are disclosed below.

The organic semiconducting material intrinsically has ambipolar semiconducting properties. As used herein, the term ambipolar semiconducting properties relates to a material, which has electron and hole mobilities differing by less than two orders of magnitude, more preferably by less than one order of magnitude. These electron and hole mobilities refer to bulk mobilities of the organic semiconducting material and/or to mobilities measured under normal operating conditions. The term normal operating conditions may refer to a measurement setup, in which the mobilities are measured by using two bare metal electrodes in contact with the organic semiconducting material, such as Au, Ag, Al or combinations thereof. Thus, the measurement may be performed by using an organic semiconductor in an OFET configuration, specifically in an organic thin-film transistor (OTFT) configuration, which is in contact with a source electrode and a drain electrode made of Au and/or Ag, deposited by any known means. Thus, the metal electrode may be deposited by sputtering, e-beam deposition, thermal deposition, printing or other means. The term "bare" refers to the fact that, in between the metal electrode and the organic semiconducting material, no intentional additional layer, such as no intentional additional surface groups, are inserted, such as by inserting on the bare metal. Preferably, the above-mentioned definition of ambipolar semiconducting properties refers to a measurement setup of this kind.

The method further comprises at least one step of generating at least one intermediate layer which at least partially is interposed between the organic semiconducting material and at least one of the electrodes. Various embodiments of generating the intermediate layer exist, depending on the setup of the organic semiconductor device. Thus, for generating the intermediate layer, the intermediate layer may be deposited onto the electrodes or at least one of the electrodes, before depositing the at least one organic semiconducting material on top. Alternatively or additionally, the at least one intermediate layer may be generated by depositing this at least one intermediate layer onto the at least one organic semiconducting material, before depositing the electrodes and/or at least one of the electrodes. Combinations of these possibilities and/or other possibilities are feasible. Most preferably, the at least one intermediate layer is deposited on top of the electrodes and/or at least one of the electrodes, before depositing one or more layers of the at least one organic semiconducting material.

As used herein, the term "at least partially is interposed" refers to the fact that the at least one intermediate layer may extend beyond the lateral borders of the electrode-organic semiconductor material-interface. Thus, the at least one intermediate layer, in at least one dimension, may extend beyond this interface. Further, as used herein, the term layer refers to a thin film of material, preferably a thin film having a thickness of less than 50 nm, preferably less than 10 nm and even more preferably less than 1 nm. Preferably, the term layer refers to a closed layer. However, the term also comprises the possibility of incomplete coverage, such as an island growth and/or layers having openings or holes. Preferably, the coverage of the surface covered by the layer is more than 20%, more preferably more than 50% or even more preferably more than 80%. The term intermediate layer refers to a layer which is interposed in between at least two other materials, such as in between two layers. Thus, the intermediate layer may at least partially be interposed in between at least one metal layer of the at least one electrode and at least one layer of the organic semiconducting material. Preferably, in this setup or other embodiments of the present invention, the organic semiconductor device comprises a layer setup, preferably a layer setup of layers having a thickness which does not extend beyond 1 µm, more preferably beyond 500 nm.

The at least one intermediate layer may be interposed between the organic semiconducting material and one or more of the electrodes. Thus, the electrodes may comprise at least one source electrode and at least one drain electrode. The at least one intermediate layer may be interposed between the at least one source electrode and the at least one organic semiconducting material and/or may be interposed between the at least one drain electrode and the at least one organic semiconducting material. Preferably, the intermediate layer is interposed in between both of these electrodes and the organic semiconducting material. More preferably, the at least one source electrode and the at least one drain electrode are arranged in one and the same plane of a layer setup of the organic semiconductor device, such as by depositing the source electrode and the drain electrode onto a substrate, before depositing the at least one intermediate layer on top of one or both of these electrodes, before depositing the at least one organic semiconducting material on top of this setup.

For generating the at least one intermediate layer, various techniques known to the skilled person may be used. Thus, the at least one intermediate layer may be generated by using processing from solution, wherein the solution comprises at least one solvent and at least one intermediate layer material of the intermediate layer in a dissolved and/or dispersed state. Processing from solution may comprise spin-coating, printing, Langmuir-Blodgett techniques, doctor blading, combinations of these techniques or other techniques. Further, alternatively or additionally to processing from solution, other techniques may be used, such as chemical vapor deposition and/or physical vapor deposition.

In the method according to the present invention, the intermediate layer comprises at least one thiol compound having the general formula HS—R, wherein R is an organic residue. As used herein, the term "organic residue" refers to one or more organic moieties being bound to the HS-group by covalent binding, complex binding or ionic binding. Preferred embodiments of the organic residue R are listed below.

The thiol compound has a dipole moment. As used herein, the term dipole moment refers to an electric dipole moment, which is a measure of the separation of positive and negative electrical charges in one molecule of the thiol compound. The electric dipole moment is a vector pointing from the negative charge to the positive charge. In complex charge systems, such as the electronic systems of HS—R molecules, charge distributions have to be considered, which may be calculated and/or measured.

Preferably, the dipole moment of the thiol compound is a dipole moment pointing from the S—H moiety towards the residue R, that means that the dipole moment of the thiol compound forms an angle of less than 90°, preferably less than 45°, with the bond between the S of the S—H-group and the atom of the R-residue connected to the S of the S—H-group. The bond between the S of the S—H-group and the atom of the R-residue connected to the S of the S—H-group may be covalent, ionic or complex. Preferably, the bond is covalent.

The dipole moment of the thiol compound can have the same direction and at least the same magnitude as the dipole moment in 4-Phenylthiophenol, i.e. a dipole moment pointing from the S—H moiety towards the residue R, and having at least the same magnitude as the dipole moment of 4-Phenylthiophenol.

As used herein, the expression "direction" in the context of the dipole moment of the thiol compound refers to the question of the dipole moment vector pointing towards the SH-group of the thiol compound or pointing away from the SH-group of the thiol compound. Thus, dipole moments having a dipole moment vector pointing towards the SH-group of the thiol compound may be classified as dipole moments having a first direction, whereas dipole moments having a dipole moment vector pointing away from the SH-group of the thiol compound may be classified as dipole moments having a second direction. Presently, the thiol compound to be used in the intermediate layer can have the same direction as the dipole moment in 4-Phenylthiophenol. Thus, in the present invention, the at least one thiol compound to be used in the at least one intermediate layer has a dipole moment vector pointing away from the SH-group of the thiol compound, for example as in 4-Phenylthiophenol.

Thus, preferably, the thiol compound used in the intermediate layer of the present invention has an electric dipole moment of at least 1.22, more preferably of at least 1.3, even more preferably of at least 1.4 and most preferably of at least 1.5. Herein, all dipole moments are given using the unit "Debye", corresponding to approximately $3.33564 \times 10^{-30}$ Coulomb×m.

The electric dipole moment of the thiol compound may be calculated and/or may be measured, such as by using a commercial dipole meter. Presently, without wishing to restrict the scope of the claims, all dipole moments given herein are calculated by using the molecular modeling and computational chemistry software "Spartan '06", as widely used and known to the skilled person and as commercially available by Wavefunction, Inc., Irvine, USA. The dipole moments were calculated for equilibrium geometry at ground state, using the density functional B3LYP method. However, other types of calculations and/or measurements may be used, since, as outlined above, the direction and the magnitude of the dipole moment of the thiol compound may simply be compared to the direction and the magnitude of 4-Phenylthiophenol. Whichever way of measuring and/or calculating the dipole moment is used, the thiol compound simply can have to have the same direction and at least the same magnitude as the dipole moment in 4-Phenylthiophenol.

By the intermediate layer, an ambipolar charge carrier transport between the electrodes is suppressed in favor of a unipolar charge carrier transport. In other words, by using the at least one intermediate layer having the at least one thiol compound having the properties named above, the ambipolar semiconducting properties of the at least one organic semiconducting material are reduced, and unipolar charge carrier transport is increased. As used herein, the term unipolar charge carrier transport refers to a charge carrier transport of charge carriers, wherein electrons and holes have mobilities differing by at least two orders of magnitude or more, preferably by more than three orders of magnitude. Thus, by using the at least one intermediate layer, the ambipolar semiconducting properties of the at least one organic semiconducting material may be changed into unipolar semiconducting properties. These unipolar semiconducting properties may comprise n-type unipolar semiconducting properties or p-type unipolar semiconducting properties, wherein n-type unipolar semiconducting properties are preferred. Thus, by using the at least one intermediate layer having the at least one thiol compound, the ambipolar semiconducting properties may be changed into n-type unipolar semiconducting properties, i.e. n-type semiconducting properties with electron mobilities which are at least two orders of magnitude higher than hole mobilities, or into p-type unipolar semiconducting properties, i.e. semiconducting properties with hole mobilities being at least two orders of magnitude higher than electron mobilities.

As outlined above, in a preferred embodiment, the ambipolar charge carrier transport of the at least one organic semiconducting material may be suppressed in favor of a negative charge carrier transport. Thus, preferably, by introducing the at least one intermediate layer having the at least one thiol compound, compared to a semiconductor device without having the at least one intermediate layer, the ambipolar charge carrier transport preferably is converted into a unipolar charge carrier transport, preferably into an n-type unipolar charge carrier transport.

In a further preferred embodiment, the thiol compound is chosen such that R has electron donating properties at least equal to those of the biphenyl group in 4-Phenylthiophenol.

In a preferred embodiment, the method of the present invention includes at least one thiol compound having the general formula HS—R, wherein R is selected from the group consisting of:

Alkyl, wherein the alkyl group is linear, cyclic or branched and may comprise 1 to 20 carbon atoms, more preferably 10 to 20 carbon atoms, preferably decyl, undecyl, dodecyl, tridecyl, tetradecyl, hexadecyl, octadecyl, eicosanyl and cyclohexyl;

Benzyl, Phenyl;

alkylphenyl, wherein the alkyl group of the phenyl may comprise 1 to 20 carbon atoms, is linear, cyclic or branched and preferably located at the phenyl in 2- or 4-position with respect to the thiol group, such as 2-methylphenyl, 3-methylphenyl or 4-methylphenyl, 2,3-Dimethylphenyl, 2,4-Dimethylphenyl, 2,6-Dimethylphenyl, 3,4-Dimethylphenyl, 3,5-Dimethylphenyl, 2,3,4-Trimethylphenyl, 2,4,5-Trimethylphenyl, 2,4,6-Trimethylphenyl, 2,3,5,6-Tetramethylphenyl, 2,3,4,6-Tetramethylphenyl or 2,3,4,5-Tetramethylphenyl, 2,3,4,5,6-Pentamethylphenyl, n-butylphenyl, preferably 2-n-butylphenyl, 4-n-butylphenyl, t-butylphenyl, pentylphenyl, hexylphenyl, cyclohexylphenyl, heptylphenyl, octylphenyl, ethylhexylphenyl, and more preferably 4-methylphenyl or 4-butylphenyl;

Alkoxyphenyl, preferably Methoxyphenyl, more preferably 2-methoxyphenyl, 3-methoxyphenyl or 4-methoxyphenyl; Dimethoxyphenyl, preferably 2,3-dimethoxyphenyl, 2,4-dimethoxyphenyl, 2,6-dimethoxyphenyl, 3,4-dimethoxyphenyl or 3,5-dimethoxyphenyl; Trimethoxyphenyl, preferably 2,3,4-Trimethoxyphenyl, 2,4,5-Trimethoxyphenyl or 2,4,6-Trimethoxyphenyl, 2,3,5,6-Tetramethylphenyl, 2,3,4,6-Tetramethylphenyl or 2,3,4,5-Tetramethylphenyl, 2,3,4,5,6-Pentamethylphenyl;

Alkoxythiophenyl, preferably Methylthiophenyl, more preferably 2-Methylthiophenyl, 3-Methylthiophenyl or 4-Methylthiophenyl, Benzylphenyl, Arylphenyl, preferably 4-Phenylphenyl, 2-Thionaphthyl, 4-(Dimethylamino)phenyl;

Heteroaryl, preferably 2-Thienyl.

In a further preferred embodiment, a combination of two or more of the above cited thiol compounds can be comprised.

In a further preferred embodiment, the thiol compound can be selected from one or more of: 1-Decanethiol; 4-Methylthiophenol; 4-(Methylthio)thiophenol; 3,4-Dimethoxythiophenol; 4-Butylthiophenol; 4-Phenylthiophenol; 2-Thionaphthol; 4-(Dimethylamino)thiophenol; Benzyl mercaptan; 2,3,4,5,6-Pentamethylbenzene-1-thiol.

In a preferred embodiment of the present invention, the thiol compound forms at least one self-assembling monolayer. As used herein, the term self-assembling monolayer (SAM) refers to an organized layer of amphiphilic molecules, in which one end of the molecule shows a special affinity to the substrate. Typically, the thickness of the self-assembled monolayer is within the range of 0.1 to 2 nm. The end of the molecule showing the affinity for the substrate, such as for the at least one electrode and/or the at least one organic semiconducting material (depending on the manufacturing technique), is often referred to as the head group of the molecule. SAMs may be created by chemisorption of hydrophilic or hydrophobic head groups on a substrate from either vapor phase or liquid phase, followed by a slow two-dimensional organization of tail groups such as hydrophobic tail groups.

In a further preferred embodiment of the present invention, the method further comprises the step of providing at least one gate electrode, wherein the gate electrode is adapted to influence the electric charge carrier transport between the electrodes by an electric field. Thus, the electrodes mentioned above may comprise a source and a drain electrode, wherein the gate electrode may be adapted to create an electric field in the organic semiconducting material, thereby influencing the electric charge carrier density and/or the electric charge carrier transport between the source electrode and the drain electrode or vice versa. Thus, the at least one gate electrode may be separated from the at least one organic semiconducting material by at least one insulator material, in order to prevent a charge carrier injection from the gate electrode into the organic semiconducting material and/or in order to prevent an extraction of charge carriers from the organic semiconducting material into the gate electrode.

The gate electrode may preferably be selected from the group consisting of a bottom-gate electrode being located at least partially between a substrate of the organic semiconducting device and the organic semiconducting material, and a top gate electrode, being located at least partially on a side of the organic semiconducting material facing away from a substrate of the organic semiconductor device. Thus, the gate electrode may be deposited before depositing the organic semiconducting material, or the gate electrode may be deposited on top of the organic semiconducting material. In both cases, at least one insulating layer may be interposed in between the gate electrode and the organic semiconducting material. Thus, in a further preferred embodiment of the present invention, the method may further comprise the step of generating at least one insulating layer, wherein the insulating layer is at least partially located between the gate electrode and the organic semiconducting material. This at least one insulating layer may comprise the use of an arbitrary organic and/or inorganic material, such as the use of poly(methyl methacrylate) (PMMA) and/or polystyrene (PS).

In a further preferred embodiment of the present invention, the at least one electrode, i.e. the at least one source electrode and/or the at least one drain electrode and/or, preferably, the at least one gate electrode, comprises a metal, preferably a metal selected from the group consisting of silver, gold and aluminum, and, more preferably, silver and/or gold.

In a further preferred embodiment, the organic semiconducting material is a low-bandgap organic semiconducting material. Thus, in a preferred embodiment, an energy gap between the HOMO level and the LUMO level of the organic semiconducting material lies within the range of 1.0 to 2.5 eV, more preferably in the range of 1.5 to 2.0 eV, as measured by using absorption UV-VIS-spectroscopy. Alternatively or additionally, the HOMO level of the organic semiconducting material preferably may be in the range of 5.5 to 6.5 eV below the vacuum level, such as measured by cyclic voltammetry, such as disclosed in WO 2009/098253 A1. The LUMO level preferably may be within the range of 3.5 to 4.5 eV below the vacuum level, measured by using cyclic voltammetry. With regard to the electrodes, preferably with regard to the source electrode and/or the drain electrode, preferably, the work function of an electrode material used in this electrode is within the range of 3.8 to 5.6 electron volts, more preferably within the range of 4.0 to 5.4 electron Volts. Thus, preferably, silver and/or gold are used as electrode materials.

In a further preferred embodiment of the present invention, the organic semiconducting material comprises at least one semiconducting polymer.

In a preferred embodiment, the at least one organic semiconducting material may comprise one or more naphthalene-based semiconducting polymers, and associated compositions, composites, and/or devices. These naphthalene-based semiconducting polymers can exhibit semiconductor behavior such as high carrier mobility and/or good current modulation characteristics in a field-effect device, light absorption/charge separation in a photovoltaic device, and/or charge transport/recombination/light emission in a light-emitting device. In addition, these naphthalene-based semiconducting polymers can possess certain processing advantages such as solution-processability and/or good stability (for example, air stability) in ambient conditions. The naphthalene-based semiconducting polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Preferably, the at least one organic semiconducting material, specifically the at least one semiconducting polymer and even more preferably the at least one naphthalene-based semiconducting polymer, may comprise at least one copolymer. More specifically, the polymers can be A-B copolymers comprising a first repeating unit (monomer A, $M_1$) that includes an aromatic imide, and a second repeating unit (monomer B, $M_2$) that includes one or more cyclic moieties. In various embodiments, both monomer A and monomer B can include an aromatic or otherwise highly conjugated cyclic (carbocyclic or heterocyclic) moieties, where such cyclic moieties can be optionally substituted or functionalized with one or more electron-withdrawing or electron-donating groups. The pairing of monomers A and B, the imide position functionalization of monomer A, and any additional functionalization on either monomer can be affected by one or more of the following considerations: 1) the electron-withdrawing capability for semiconductor processing in air and stable charge transport operation; 2) modulation of the majority carrier type depending on the electronic structure of monomers A and B; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achieving strong π-π interactions/intermolecular electronic coupling; and 8) bandgap modulation via electron donor-acceptor coupling of electron-poor (acceptor) and electron-rich (donor) A-B or B-A repeating units. The resulting polymers and related methods can be employed to enhance the performance of an associated device (e.g., an organic field effect transistor, a light-emitting transistor, a solar cell, or the like).

More specifically, monomer A of the present polymers generally comprises an optionally substituted (core-substituted and/or imide-substituted) naphthalene diimide or monoimide, while monomer B generally comprises one or more optionally substituted aromatic (or otherwise π-conjugated) monocyclic moieties. In certain embodiments, monomer B can include one or more linkers and/or one or more polycyclic moieties in addition to the one or more monocyclic moieties. In various embodiments, monomer B as a whole can comprise a highly conjugated system. The present teachings also relate to homopolymers of monomer A.

Throughout the application, where compositions are described as having, including, or comprising specific components, or where processes are described as having, including, or comprising specific process steps, it is contemplated that compositions of the present teachings also consist essentially of, or consist of, the recited components, and that the process of the present teachings also consists essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymer" or "polymeric compound" refers to a molecule (e.g., a macromolecule) including a plurality of one or more repeating units connected by covalent chemical bonds. A polymer can be represented by the general formula:

wherein M is the repeating unit or monomer, and n is the number of M's in the polymer. For example, if n is 3, the polymer shown above is understood to be:

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, such as a thienothiophene group or a group consisting of 3 to 7 fused thiophene rings, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

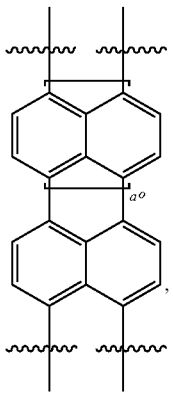

where a° can be an integer in the range of 0-3; coronenes (or analogs thereof containing one or more heteroatoms) having the formula:

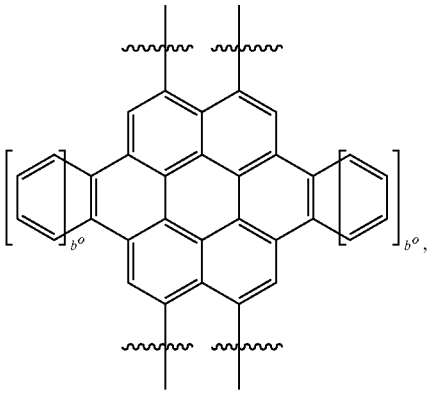

where b° can be an integer in the range of 0-3; and linear acenes (or analogs thereof containing one or more heteroatoms) having the formula:

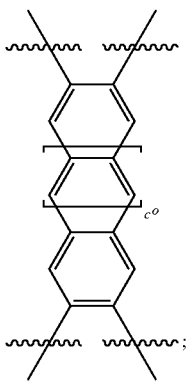

where c° can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_zH_{2z+1-t}X^o_t$, where $X^o$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as $—S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is as defined herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxoöxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

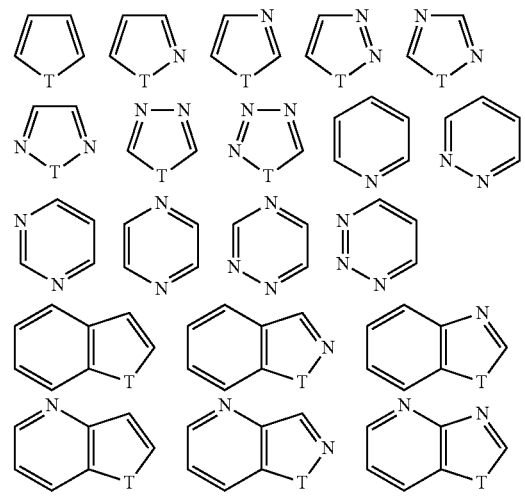

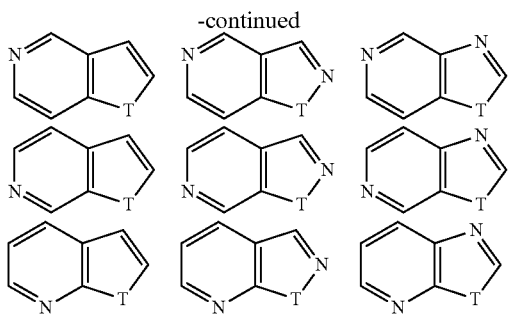

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^0$)$_2$$^+$, —N(R$^0$)$_3$$^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, —CON(R$^0$)$_2$, $C_{1-40}$ haloalkyl groups, $C_{6-14}$ aryl groups, and 5-14 membered electron-poor heteroaryl groups; where R$^0$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO$_2$, —CN, —NC, —S(R$^0$)$_2$$^+$, —N(R$^0$)$_3$$^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, and —CON(R$^0$)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^0$, —NH$_2$, —NHR$^0$, —N(R$^0$)$_2$, and 5-14 membered electron-rich heteroaryl groups, where R$^0$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents of monomers A and B are disclosed in groups or in ranges. It is specifically intended that the description includes each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Polymers described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. In some embodiments, the preparation of the present polymers can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As discussed above, the terms "p-type semiconducting material" or "p-type semiconductor" refer to a semiconductor material having holes as the majority current carriers. In some embodiments, when a p-type semiconductor material is deposited on a substrate, it can provide a hole mobility in excess of about $10^{-5}$ $cm^2/Vs$. In the case of field-effect devices, a p-type semiconductor can also exhibit a current on/off ratio of greater than about 10.

As further discussed above, the terms "n-type semiconducting material" or an "n-type semiconductor" refer to a semiconductor material having electrons as the majority current carriers. In some embodiments, when an n-type semiconductor material is deposited on a substrate, it can provide an electron mobility in excess of about $10^{-5}$ $cm^2/Vs$. In the case of field-effect devices, an n-type semiconductor can also exhibit a current on/off ratio of greater than about 10.

As used herein, the term "mobility" refers to a measure of the velocity with which charge carriers, for example, holes (or units of positive charge) in the case of a p-type semiconductor material and electrons in the case of an n-type semiconductor material, move through the material under the influence of an electric field.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

In a preferred embodiment of the present invention, the organic semiconducting material is selected from a polymer of the formula:

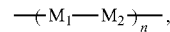

wherein $M_1$ is an optionally substituted naphthalene imide of the formula:

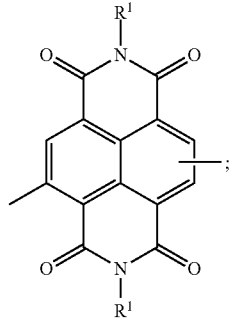

$M_2$ has a formula selected from:

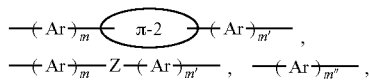

-continued

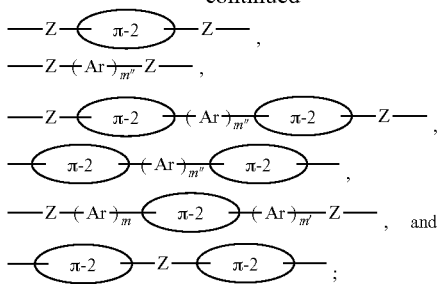

n is an integer between 2 and 5,000; and
$R^1$, π-2, Ar, Z, m, m', and m" are as defined herein.
More specifically, in the formula of $M_1$:

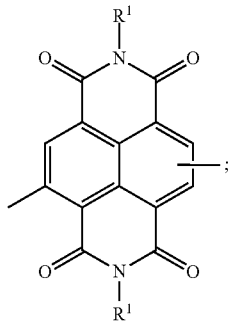

$R^1$, at each occurrence, is independently selected from H, a $C_{1-40}$ alkyl group, a $C_{2-40}$ alkenyl group, a $C_{1-40}$ haloalkyl group, and 1-4 cyclic moieties,
wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;
each of the $C_{1-40}$ alkyl group, the $C_{2-40}$ alkenyl group, and the $C_{1-40}$ haloalkyl group can be covalently bonded to the imide nitrogen atom via an optional linker; and
each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —$NH_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group.
In some embodiments, each of $R^1$ can be independently selected from H, a $C_{1-40}$ alkyl group, a $C_{2-40}$ alkenyl group, a $C_{2-40}$ alkynyl group, a $C_{1-40}$ haloalkyl group, -L-$R^a$, -L-$Ar^1$, -L-$Ar^1$—$Ar^1$, -L-$Ar^1$—$R^a$, -L-$Ar^1$—$Ar^1$—$R^a$, -L-$Cy^1$, -L-$Cy^1$-$Cy^1$, -L-$Cy^1$-$R^a$, and -L-$Cy^1$-$Cy^1$-$R^a$;

wherein:

L, at each occurrence, is independently selected from —Y—O—Y—, —Y—[S(O)$_w$]—Y—, —Y—C(O)—Y—, —Y—[$NR^cC(O)$]—Y—, —Y—[C(O)$NR^c$]—, —Y—$NR^c$—, —Y—[$SiR^c_2$]—Y—, a divalent $C_{1-20}$ alkyl group, a divalent $C_{1-20}$ alkenyl group, a divalent $C_{1-20}$ haloalkyl group, and a covalent bond;

$Ar^1$, at each occurrence, is independently a monovalent or divalent $C_{6-14}$ aryl group or a 5-14 membered heteroaryl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$Cy^1$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group; and $R^a$, at each occurrence, is independently selected from a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, -L'-$R^b$, -L'-$Ar^2$, -L'-$Ar^2$—$Ar^2$, -L'-$Ar^2$—$R^b$, -L'-$Ar^2$—$Ar^2$—$R^b$, -L'-$Cy^2$, -L-$Cy^2$-$Cy^2$, -L'-$Cy^2$-$R^b$, -L'-$Cy^2$-$Cy^2$—$R^b$;

wherein:

L', at each occurrence, is independently selected from —Y—O—Y—, —Y—[S(O)$_w$]—Y—, —Y—C(O)—Y—, —Y—[$NR^cC(O)$]—Y—, —Y—[C(O)$NR^c$]—, —Y—$NR^c$—, —Y—[$SiR^c_2$]—Y—, a divalent $C_{1-20}$ alkyl group, a divalent $C_{1-20}$ alkenyl group, a divalent $C_{1-20}$ haloalkyl group, and a covalent bond;

$Ar^2$, at each occurrence, is independently a monovalent or divalent $C_{6-14}$ aryl group or a 5-14 membered heteroaryl group, each optionally substituted with 1-5 substituents independently selected from halogen, —CN, oxo, =C(CN)$_2$, a $C_{1-6}$ alkyl group, a $C_{1-6}$ alkoxy group, and a $C_{1-6}$ haloalkyl group;

$Cy^2$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$R^b$, at each occurrence, is independently selected from a $C_{1-40}$ alkyl group, a $C_{2-40}$ alkenyl group, a $C_{2-40}$ alkynyl group, a $C_{1-40}$ haloalkyl group, and a $C_{1-40}$ alkoxy group;

$R^c$, at each occurrence, is independently selected from H, a $C_{1-6}$ alkyl group, and a —Y—$C_{6-14}$ aryl group;

Y, at each occurrence, is independently selected from a divalent $C_{1-6}$ alkyl group, a divalent $C_{1-6}$ haloalkyl group, and a covalent bond; and w is 0, 1, or 2.

In various embodiments, $M_1$ can be selected from:

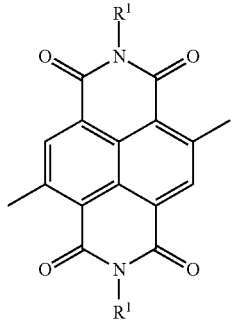 and 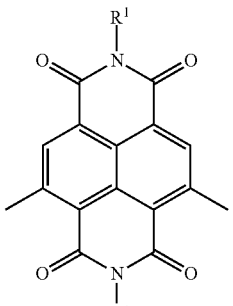, wherein the napthalene core can be optionally substituted with 1-2 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group; and $R^1$ is as defined herein.

In some embodiments, substitution of alkyl chains (and similar groups such as haloalkyl groups, arylalkyl groups, heteroarylalkyl groups and so forth) on one or both imide nitrogen atoms can improve solubility of the polymer in an organic solvent. Accordingly, in certain embodiments, $R^1$ can be a linear or branched $C_{3-40}$ alkyl group, examples of which include an n-hexyl group, a 1-methylpropyl group, a 1-methylbutyl group, a 1-methylpentyl group, a 1-methylhexyl group, a 1-ethylpropyl group, a 1-ethylbutyl group, a 1-3,dimethylbutyl group, and a 2-octyldodecyl group. In certain embodiments, $R^1$ can be a linear or branched $C_{3-40}$ alkenyl group. In particular embodiments, $R^1$ can be a branched $C_{3-20}$ alkyl group or a branched $C_{3-20}$ alkenyl group. For example, $R^1$, at each occurrence, independently can be selected from the following:

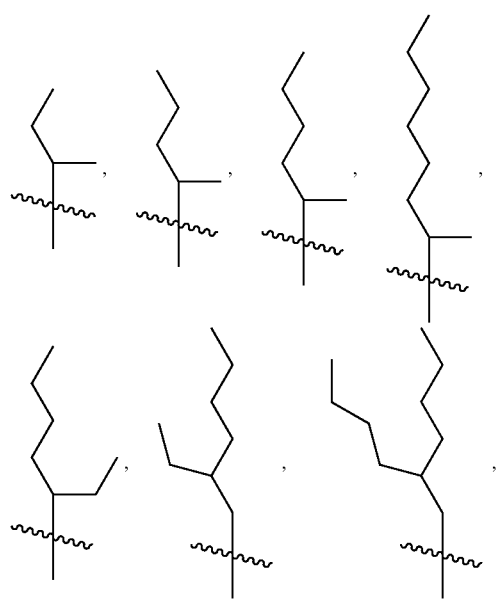

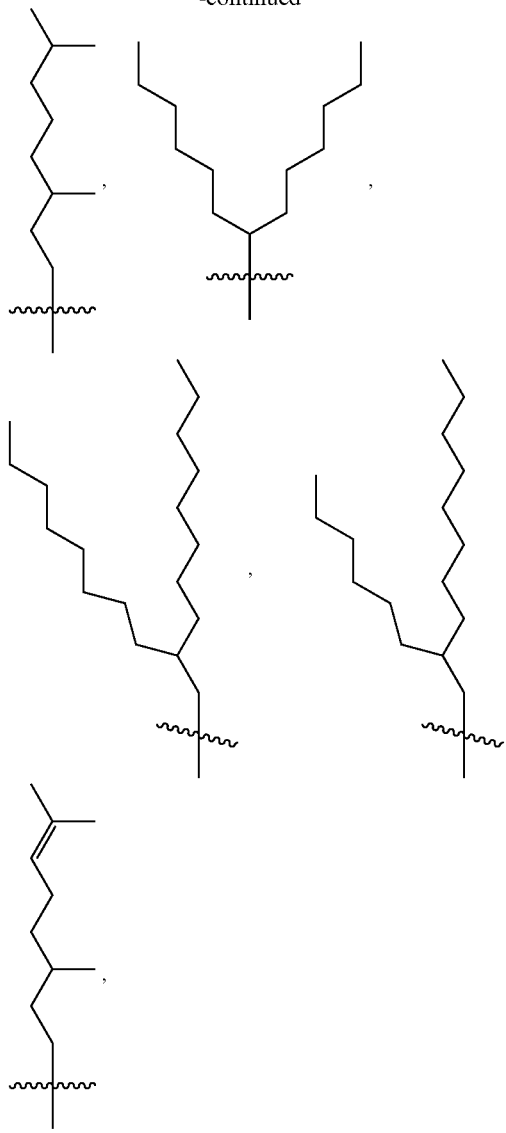

In certain embodiments, $R^1$, at each occurrence, can be a linear or branched $C_{6-40}$ alkyl or alkenyl group, an arylalkyl group optionally substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) optionally substituted with a linear or branched $C_{6-40}$ alkyl or alkenyl group, wherein each of these groups optionally can be substituted with 1-5 halo groups (e.g., F). In some embodiments, $R^1$ can be a biaryl group wherein the two aryl groups are covalently linked via a linker (L'). For example, the linker can be a divalent $C_{1-6}$ alkyl group or a carbonyl group. In particular embodiments, $R^1$, at each occurrence, independently can be selected from:

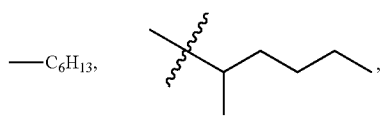

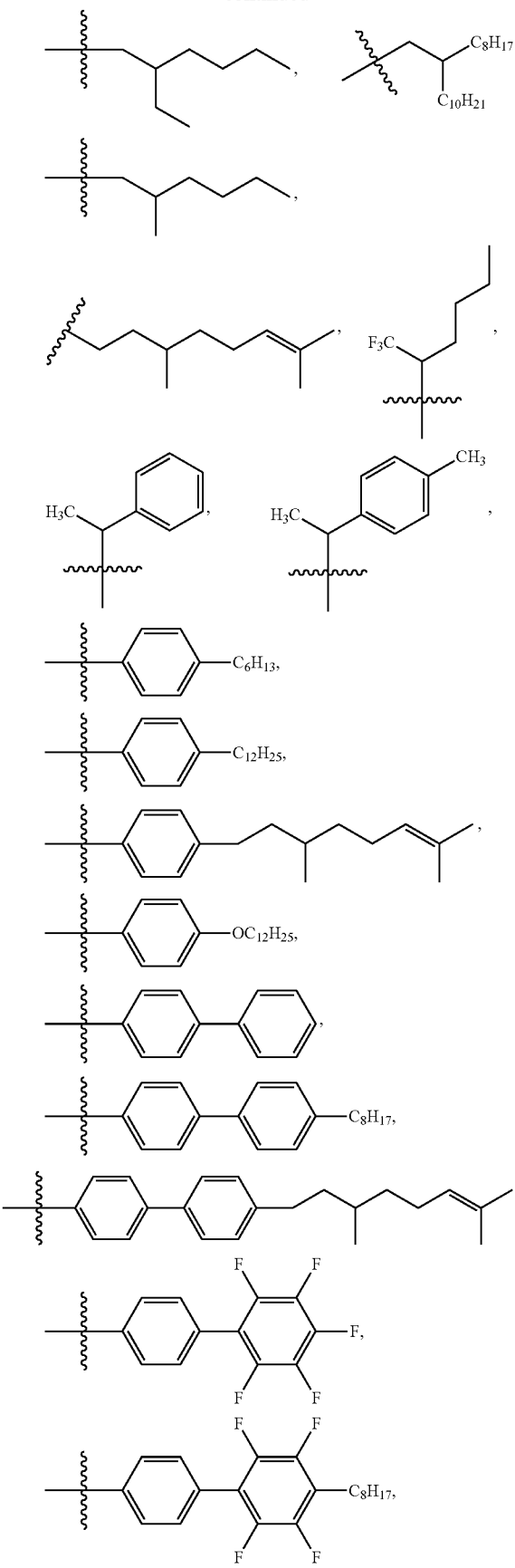
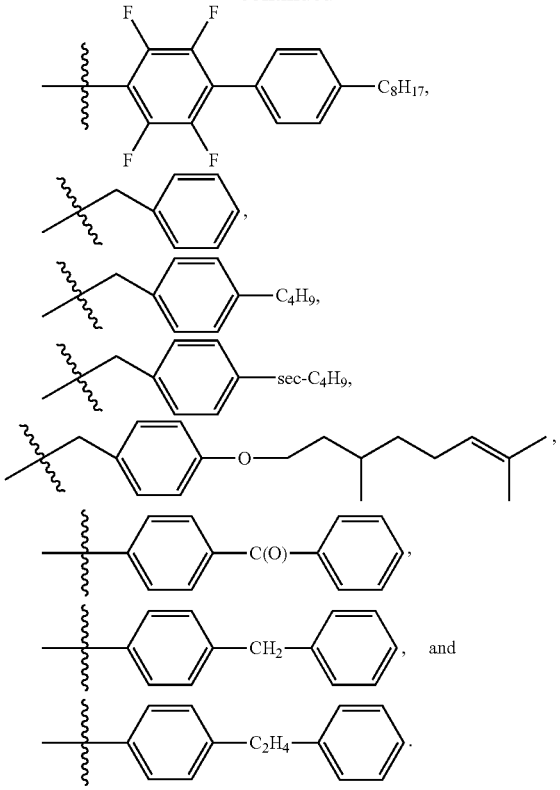
In some embodiments, $R^1$ can be an optionally substituted $C_{6-14}$ cycloalkyl group. For example, $R^1$, at each occurrence, independently can be selected from:
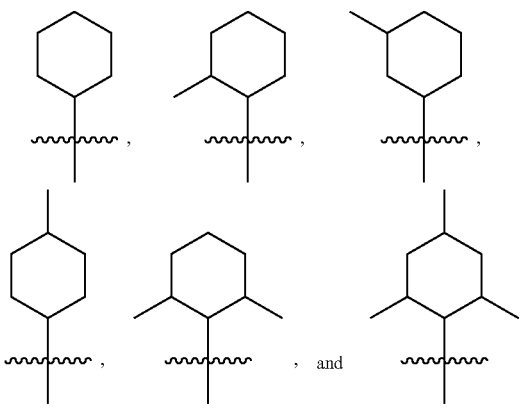
In various embodiments, the polymers of the present teachings can include a comonomer $M_2$ having a formula selected from:
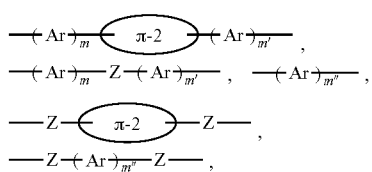

-continued

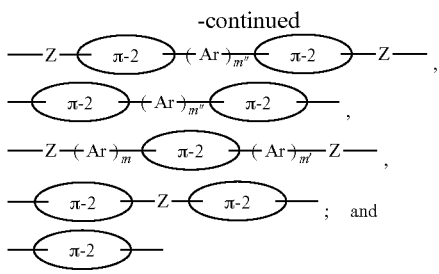

wherein:

π-2 is an optionally substituted polycyclic moiety;
Ar, at each occurrence, is independently an optionally substituted monocyclic aryl or heteroaryl group;
Z is a conjugated linear linker; and
m, m' and m" independently are 0, 1, 2, 3, 4, 5 or 6.

In some embodiments, π-2 can be a polycyclic $C_{8-24}$ aryl group or a polycyclic 8-24 membered heteroaryl group, wherein each of these groups can be optionally substituted with 1-6 $R^e$ groups, wherein:

$R^e$, at each occurrence, is independently a) halogen, b) —CN, c) —NO$_2$, d) oxo, e) —OH, f) =C($R^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —NO$_2$, d) oxo, e) —OH, f) —NH$_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_w$H, l) —S(O)$_w$—$C_{1-20}$ alkyl, m) —S(O)$_2$OH, n) —S(O)$_w$—OC$_{1-20}$ alkyl, o) —S(O)$_w$—OC$_{6-14}$ aryl, p) —CHO, q) —C(O)—$C_{1-20}$ alkyl, r) —C(O)—$C_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —S(O)$_w$NH$_2$, ai) —S(O)$_w$NH($C_{1-20}$ alkyl), aj) —S(O)$_w$N($C_{1-20}$ alkyl)$_2$, ak) —S(O)$_w$NH($C_{6-14}$ aryl), al) —S(O)$_w$N($C_{1-20}$ alkyl)-$C_{6-14}$ aryl, am) —S(O)$_w$N($C_{6-14}$ aryl)$_2$, an) —SiH$_3$, ao) —SiH($C_{1-20}$ alkyl)$_2$, ap) —SiH$_2$($C_{1-20}$ alkyl), aq) —Si($C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group; and w is 0, 1, or 2.

For example, π-2 can have a planar and highly conjugated cyclic core which can be optionally substituted as disclosed herein. In various embodiments, π-2 can have a reduction potential (versus an SCE electrode and measured in, for instance, a THF solution) greater than (i.e., more positive than) about −3.0 V. In certain embodiments, π-2 can have a reduction potential greater than or equal to about −2.2 V. In particular embodiments, π-2 can have a reduction potential greater than or equal to about −1.2 V. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, π-2 can include at least one electron-withdrawing group.

In certain embodiments, π-2 can include two or more (e.g., 2-4) fused rings, such as thienothiophene or 3 to 7 fused thiophenes, where each ring can be a five-, six-, or seven-membered ring optionally substituted with 1-6 $R^e$ groups, wherein $R^e$ is as defined herein. For example, in the various embodiments described herein, $R^e$ can be an electron-withdrawing group such as a halogen, —CN, oxo, =C($R^f$)$_2$, a $C_{1-20}$ alkoxy group, a $C_{1-20}$ alkylthio group, or a $C_{1-20}$ haloalkyl group. In certain embodiments, $R^e$ can be a halogen (e.g., F, Cl, Br, or I), —CN, a $C_{1-6}$ alkoxy group, —OCF$_3$, or —CF$_3$. In particular embodiments, $R^e$ can be =O, —CN, =C(CN)$_2$, F, Cl, Br, or I.

In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In some embodiments, π-2 can be selected from:

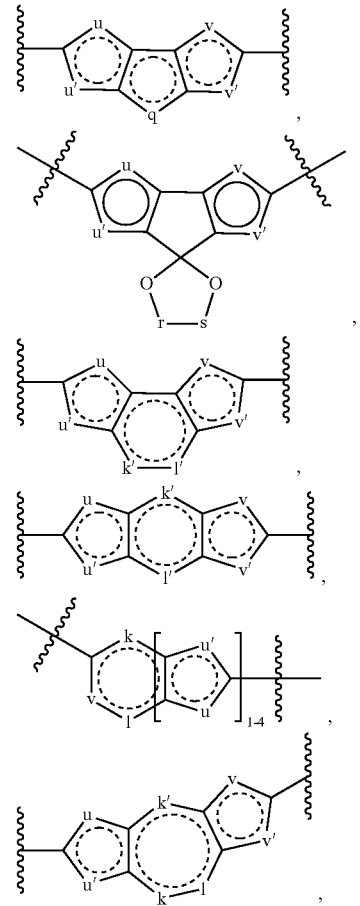

-continued

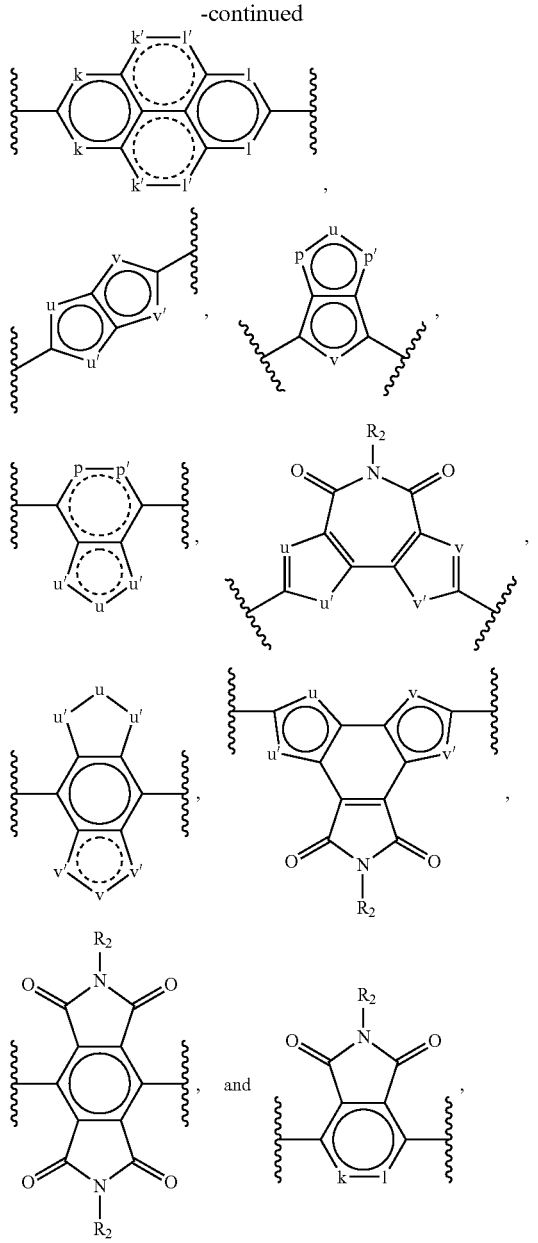

wherein:

k, k', l and l' independently can be selected from —$CR^2$=, =$CR^2$—, —C(O)—, and —C(C(CN)$_2$)—;

p, p', q and q' independently can be selected from —$CR^2$=, =$CR^2$—, —C(O)—, —C(C(CN)$_2$)—, —O—, —S—, —N=, =N—, —N($R^2$)—, —$SiR^2$=, =$SiR^2$—, and —$SiR^2R^2$—;

r and s independently can be —$CR^2R^2$— or —C(C(CN)$_2$)—;

u, u', v and v' independently can be selected from —$CR^2$=, =$CR^2$—, —C(O)—, —C(C(CN)$_2$)—, —S—, —S(O)—, —S(O)$_2$—, —O—, —N=, =N—, —$SiR^2$=, =$SiR^2$—, —$SiR^2R^2$—, —$CR^2R^2$—$CR^2R^2$—, and —$CR^2$=$CR^2$—; and $R^2$, at each occurrence, independently can be H or $R^e$, wherein $R^e$ is as defined herein.

In certain embodiments, π-2 can be selected from:

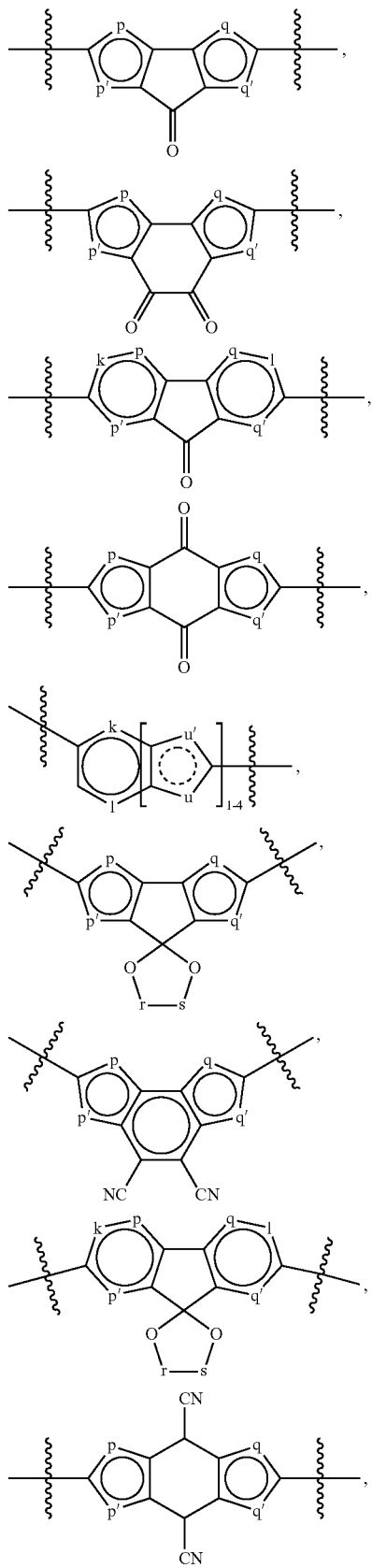

31
-continued
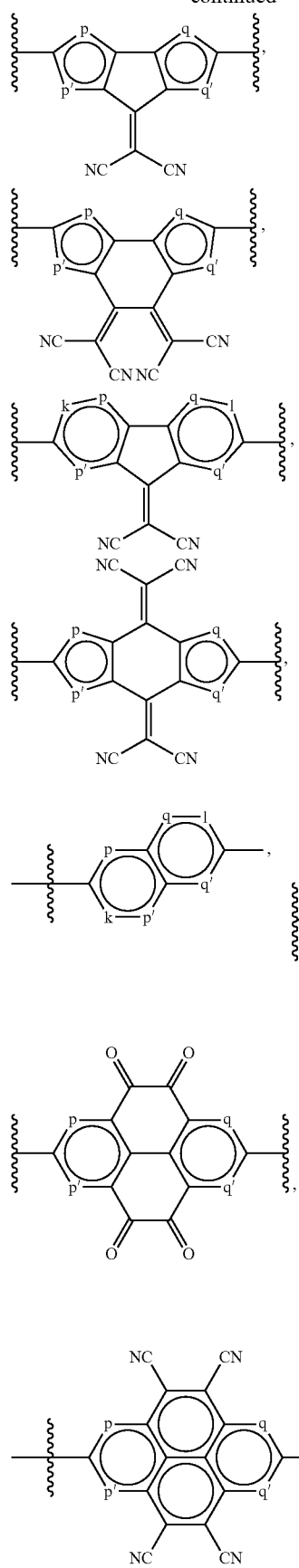
32
-continued
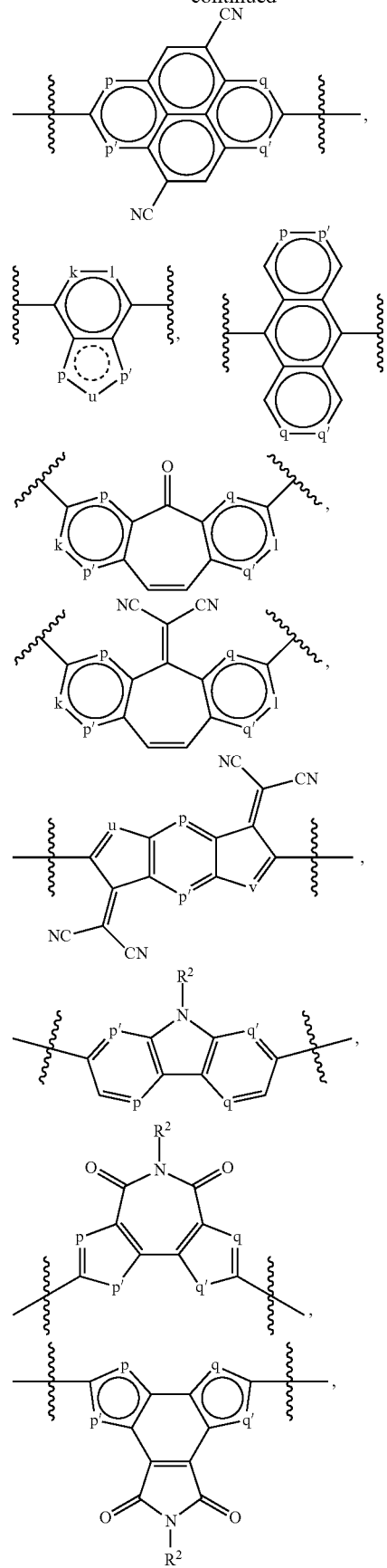

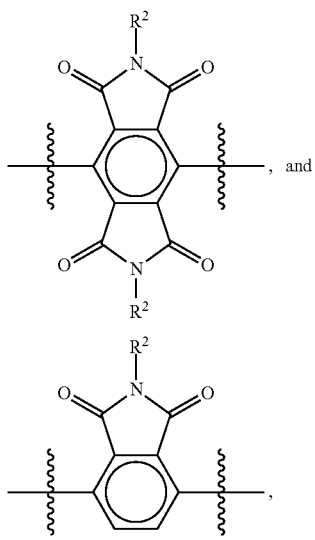

where k, l, p, p', q, q', r, s and $R^2$ are as defined herein. In some embodiments, k and l independently can be selected from —$CR^2$=, =$CR^2$—, and —C(O)—; p, p', q, and q' independently can be selected from —O—, —S—, —N($R^2$)—, —N=, =N—, —$CR^2$=, and =$CR^2$—; u and v independently can be selected from —$CR^2$=, =$CR^2$—, —C(O)—, —C(C(CN)$_2$)—, —S—, —O—, —N=, =N—, —$CR^2R^2$—$CR^2R^2$—, and —$CR^2$=$CR^2$—; where $R^2$ is as defined herein. For example, $R^2$, at each occurrence, independently can be selected from H, a halogen, —CN, —$OR^c$, —$N(R^c)_2$, a $C_{1-20}$ alkyl group, and a $C_{1-20}$ haloalkyl group, where $R^c$ is as defined herein. Each of r and s can be $CH_2$.

In certain embodiments, π-2 can be a polycyclic moiety including one or more thienyl, thiazolyl, or phenyl groups, where each of these groups can be optionally substituted as disclosed herein. For example, π-2 can be selected from:

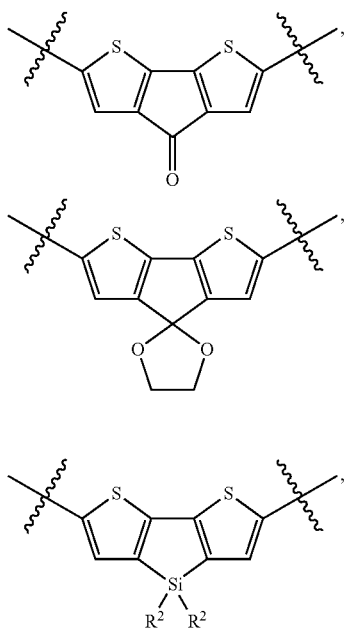

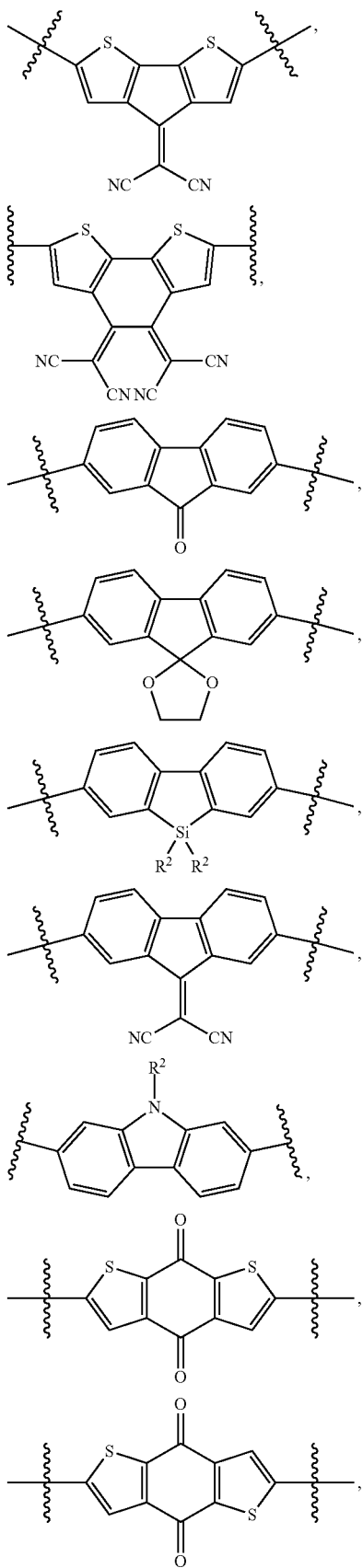

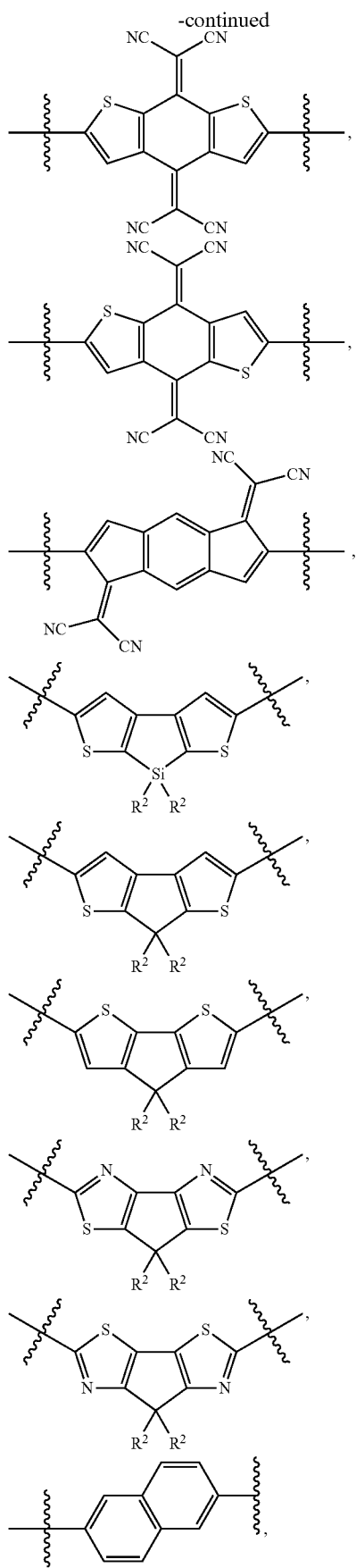
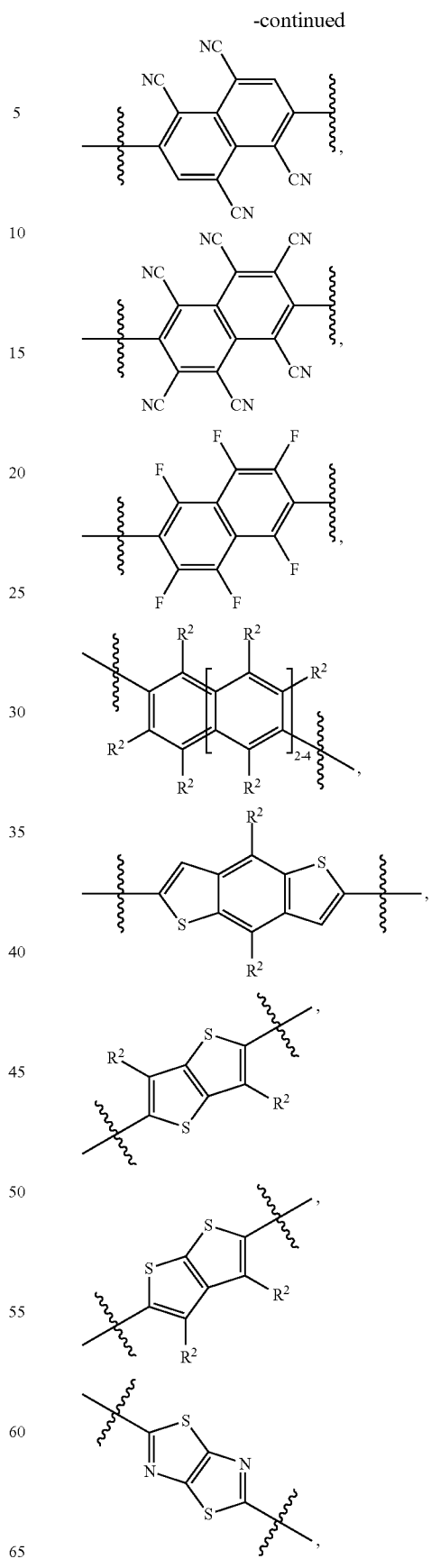

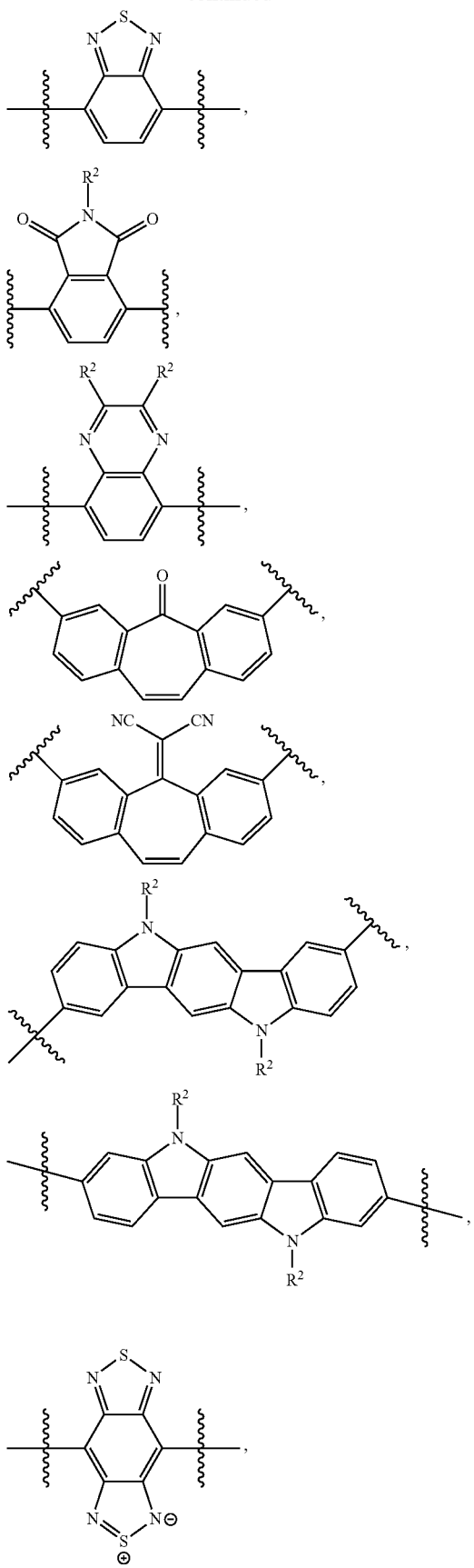
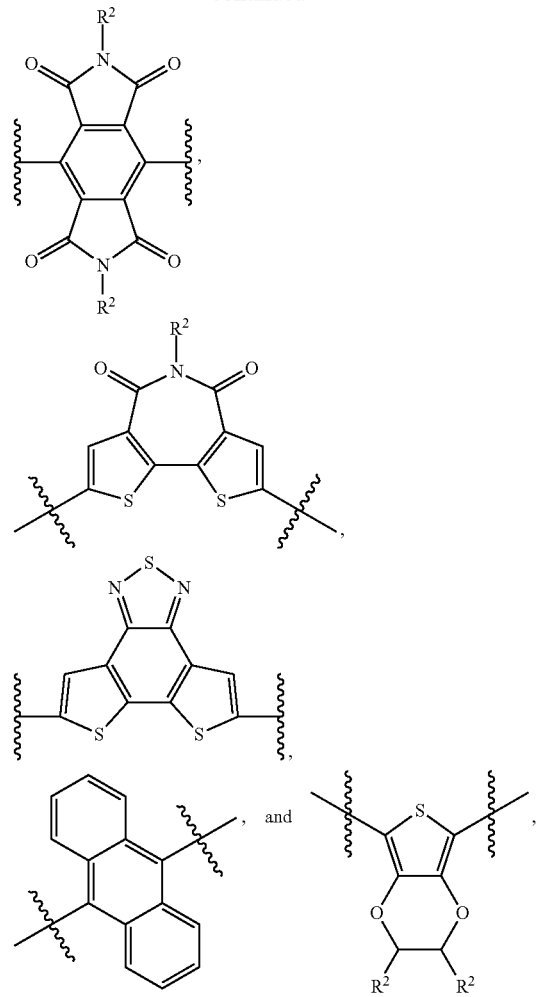
wherein R² is as defined herein. For example, R² can be selected from H, a C₁₋₂₀ alkyl group, a C₁₋₂₀ alkoxy group, and a C₁₋₂₀ haloalkyl group.
In some embodiments, Ar, at each occurrence, independently can be an optionally substituted monocyclic moiety selected from:
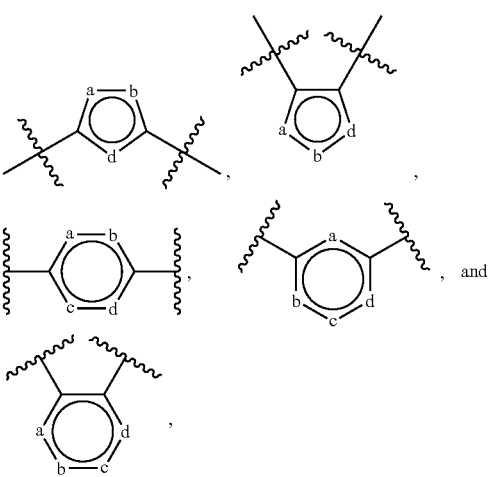

wherein:

a, b, c and d independently are selected from —S—, —O—, —CH=, =CH—, —CR$^3$=, =CR$^3$—, —C(O)—, —C(C(CN)$_2$)—, —N=, =N—, —NH— and —NR$^3$—;

R$^3$, at each occurrence, is independently selected from a) halogen, b) —CN, c) —NO$_2$, d) —N(R$^c$)$_2$, e) —OR$^c$, f) —C(O)R$^c$, g) —C(O)OR$^c$, h) —C(O)N(R$^c$)$_2$, i) a C$_{1-40}$ alkyl group, j) a C$_{2-40}$ alkenyl group, k) a C$_{2-40}$ alkynyl group, l) a C$_{1-40}$ alkoxy group, m) a C$_{1-40}$ alkylthio group, n) a C$_{1-40}$ haloalkyl group, o) a —Y—C$_{3-14}$ cycloalkyl group, p) a —Y—C$_{6-14}$ aryl group, q) a —Y-3-14 membered cycloheteroalkyl group, and r) a —Y-5-14 membered heteroaryl group, wherein each of the C$_{1-40}$ alkyl group, the C$_{2-40}$ alkenyl group, the C$_{2-40}$ alkynyl group, the C$_{3-14}$ cycloalkyl group, the C$_{6-14}$ aryl group, the 3-14 membered cycloheteroalkyl group, and the 5-14 membered heteroaryl group optionally is substituted with 1-5 R$^e$ groups; and Y, R$^c$ and R$^e$ are as defined herein.

Depending on whether it is located within the polymeric backbone or it constitutes one of the end groups of the polymer, Ar can be divalent or monovalent. In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a C$_{1-6}$ alkyl group, a C$_{1-6}$ alkoxy group, a C$_{1-6}$ haloalkyl group, NH$_2$, NH(C$_{1-6}$ alkyl) and N(C$_{1-6}$ alkyl)$_2$. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a C$_{1-6}$ alkyl group, a C$_{1-6}$ alkoxy group, a C$_{1-6}$ haloalkyl group, NH$_2$, NH(C$_{1-6}$ alkyl) and N(C$_{1-6}$ alkyl)$_2$. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 C$_{1-6}$ alkyl groups.

By way of example, (Ar)$_m$, (Ar)$_{m'}$, and (Ar)$_{m''}$ can be selected from:

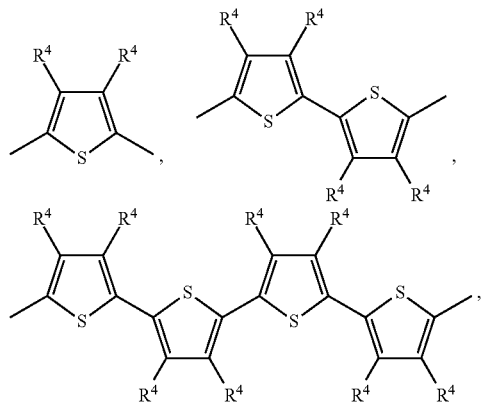

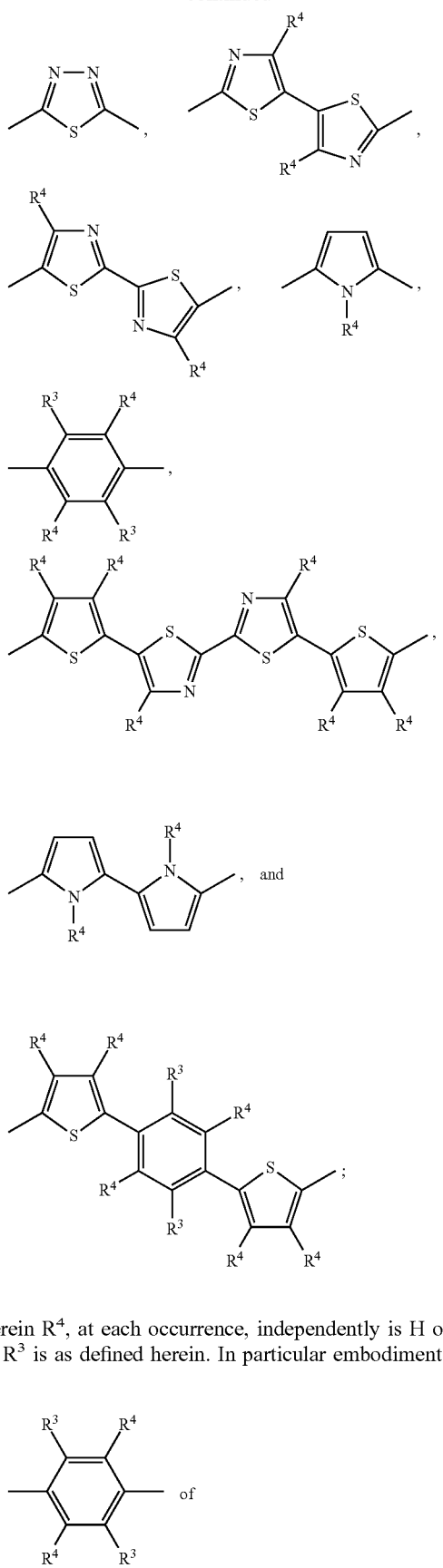

wherein R$^4$, at each occurrence, independently is H or R$^3$, and R$^3$ is as defined herein. In particular embodiments, -continued

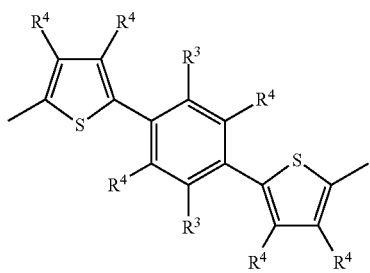

can be selected from:

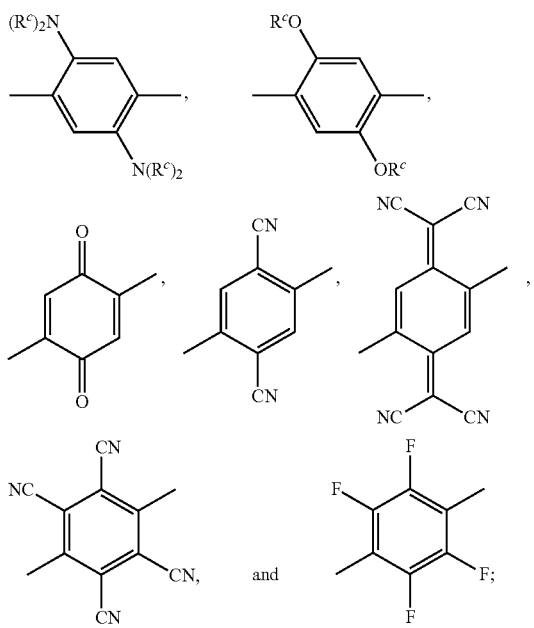

wherein $R^c$ is as defined herein.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

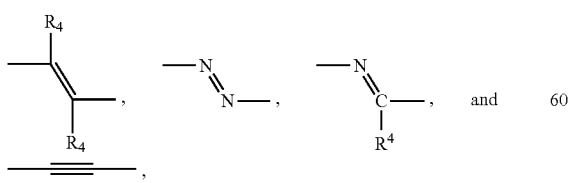

wherein $R^4$ is as defined herein. In certain embodiments, Z can be selected from:

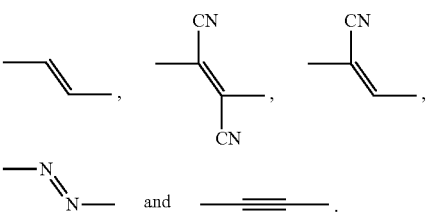

In some embodiments, $M_2$ can include at least one optionally substituted monocyclic aryl or heteroaryl group. For example, $M_2$ can have the formula:

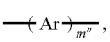

wherein m" is selected from 1, 2, 4, or 6; and Ar is as defined herein. For example, $M_2$ can be selected from:

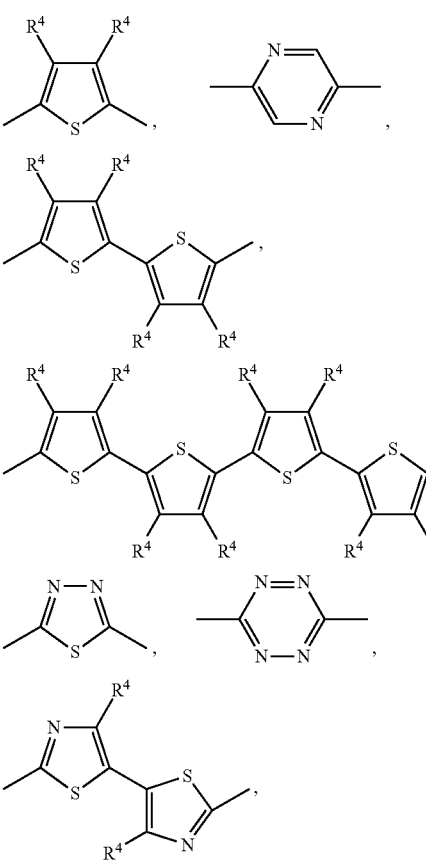

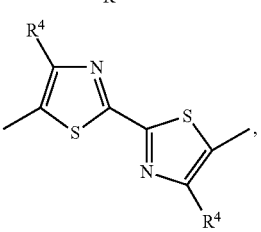

-continued

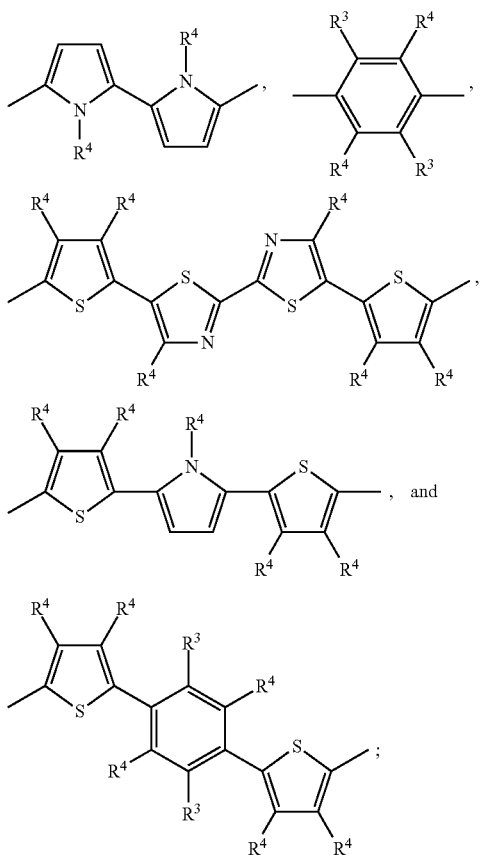

wherein R³ and R⁴ are as defined herein. In particular embodiments, M₂ can be selected from:

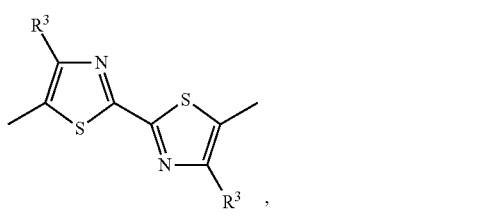

-continued

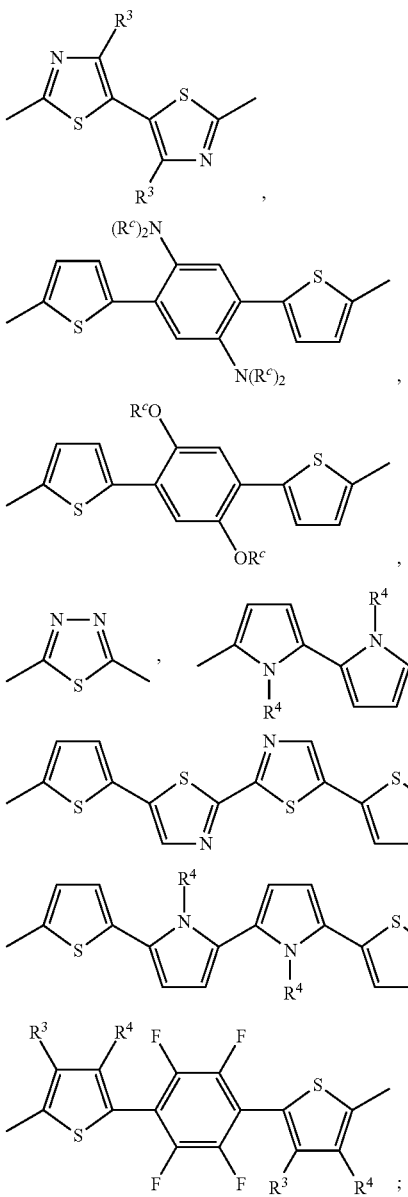

wherein R³ can be independently selected from a halogen, —CN, a $C_{1-20}$ alkyl group, a $C_{1-20}$ alkoxy group, and a $C_{1-20}$ haloalkyl group; R⁴ can be independently selected from H, a halogen, —CN, a $C_{1-20}$ alkyl group, a $C_{1-20}$ alkoxy group, and a $C_{1-20}$ haloalkyl group; and R$^c$, at each occurrence, can be independently H or a $C_{1-6}$ alkyl group.

In some embodiments, M₂, in addition to the one or more optionally substituted monocyclic aryl or heteroaryl group, can include a linker. For example, M₂ can have the formula:

$$-(\text{Ar})_m-Z-(\text{Ar})_{m'}- \quad \text{or} \quad -Z-(\text{Ar})_{m''}-Z-,$$

wherein m and m' are selected from 1, 2, 4, or 6; m" is selected from 1, 2, 3, or 4; and Ar and Z are as defined herein. In certain embodiments, M₂ can be selected from:

In certain embodiments, $M_2$ can be selected from:

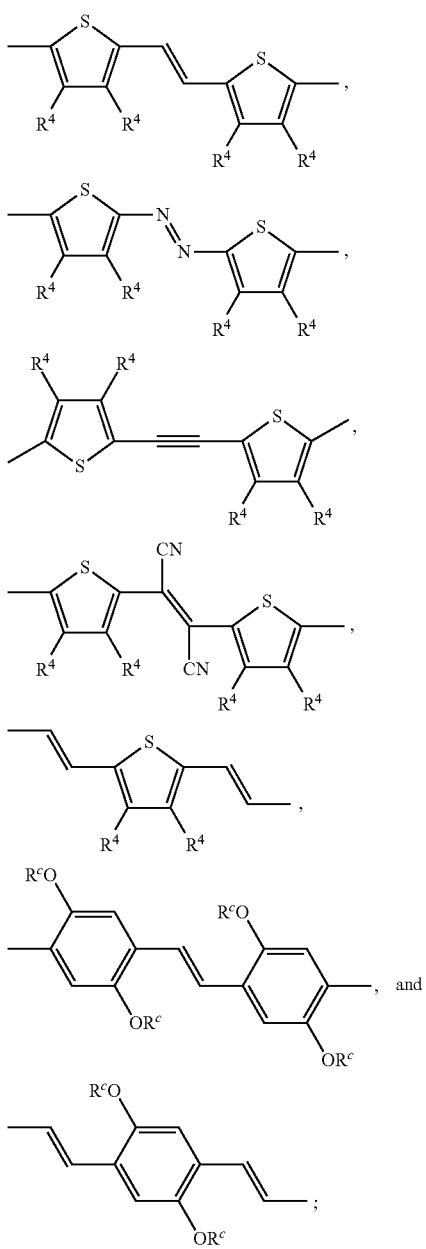

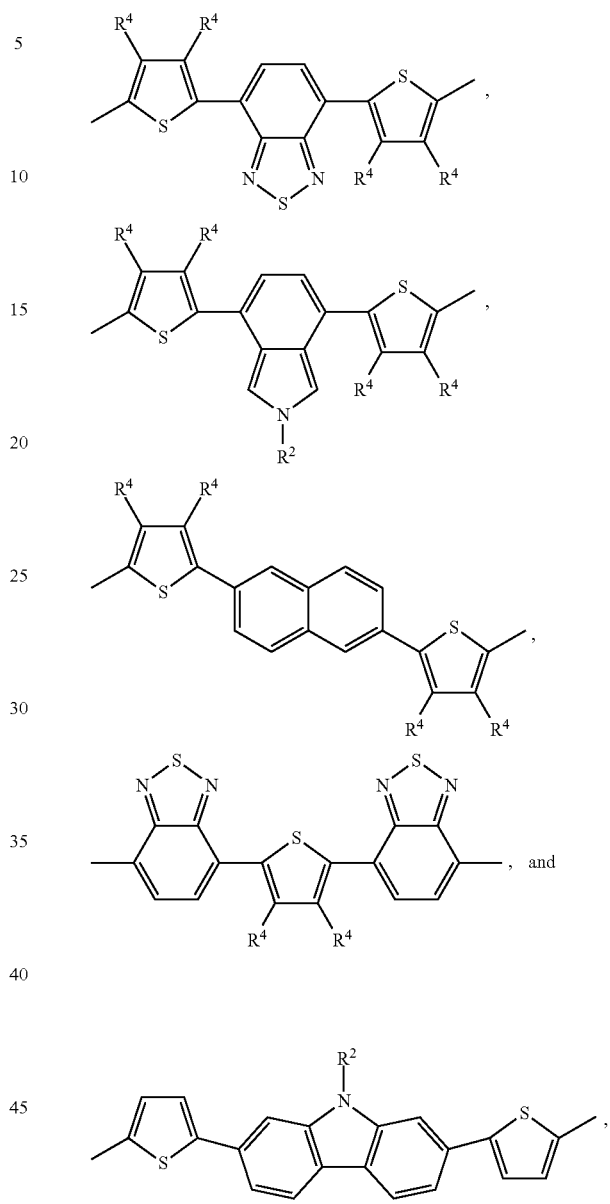

wherein $R^4$ and $R^c$ are as defined herein.

In some embodiments, $M_2$, in addition to the one or more optionally substituted monocyclic aryl or heteroaryl group, can include one or more optionally substituted polycyclic moieties. For example, $M_2$ can have the formula:

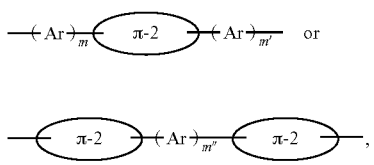

wherein m and m' are selected from 1, 2, 4, or 6; and Ar and π-2 are as defined herein.

wherein $R^2$ and $R^4$ are as defined herein.

In some embodiments, $M_2$, in addition to the one or more optionally substituted monocyclic aryl or heteroaryl group, can include one or more linkers and/or optionally substituted polycyclic moieties. For example, $M_2$ can have a formula selected from:

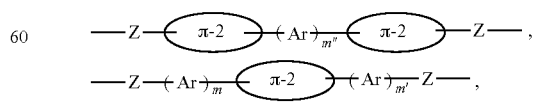

wherein m, m' and m" independently are 1, 2, 3 or 4; and Ar, π-2 and Z are as defined herein. In certain embodiments, $M_2$ can be selected from

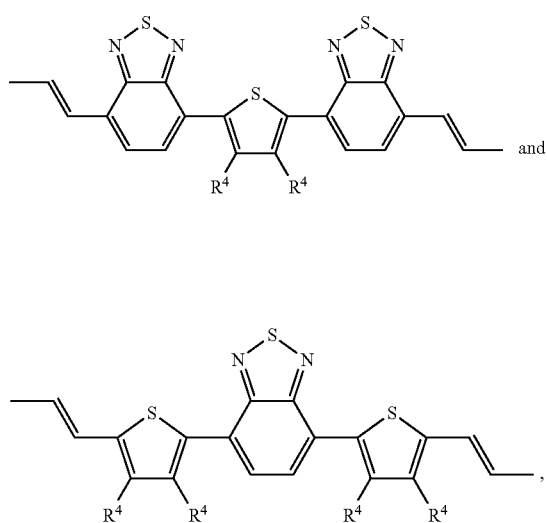

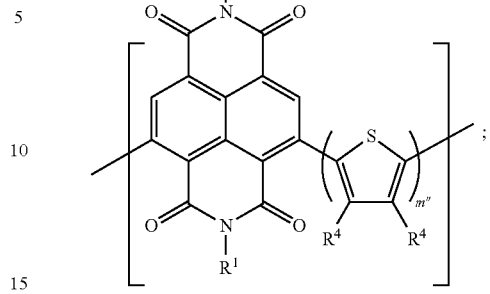

wherein $R^1$, $R^4$, and m" are as defined herein.

For example, in certain embodiments, polymers of the present teachings can include repeating units of one or more of Formulae Ia', Ib', Ia", and Ib":

wherein $R^4$ is as defined herein.

In other embodiments, $M_2$ can have a formula selected from:

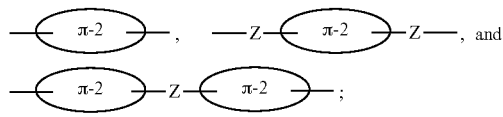

wherein π-2 and Z are as defined herein.

While the present teachings generally relate to copolymers of $M_1$ and $M_2$, homopolymers of $M_1$ are within the scope of the present teachings.

For the various polymers described above, n can be an integer in the range of 2 to 5,000. For example, n can be 2-1,000, 2-500, 2-400, 2-300, or 2-200. In certain embodiments, n can be 2-100. In some embodiments, n can be an integer between 3 and 1,000. In certain embodiments, n can be 4-1,000, 5-1,000, 6-1,000, 7-1,000, 8-1,000, 9-1,000, or 10-1,000. For example, n can be 8-500, 8-400, 8-300, or 8-200. In certain embodiments, n can be 8-100.

Accordingly, in certain embodiments, the polymers of the present teachings can include repeating units of Formula Ia, Ib, or both:

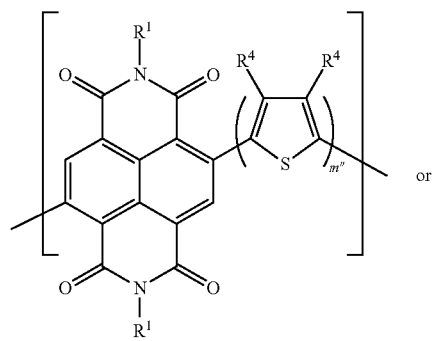

or

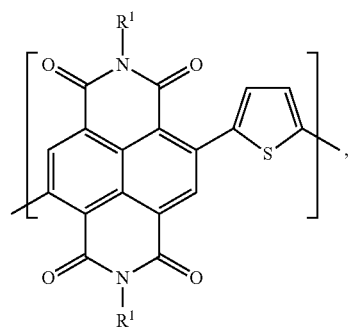

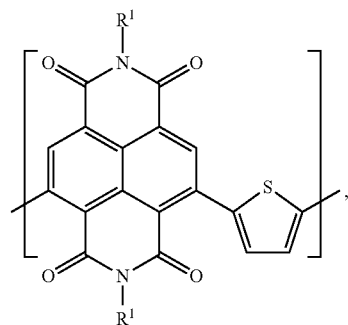

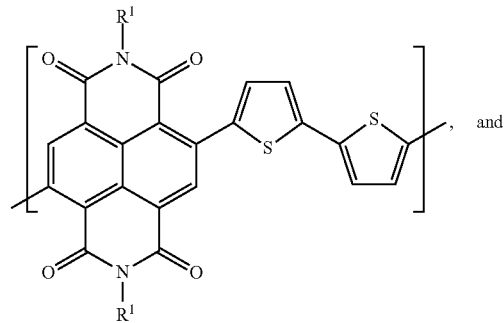

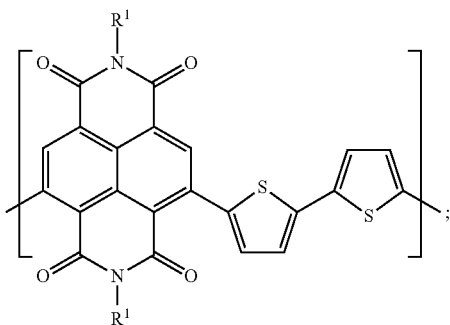
Ib'' wherein R¹ is as defined herein.

Certain embodiments of the polymers of the present teachings can include repeating units of one or more of Formula Ia''', Ib''', Ia'''', and Ib'''':

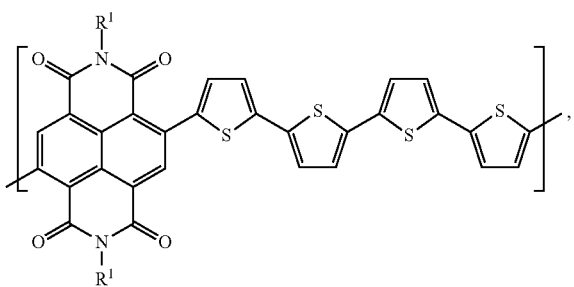
Ia'''

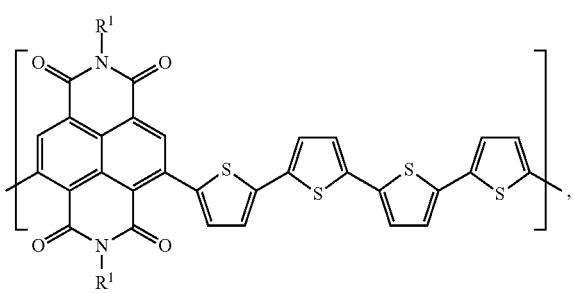
Ib'''

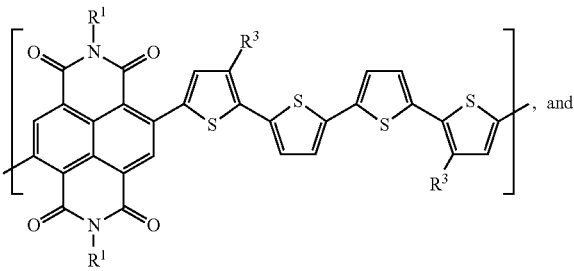
Ia'''', and

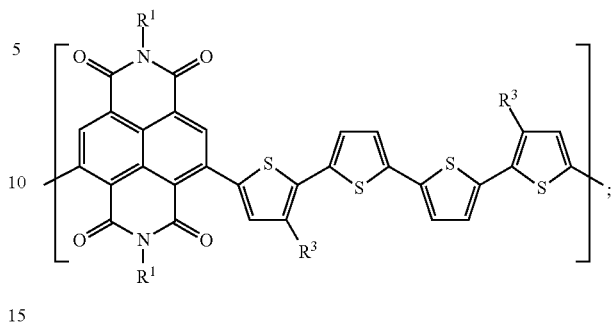
Ib'''' wherein R¹ and R³ are as defined herein. For example, R³, at each occurrence, can be independently selected from a halogen, —CN, a $C_{1-40}$ alkyl group, a $C_{1-40}$ alkoxy group, and a $C_{1-40}$ haloalkyl group.

In some embodiments, the polymers of the present teachings can include one or more repeating units of Formulae Ic, Id, Ie, and If:

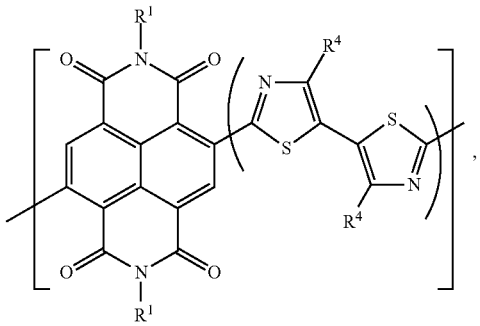
Ic

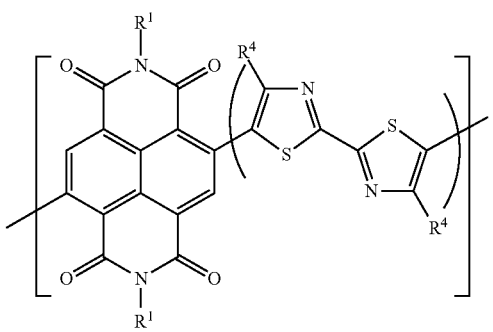
Id

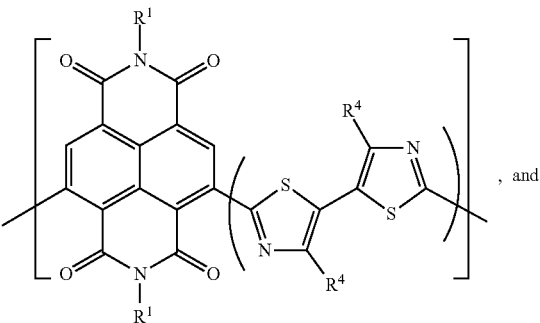
Ie, and

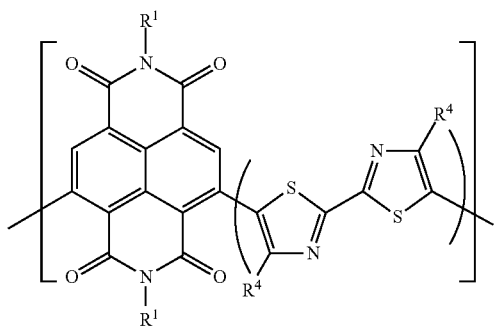

wherein $R^1$ and $R^4$ are as defined herein.

For example, in certain embodiments, polymers of the present teachings can include repeating units of one or more of Formula Ic', Id', Ie', and If':

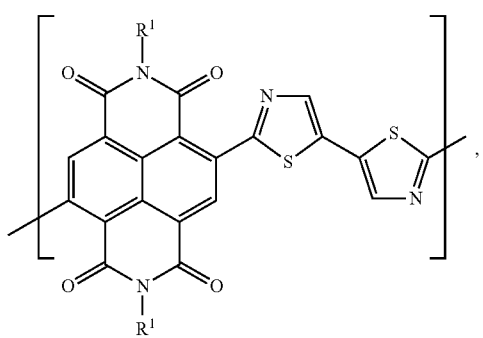

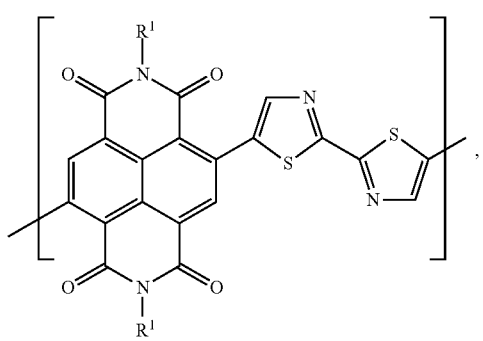

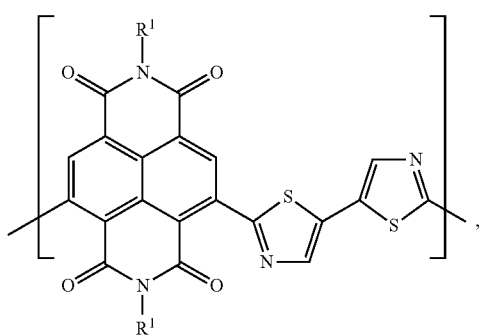

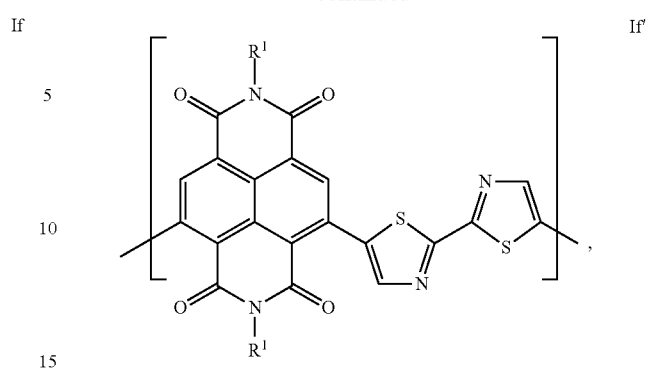

wherein $R^1$ is as defined herein.

In certain embodiments, the polymers of the present teachings can include a repeating unit of Formula Ig, Ih, or both:

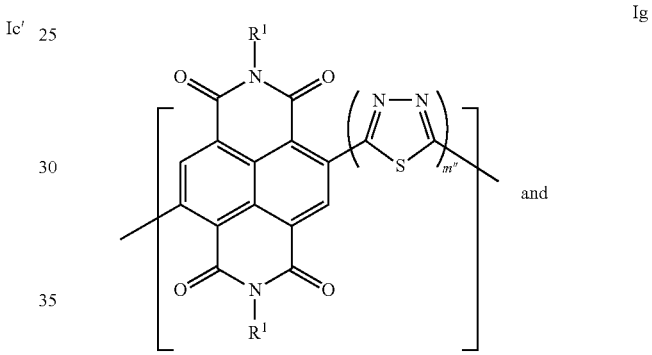

wherein $R^1$ and $m''$ are as defined herein.

In certain embodiments, the polymers of the present teachings can include a repeating unit of Formula Ii', Ij', or both:

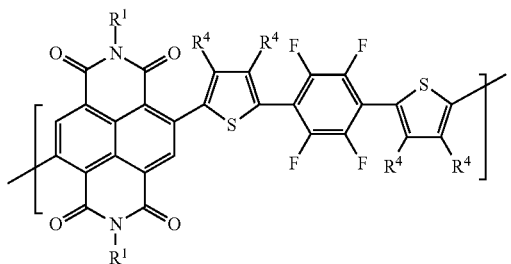
Ii'
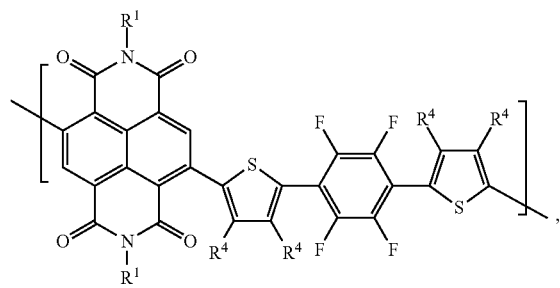
Ij'
wherein R¹ is as defined herein.
Further examples of polymers according to the present teachings can include repeating units of one or more of Formulae IIIa', IIIa", Va', Va", Vb', Vb", Vc', and Vc":
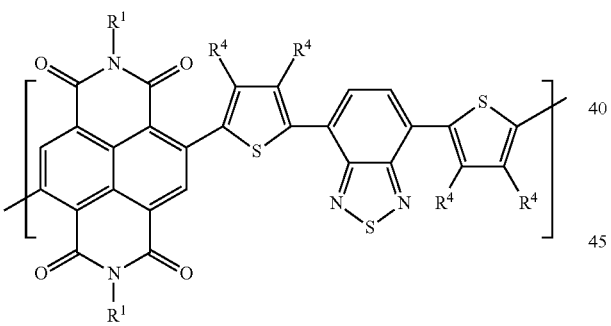
IIIa'
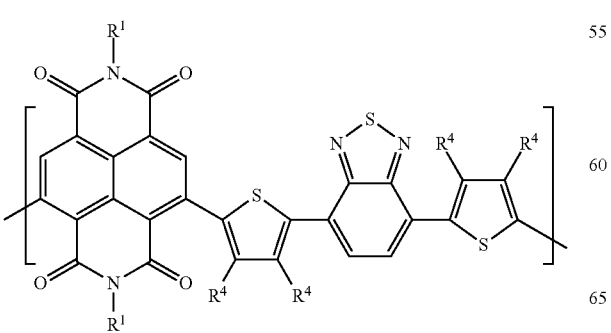
IIIa"
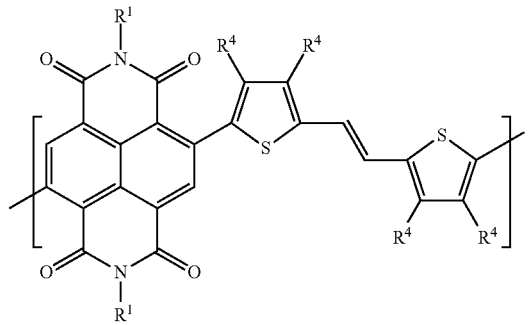
Va'
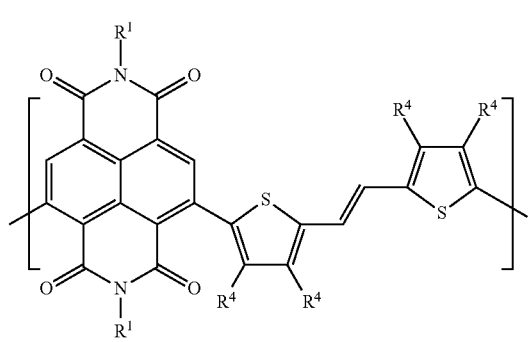
Va"
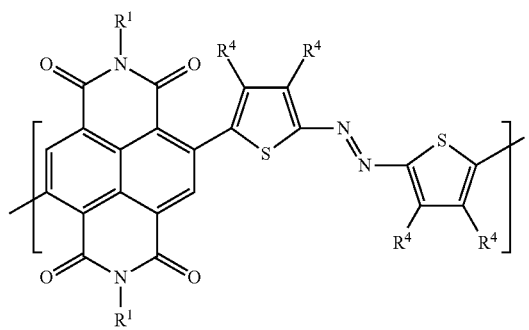
Vb'
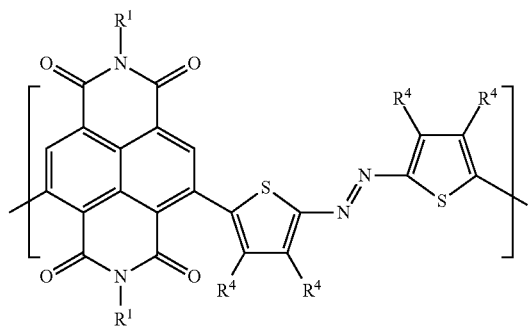
Vb"

-continued

Vc'

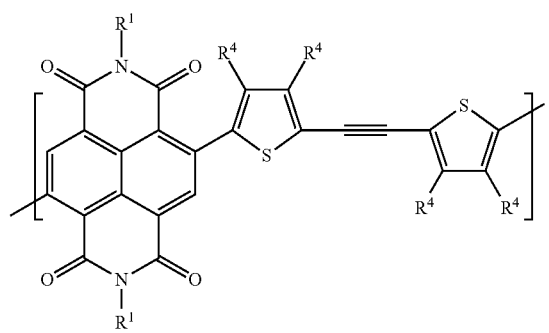

Vc''

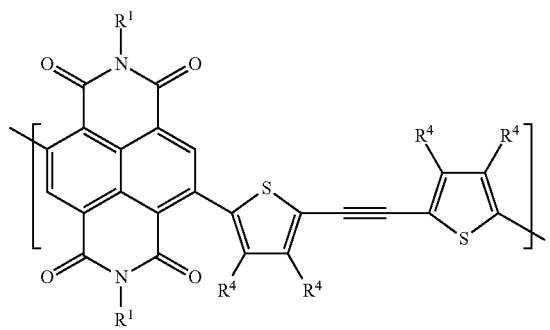

wherein R[1] and R[4] are as defined herein.

Certain embodiments of the present polymers can be prepared in accordance with the procedures outlined in Scheme 1 below:

Scheme 1

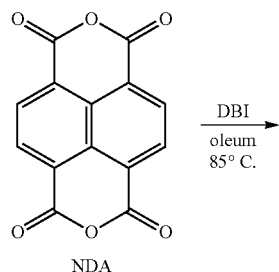

NDA

-continued

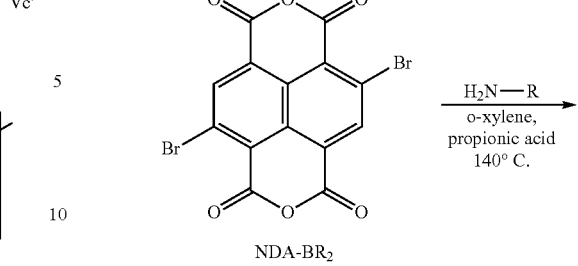

NDA-BR₂

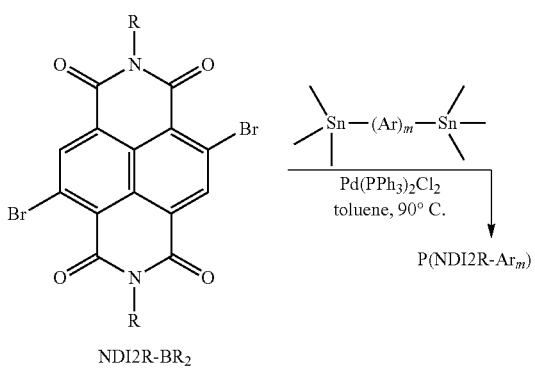

NDI2R-BR₂

Referring to Scheme 1, certain embodiments of the present polymers can be synthesized via a metal-catalyzed Stille polymerization. In particular, 1,4,5,8-naphthalenetetracarboxylic dianhydride (NDA) can be reacted with dibromoisocyanuric acid (DBI) to provide dibromonaphthalene-1,4,5,8-bis(dicarboximide) (NDI-Br₂). The imide functionalization can be effected by reacting the NDI-Br₂ with an appropriate amine (R—NH₂) to provide, for example, an N,N'-dialkylnaphthalene-1,4,5,8-bis(dicarboximide) (NDI2R—Br₂). Polymerization of NDI2R—Br₂ with the appropriate organotin compound in the presence of a metal catalyst such as dichloro-bis(triphenylphosphine)palladium (II) (Pd(PPh₃)₂Cl₂) leads to the desired polymer.

Scheme 2 below shows an alternative synthesis for preparing certain embodiments of the present polymers:

Scheme 2

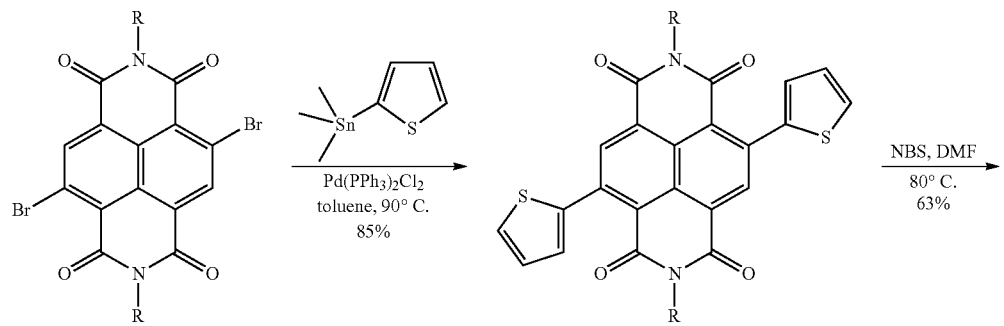

-continued

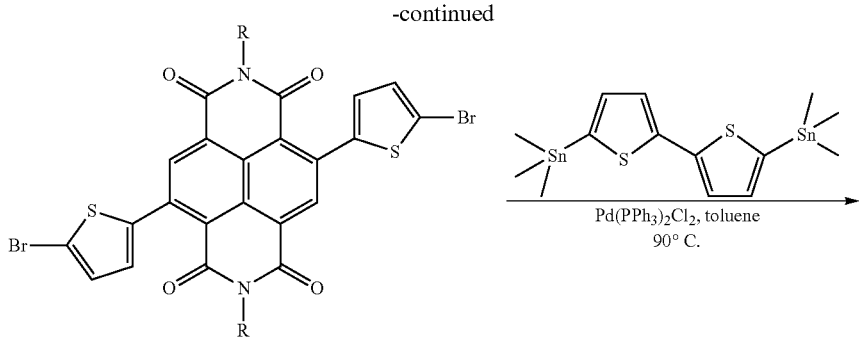

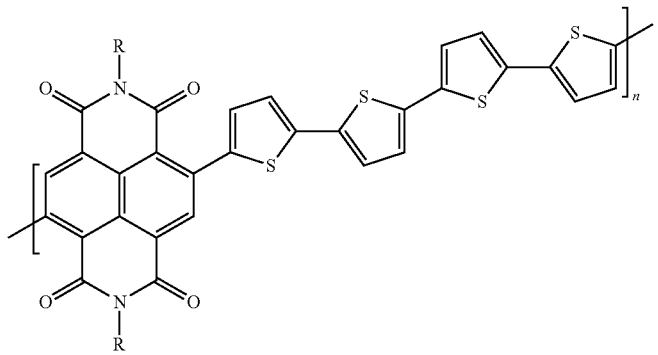

Other polymers of the present teachings can be prepared according to procedures analogous to those described in Schemes 1 and 2. Alternatively, the present polymers can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the polymers described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Without wishing to be bound by any particular theory, it is believed that polymers of the present teachings that have a regioregular polymeric backbone can lead to higher molecular weights, a more π-conjugated structure and, consequently better charge transport efficiencies. Accordingly, in preparing the present polymers, the present teachings can include isolating at least one particular average molecular weight fraction, and/or enriching and/or isolating NDIR-Br$_2$ (and the corresponding dibromonaphthalene dicarboximide) as enriched or pure 2,6-diastereoisomers. Because the isolation of 2,6-dibromonaphthalene-1,4,5,8-bis(dicarboximide) from the isomeric mixture can be carried out easily and efficiently, the present polymers include those having the Formulae I', III', V', VII', IX', XI', XIII' or XV':

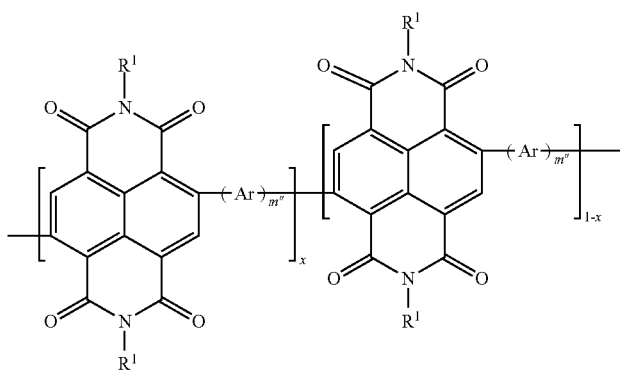
I'
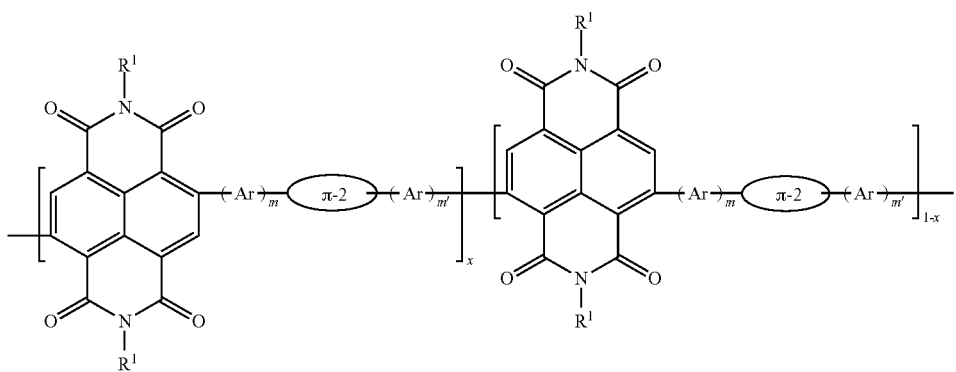
III'
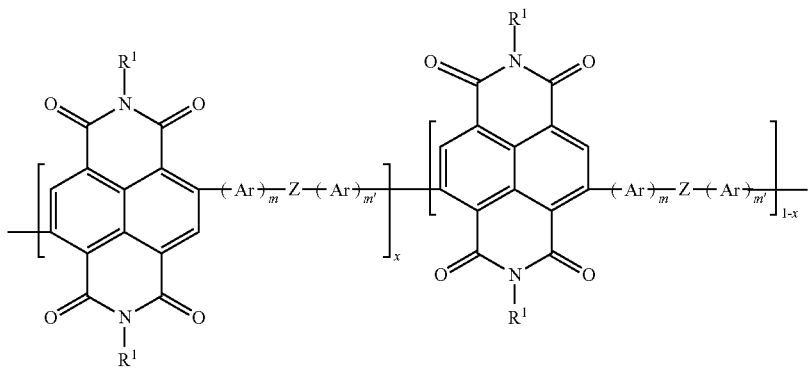
V'
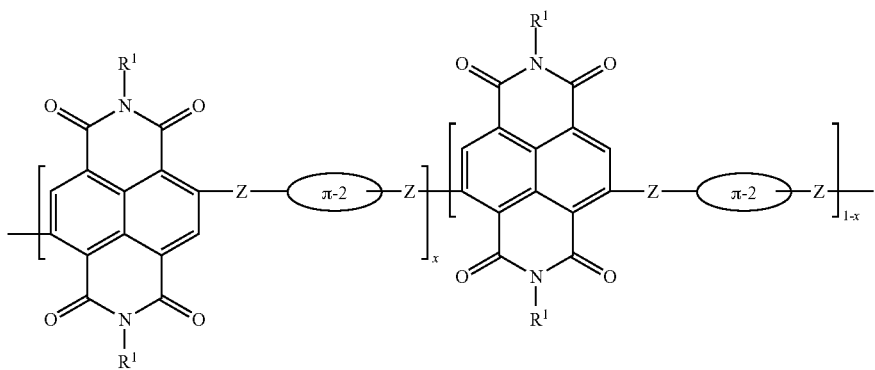
VII'

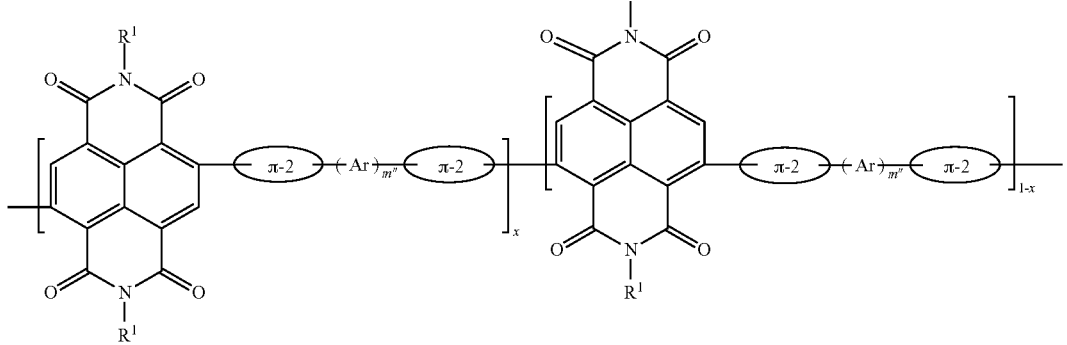
IX'
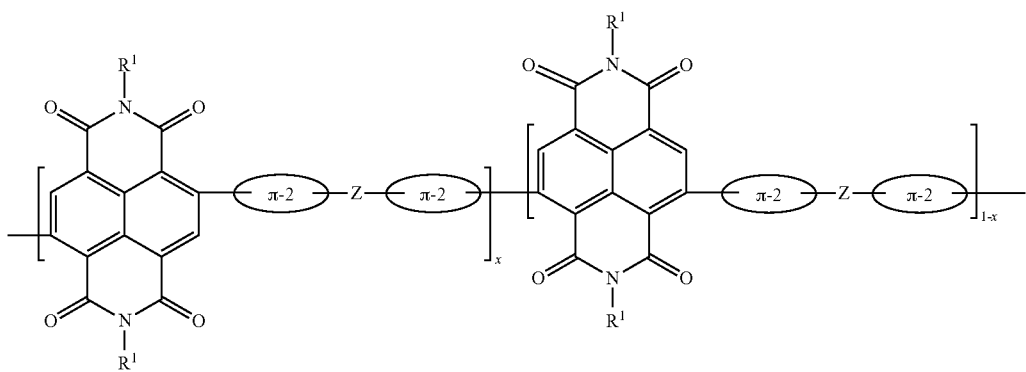
XI'
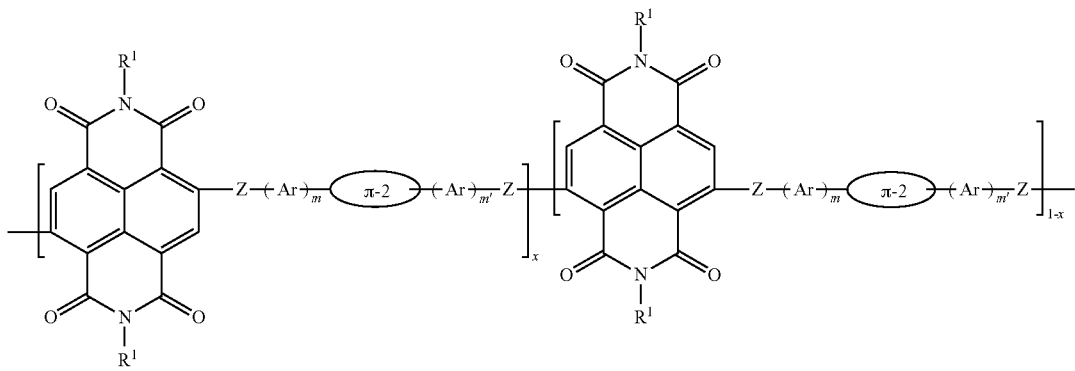
XIII'

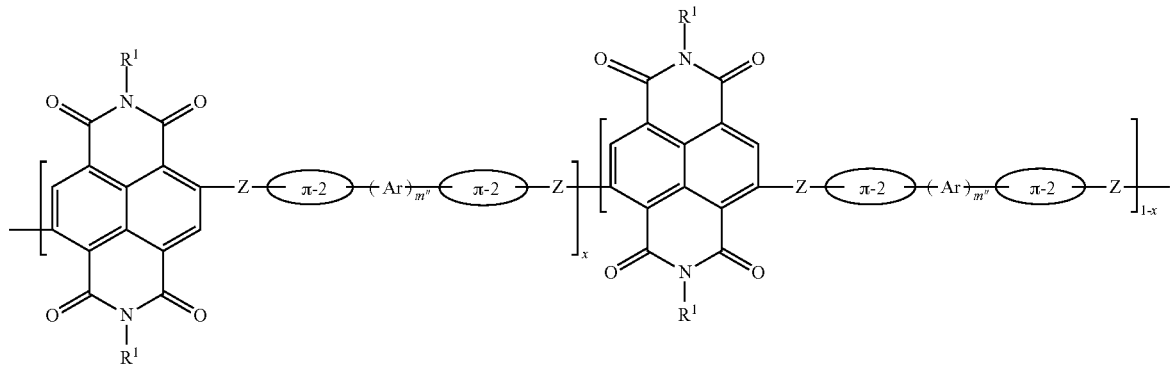

XV' wherein x is a real number and 0.5<x≤1, and $R^1$, $R^5$, $R^6$, $R^7$, π-2, Ar, Z, m, m', and m" are as defined herein. In various embodiments, x is at least about 0.6, for example, greater than about 0.75, greater than about 0.80, greater than about 0.85, greater than about 0.90, or greater than about 0.95.

Certain embodiments disclosed herein can be stable in ambient conditions ("ambient stable") and soluble in common solvents. As used herein, a polymer can be considered electrically "ambient stable" or "stable at ambient conditions" when the carrier mobility or the reduction-potential of the polymer is maintained at about its initial measurement when the polymer is exposed to ambient conditions, for example, air, ambient temperature, and humidity, over a period of time. For example, a polymer according to the present teachings can be described as ambient stable if its carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

Without wishing to be bound by any particular theory, it is believed that if n-channel transport is desired, the strong electron-depleted electronic structure enabled by $M_1$ copolymerized with a strong electron-depleted $M_2$ repeating unit, together with the regioregular highly π-conjugated polymeric backbone of the present polymers, can make the present polymers ambient-stable n-channel semiconductor materials without requiring additional π-core functionalization (i.e., core substitution of the naphthalene moiety) with strong electron-withdrawing functionalities. If large light absorption (extinction coefficient) is desired, the present polymers can be provided with a highly π-conjugated polymeric backbone and by having the $M_1$ unit copolymerized with an electron-donating $M_2$ comonomer to enable a push-pull structure. If an ambipolar polymer is desired, for example in light-emitting transistor applications, the present polymers can have a highly π-conjugated polymeric backbone comprising a copolymer of $M_1$ and an electron-neutral or electron-donating (electron-rich) $M_2$ unit.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone. As demonstrated in the examples hereinbelow, the present polymers can have room temperature solubilities in conventional organic solvents such as xylene, dichlorobenzene (DCB), and other chlorinated hydrocarbons (CHCs) as high as 60 g/L.

Given their high solubilities in common solvents, the present polymers can be fabricated into various articles of manufacture using solution processing techniques in addition to other more expensive processes such as vapor deposition. Various solution processing techniques have been used with organic electronics. Common solution processing techniques include, for example, spin-coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like. For example, much of the printed electronics technology has focused on inkjet printing, primarily because this technique offers greater control over feature position and multilayer registration. Inkjet printing offers the benefits of not requiring a preformed master (compared to contact printing techniques), as well as digital control of ink ejection, thereby providing drop-on-demand printing. However, contact printing techniques have the advantage of being well-suited for very fast roll-to-roll processing. Note that different printing techniques require substantially different ink rheological properties, ranging from very viscous formulations used in flexography to less viscous gravure-printing inks to far more dilute solutions suitable for inkjet printing. As such, it cannot always be assumed a priori that a polymer functioning well in spin-coated devices, hence solution-processable, will necessarily be printable.

Therefore, one of the unexpected properties of the present polymers includes their processing versatility as demonstrated in the examples herein below. Formulations including the present polymers were shown to be printable via different types of printing techniques including gravure printing, flexographic printing, and inkjet printing, providing smooth and uniform films that allow, for example, the formation of a pinhole-free dielectric film thereon, and consequently, the fabrication of all-printed devices.

One or more polymers of the present teachings can be used to prepare the organic semiconducting material or a part thereof, such as one or more layers of the organic semiconducting material.

The present teachings, therefore, further provide methods of preparing the organic semiconducting material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide the organic semiconducting material (e.g., a thin film organic semiconductor) that includes a polymer as disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin-coating, drop-casting, zone casting, dip coating, blade coating, or spraying.

As disclosed above, the organic semiconductor device may be selected from a large number of devices and devices structures. With regard to potential polymers, their properties, setups of the semiconductor device (except for the at least one intermediate layer), reference may be made to WO 2009/098253 A1 and the devices and methods of manufacturing as disclosed therein. Thus, the organic semiconductor device may be selected from electronic devices, optical devices, and optoelectronic devices, such as field effect transistors (e.g., thin film transistors), photovoltaic devices, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators. Most preferably, the organic semiconductor device is an organic field-effect transistor or comprises at least one organic field-effect transistor. Various types of organic field effect transistors are feasible, including top-gate top-contact capacitor structures, top-gate bottom-contact capacitor structures, bottom-gate top-contact capacitor structures, and bottom-gate bottom-contact capacitor structures. With regard to potential structures and potential processes of manufacturing these devices, reference may be made to WO 2009/098253 A1. However, other organic semiconducting materials, other organic semiconductor devices, other structures and other ways of manufacturing these devices are feasible within the scope of the present invention.

In another preferred embodiment, the method of the present teaching can include one or organic semiconducting material, wherein the organic semiconducting material is selected from a polymer of the formula

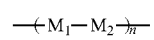

wherein $M_1$ is selected from:

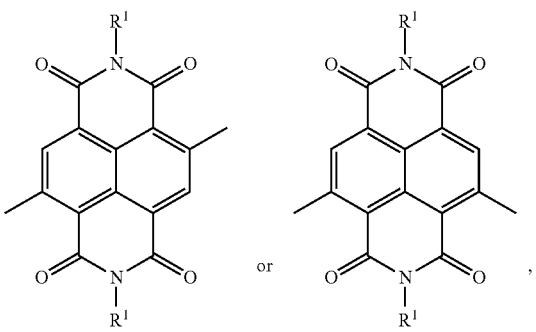

wherein $R^1$ is 2-octyldodecyl; and
$M_2$ is a polymer of the following formula:

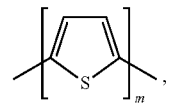

wherein m is selected from a number in the range of 2 to 50, preferably 2 to 20 repeating units, or 2 to 10.

In a further preferred embodiment, the intermediate layer is generated by processing from a solution comprising at least one solvent and the at least one thiol compound, preferably by using at least one of a spin-coating process and a dipping process. The at least one thiol compound may be dispersed and/or dissolved in the at least one solvent. More than one solvent may be used. Depending on the type of thiol compound, various kinds of solvents may be used, such as aqueous solvents and/or organic solvents. Examples will be given below. Besides spin-coating and dipping, other types of coating processes may be used, such as printing processes, doctor blading, or combinations of the named processes and/or other processes.

In a preferred embodiment, the processing from the solution may comprise at least one step of applying the solution onto at least one of the electrodes, preferably both of the electrodes, and at least one step of removing the solvent. Thus, preferably, the solution may be applied to at least one source electrode and/or at least one drain electrode. The at least one step of removing the solvent may comprise a mechanical step, such as in spin-coating, and/or a thermal step, such as by applying heat to the solution, in order to partially or fully remove the solvent. The solution may comprise the thiol compound preferably to an amount of 10 mM to 400 mM, preferably 20 mM to 200 mM. Preferably, the at least one solvent is selected from the group consisting of: ethanol, toluene, xylene.

In a further aspect of the present invention, an organic semiconductor device is disclosed. The organic semiconductor device has at least one organic semiconducting material and at least two electrodes adapted to support an electric charge carrier transport through the organic semiconducting material. The at least two electrodes preferably may comprise at least one source electrode and at least one drain electrode. However, other embodiments are possible. The organic semiconducting material intrinsically has ambipolar semiconducting properties. At least one intermediate layer at least partially is interposed between the organic semiconducting material and at least one of the electrodes of the organic semiconductor device. The intermediate layer comprises at least one thiol compound having the general formula HS—R, wherein R is an organic residue. The thiol compound has a dipole moment. The dipole moment has the same direction and at least the same magnitude as the dipole moment in 4-Phenylthiophenol. By the intermediate layer, an ambipolar charge carrier transport between the electrodes is suppressed in favor of a unipolar charge carrier transport.

Preferably, the organic semiconductor device is producible by the method according to one or more of the embodiments disclosed above. Thus, with regard to definitions and with regard to potential embodiments, reference may be made to the disclosure of the method, as given above.

In a preferred embodiment, the organic semiconductor device comprises a channel for charge carrier transport between the at least two electrodes. Thus, as outlined above, the at least two electrodes may comprise at least one source electrode and at least one drain electrode. Preferably, the channel may have a channel length from 1 µm to 500 µm and preferably from 5 µm to 200 µm. Additionally, the organic semiconductor device may have at least one further electrode, such as at least one gate electrode. The at least one further electrode, such as the at least one gate electrode, may be separated from the channel by at least one insulating material, preferably by at least one insulating layer. For further preferred embodiments, reference to the method as disclosed above may be made.

In a further aspect of the present invention, a use of an intermediate layer comprising at least one thiol compound for suppressing an ambipolar charge carrier transport in favor of a unipolar charge carrier transport in an organic semiconducting device having at least one organic semiconducting material and at least two electrodes adapted to support an electric charge carrier transport through the organic semiconducting material is disclosed. The intermediate layer at least partially is interposed between at least one of the electrodes and the organic semiconducting material. The intermediate layer comprises at least one thiol compound, having the general formula HS—R, wherein R is an organic residue. The thiol compound forms an electric dipole with a dipole moment. The dipole moment can have the same direction and at least the same magnitude as the dipole moment in 4-Phenylthiophenol. By the intermediate layer, an ambipolar charge carrier transport between the electrodes is suppressed in favor of a unipolar charge carrier transport.

For further embodiments and definitions, reference may be made to the method as outlined above. Thus, as outlined above, suppressing an ambipolar charge carrier transport between the electrodes in favor of a unipolar charge carrier transport refers to the fact that, in a device without the at least one intermediate layer, the electron and hole mobilities in the organic semiconducting material differ by less than two orders of magnitude, whereas, by using the at least one intermediate layer in an—apart from the at least one intermediate layer—identical layer setup, the electron and hole mobilities differ by two orders of magnitude or more, and preferably more than three orders of magnitude. Preferably, as outlined above, the ambipolar semiconducting properties are suppressed in favor of unipolar negative charge carrier transport.

The method of the present invention, the organic semiconductor device according to the present invention, and the use of an intermediate layer according to the present invention imply a large number of advantages over known methods, organic semiconductor devices and uses. Thus, astonishingly, it was found that the process of implementing at least one intermediate layer of the type disclosed above, such as the process of forming at least one self-assembled monolayer, significantly may change the charge carrier transport properties of the organic semiconductor device, by shifting the transport characteristics from an ambipolar charge carrier transport to a unipolar charge carrier transport, specifically to a unipolar negative charge carrier transport. Despite all prior art documents reporting that self-assembling monolayers on metal electrodes may tune the work-function of the electrodes, so far, the impact of such electrode treatments for ambipolar materials was unknown. Thus, the use of the present invention, preferably by establishing proper self-assembling monolayer treatments, in combination with preferably a low-bandgap polymer, may yield a unipolar device. Thus, preferably, the bandgap of the organic semiconducting material and, more preferably, the bandgap of the polymer, i.e. the energetic difference between the HOMO level and the LUMO level, lies within the ranges given above. Preferably, P(NDI2OD-T2) may be used, which, in combination with the at least one intermediate layer and, more preferably, in combination with proper SAM treatments, as outlined above, yields a unipolar device, preferably a negative charge carrier unipolar device.

The process of forming the intermediate layer, preferably the process of forming a self-assembled monolayer itself, may not remarkably raise the fabrication cost, since the forming of this at least one intermediate layer typically imposes similar steps as in usual preparation techniques, such as printing processes or processes of forming other semiconductor structures. Thus, techniques such as dissolving the thiol compound in at least one solvent to form a solution may be comprised, applying the solution to a surface of a substrate, preferably to a surface of a metal, drying the applied film, and removing the solvent. Accordingly, the use of the at least one intermediate layer, preferably the at least one self-assembled monolayer, may be suitable for an organic field effector transistor and/or other organic semiconductor devices.

As outlined above, the thiol compound has a dipole moment with a dipole moment vector pointing away from the SH-group of the thiol compound, wherein the electric dipole moment has at least the same magnitude as the electric dipole moment in 4-Phenylthiophenol. This may easily be achieved by designing the electronic system of the residue R in the thiol compound. Thus, by using electron-rich residues and electron-poor residues, and, thus, electron-rich thiol compounds and electron-poor thiol compounds, the electric dipole moment may be changed. As outlined above, electron-rich and electron-poor thiol compounds were used to treat gold and silver electrodes and low-bandgap polymers, which, typically, exhibit pronounced ambipolarity without contact treatment. The polymers were deposited on top of the intermediate layer, and OTFTs built this way were completed and tested. As will be outlined in further detail below, as a figure of merit, $I_{on,n} \cdot I_{on,p}$, which is a ratio of on-state source-drain current between the n-channel to the p-channel of the transistor, is used. This ratio is expected to be high for an electron transporting or n-channel semiconducting copolymers, without ambipolar behavior.

BRIEF DESCRIPTION OF THE FIGURES

In the following, preferred embodiments of the present invention are disclosed, by referring to the enclosed figures. However, the invention is not restricted to the preferred embodiments.

In the figures.

PREFERRED EMBODIMENTS

Figure 1:
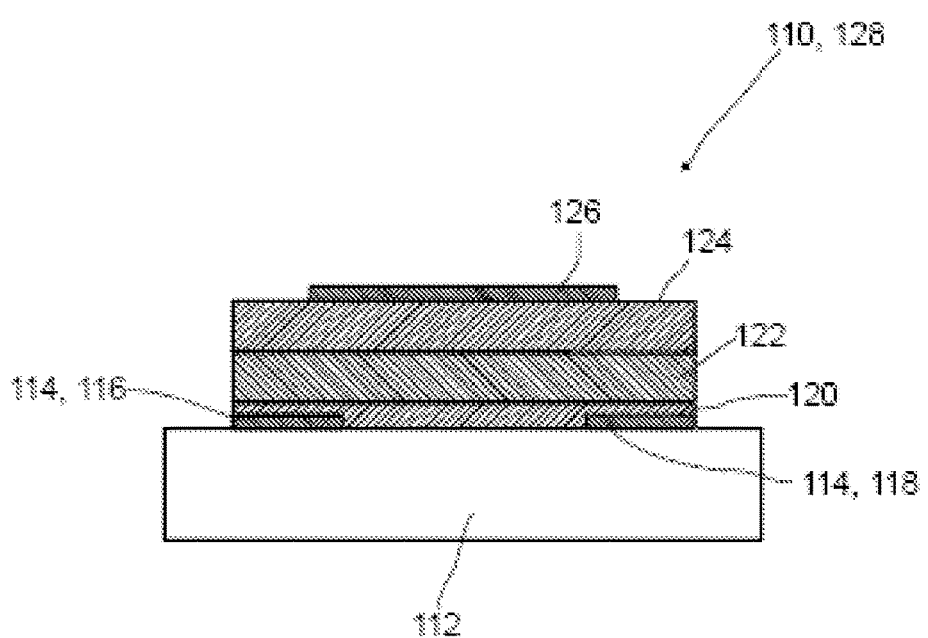
FIG. 1 discloses a basic layer setup of a preferred embodiment of an organic semiconductor device according to the present invention.

In FIG. 1, a preferred embodiment of an organic semiconductor device 110 according to the present invention is depicted in a cross-sectional view. The organic semiconductor device may comprise a substrate 112, such as a glass substrate and/or a plastic substrate. Further, the organic semiconductor device 110 comprises two electrodes 114, which, in this case, comprise a source electrode 116 and a drain electrode 118. On top of these electrodes 114, an intermediate layer 120 is deposited on top of the intermediate layer 120, at least one organic semiconducting material 122 is deposited, on top of which an insulating layer 124 is located. On top of the at least one insulating layer 124, a gate electrode 126 is deposited.

It has to be pointed out that the setup disclosed in FIG. 1 is meant to be a schematic setup. The organic semiconductor device 110 may comprise additional elements which are not depicted in FIG. 1 or may comprise a different layer setup as depicted in this Figure. Thus, the setup in FIG. 1 discloses an exemplary embodiment of an organic thin-film transistor 128 with a top-gate bottom-contact (TGBC) setup. However, other device structures are possible.

Device Fabrication

With reference to the setup disclosed in FIG. 1, top-gate bottom-contact (TGBC) thin-film transistors were fabricated on polyethylene terephthalate (PET) substrate 112. Source and drain electrodes 116, 118 were made of gold or silver and were patterned lithographically. Preferably, in this setup or in other embodiments of the present invention, the channel length, i.e. the separation between the source electrode 116 and the drain electrode 118, is within the range of 1 µm to 500 µm, preferably from 5 µm to 200 µm. Further, in this layout or in other embodiments of the present invention, the w/l ratio, which characterizes the ratio between the width of the electrodes 116, 118 and the channel length may vary from 50 to 10000.

After lithography of the electrodes 114, the remaining photoresist layer on the electrodes 114 was left unstripped, until just before use of the samples, in order to minimize dust particle accumulation in the channel area and oxidation of the electrodes 114, mainly the silver electrodes.

Prior to use, the substrates 112 with the electrodes 114 thereon were rinsed with acetone, in order to remove the photoresist. Subsequently, the samples were dried by blowing with nitrogen. Further drying to remove residual solvent was performed by heating the samples by using a hot plate at 90° C. for 30 seconds. Without any delay, the substrates were further cleansed using RF plasma for 5 minutes.

Meanwhile, the thiol solutions were prepared using organic solvents (i.e. ethanol or toluene) with concentration ranging from 20 mM to 200 mM and filtered (PTFE 0.45 µm) before usage. Thiol compounds used in the exemplary embodiments are listed in Table 1.

TABLE 1

List of thiol compounds used in exemplary embodiments

| Sample Type Nr. | Short Name of Thiol Compound and provider | Chemical Name | Chemical Structure | Electric Dipole Moment (Debye) | Direction of Electric Dipole Moment |
|---|---|---|---|---|---|
| 1 | (NA) | (comparative samples without intermediate layer) | (NA) | | |
| 2 | PFBT SA | Pentafluorobenzenethiol | [structure: pentafluorobenzenethiol] | 1.29 | Pointing from R to SH |
| 3 | DT [SA] | 1-Decanethiol | [structure: CH₃(CH₂)₉SH] | 1.91 | Pointing from SH to R |

TABLE 1-continued

List of thiol compounds used in exemplary embodiments

| Sample Type Nr. | Short Name of Thiol Compound and provider | Chemical Name | Chemical Structure | Electric Dipole Moment (Debye) | Direction of Electric Dipole Moment |
|---|---|---|---|---|---|
| 4 | MBT [SA] | 4-Methylthiophenol | HS—⟨benzene⟩—CH$_3$ | 1.57 | Pointing from SH to R |
| 5 | MTBT [TCI] | 4-(Methylthio)thiophenol | HS—⟨benzene⟩—SCH$_3$ | 0.93 | Pointing from SH to R |
| 6 | DMeOBT [TCI] | 3,4-Dimethoxythiophenol | HS—⟨benzene⟩(OMe)(OMe) | 1.68 | Pointing from SH to R |
| 7 | BBT [Fluorochem] | 4-Butylthiophenol | HS—⟨benzene⟩—C$_4$H$_9$ | 1.6 | Pointing from SH to R |
| 8 | PBT [Oakwood] | 4-Phenylthiophenol | HS—⟨benzene⟩—⟨phenyl⟩ | 1.22 | Pointing from SH to R |
| 9 | TN [ABCR] | 2-Thionaphthol | HS—⟨naphthalene⟩ | 1.46 | Pointing from SH to R |
| 10 | ABT [ABCR] | 4-(Dimethylamino)thiophenol | HS—⟨benzene⟩—N(CH$_3$)$_2$ | 4.1 | Pointing from SH to R |
| 11 | BM [ABCR] | Benzyl mercaptan | ⟨phenyl⟩—CH$_2$—SH | 1.74 | Pointing from SH to R |
| 12 | PMBT [Enamine] | 2,3,4,5,6-Pentamethylbenzene-1-thiol | HS—⟨benzene⟩(CH$_3$)$_5$ | 1.76 | Pointing from SH to R |

In the second column of Table 1, the provider of the thiol compounds as used for the experiments is given, Therein, SA denotes Sigma Aldrich, Inc. (www.sigmaaldrich.com), TCI denotes Tokyo Chemical Industry Co Ltd (http://www.tci-asiapacific.com), Fluorochem denotes Fluorochem Ltd. (www.fluorochem.co.uk), Oakwood denotes Oakwood Products, Inc. (www.oakwoodchemical.com), ABCR denotes abcr GmbH & Co. KG (www.abcr.de), and Enamine denotes Enamine Ltd. (www.enamine.net).

In column "Electric Dipole Moment", magnitudes (absolute values) of the dipole moments of the respective thiol compounds are listed. As outlined above, these electric dipole moments were derived by calculation using Spartan '06 software.

In column "Direction of Electric Dipole Moment", information regarding the polarity of the electric dipole and regarding the direction of the electric dipole moment vector is given. Thus, the information "pointing from R to SH" can refer to thiol compounds having a negative polarity on the side of the residue R and a positive polarity on the side of the thiol group SH. The information "pointing from SH to R" can refer to thiol compounds having a positive polarity on the side of the residue R and a negative polarity on the side of the thiol group SH. As can be seen in Table 1, the polarity of the electric dipole strongly depends on the chemical nature of the residue R. Thiol compounds having an R which strongly withdraws electrons, such as the fluoro groups in PFBT, have an electric dipole moment vector pointing towards the SH group, whereas electron donating residues exhibit an electric dipole moment vector pointing away from the SH group. As outlined above, in the intermediate layer according to the present teaching, the thiol compounds have an electric dipole moment vector pointing away from the SH-group of the thiol compound, and the electric dipole moment has at least the same magnitude as the electric dipole moment in 4-Phenylthiophenol. In Table 1, this qualifies for the following thiol compounds: DT, MBT, MTBT, DMeOBT, BBT, PBT, TN, ABT, BM, PMBT.

For each sample, except for the comparative embodiment Nr. 1 in Table 1, an intermediate layer 120 was processed on the electrodes 114, by using the respective thiol compound listed in Table 1. For comparison, sample Nr. 1 in Table 1 was left without intermediate layer 120. Without wishing to be bound by this assumption, it is believed that these intermediate layers 120 form self-assembled monolayers (SAMs), and will be called as such in the following. The self assembled monolayers were prepared on the silver electrodes 116 by spin-coating the optionally warm solution onto the substrates 112 having the electrodes 114 thereon, or by dipping the substrates 112 having the electrodes 114 thereon into the thiol solution. The samples processed this way were then rinsed with neat organic solvent and blown dry with nitrogen. Further drying was done by heating the samples using a hotplate at 90° C. for 30 seconds.

The samples processed this way were then coated with the organic semiconducting material 122. For this purpose, a layer of P(NDI2OD-T2) was deposited by spin-coating a solution of P(NDI2OD-T2) in a concentration ranging from 5-10 mg/mL in toluene, using a spin speed of 1500-2000 rpm. P(NDI2OD-T2) was synthesized in-house, as disclosed in WO 2009/098253 A1. The films created that way were dried on a hotplate at 90° C. for 30 seconds.

Further, the insulating layer 124 was created on top of the samples. For this purpose, a dielectric layer was deposited by spin-coating a layer of polymethylmethacrylate (PMMA) or polystyrene (PS). The overall thickness of the insulating layer 124 was about 400-600 nm.

The device structure was completed by vapor deposition of patterned Au contacts as a gate electrode 126 through a shadow mask. The thickness of the gate electrode 126 was about 30 to 50 nm.

Device Characterization

For electrically characterizing the organic semiconductor devices 110, a Keithley 4200 semiconductor characterization system with three source measurement units (SMUs) configured with preamplifiers and an integrated capacitance voltage unit (CVU) was used. With this setup, all electrical characterizations were performed, including capacitance measurement of all the fabricated OTFTs. As a second major component of the test system, a signatone probe station was used. A dark/metal box enclosure was used to avoid light exposure and to reduce environmental noise.

Electric charge carrier mobilities ($\mu$) of the OTFTs were calculated by standard field effect transistor equations. In traditional metal-insulator-semiconductor FETs (MISFETs), there is typically a linear and saturated regime in the IDS vs VDS curves at different VG. Therein, IDS denotes the source-drain saturation current, VDS is the potential between the source and drain and VG is the gate voltage. At large VDS, the current saturates and is given by:

$$(I_{DS})_{sat} = (WC_i/2L)\mu(V_G - V_t)^2.$$

Therein, L denotes the channel length, i.e. the spatial separation between the electrodes 116 and 118, and W denotes the channel width, i.e. the width of the electrodes 116, 118 in a direction perpendicular to an interconnecting line between the electrodes 116, 118. Ci is the specific capacitance of the gate insulator, and Vt is the threshold voltage. Electric charge carrier mobilities $\mu$ were calculated in the saturation regime by re-arranging the above equation into:

$$\mu_{sat} = (2I_{DS}L)/[WC_i(V_G - V_t)^2]$$

Operating in the saturation regime by applying gate voltage of 50V and source-drain voltage of 50V, device parameters can be obtained and are summarized in Table 2.

TABLE 2

OTFT device characterization results of various electrode treatments.

| Sample | | | $\mu$ (cm$^2$/Vs) | |
|---|---|---|---|---|
| Type Nr. | Thiol | $I_{on,n}:I_{on,p}$ | n | p |
| 1 | (NA) | $5\text{-}5.10^2$ | $7.10^{-3}\text{-}2.10^{-2}$ | $8.10^{-4}\text{-}5.10^{-3}$ |
| 2 | PFBT | $1.10^{-1}\text{-}3E10^{-1}$ | $2.10^{-3}\text{-}3.10^{-3}$ | $10^{-2}$ |
| 3 | DT | $3.10^3\text{-}5.10^3$ | $2.10^{-2}\text{-}5.10^{-2}$ | $4.10^{-5}\text{-}6.10^{-5}$ |
| 4 | MBT* | $10^7$ | $0.1\text{-}0.3$ | — |
| 5 | MTBT | $4.10^3\text{-}2.10^4$ | $2.10^{-2}\text{-}0.1$ | $7.10^{-5}\text{-}2.10^{-4}$ |
| 6 | DMeOBT | $6.10^2\text{-}1.10^3$ | $2.10^{-2}\text{-}4.10^{-2}$ | $4.10^{-4}\text{-}5.10^{-4}$ |
| 7 | BBT | $3.10^3$ | $7.10^{-2}\text{-}9.10^{-2}$ | $2.10^{-3}$ |
| 8 | PBT | $1.10^4\text{-}3.10^4$ | $6.10^{-2}\text{-}0.15$ | $3.10^{-5}\text{-}10^{-4}$ |
| 9 | TN | $2.10^3\text{-}2.10^4$ | $6.10^{-2}\text{-}0.2$ | $8.10^{-5}\text{-}8.10^{-4}$ |
| 10 | ABT* | $10^7$ | $5.10^{-2}\text{-}0.1$ | — |
| 11 | BM | $3.10^2\text{-}1.10^3$ | $10^{-2}$ | $10^{-4}$ |
| 12 | PMBT | $1.10^2\text{-}2.10^3$ | $10^{-3}\text{-}10^{-2}$ | $4.10^{-5}\text{-}7.10^{-5}$ |

The data provided in Table 2 was obtained from devices in top-gate bottom-contact architecture on PET substrates with silver electrodes. An organic semiconductor layer was deposited by spin-coating of a solution of 5 mg/ml P(NDI2OD-T2) in toluene to obtain a layer thickness of 50 nm. A dielectric layer was deposited by spin-coating a solution of 4 wt-% polystyrene in isopropyl acetate, in order to obtain a dielectric layer having a thickness of 600 nm.

In Table 2, $I_{on,n}$ denotes an onset current of a n-channel behavior, i.e. of a negative charge carrier transport. $I_{on,p}$ denotes an onset current of a p-channel behavior, i.e. of a positive charge carrier transport. In the column marked by $I_{on,n}:I_{on,p}$, the ratio of these onset currents is given, which is a measure of the ratio of negative and positive charge carrier mobilities. Values marked by a "*" in Table 2 denote measurements, in which the values in column "$I_{on,n}:I_{on,p}$" represent the $I_{on}/I_{off}$ ratio of n-channel performance only, i.e. by the ratio of the onset current and $I_{off}$ is the lowest current obtained during the measurement.

Figure 2:
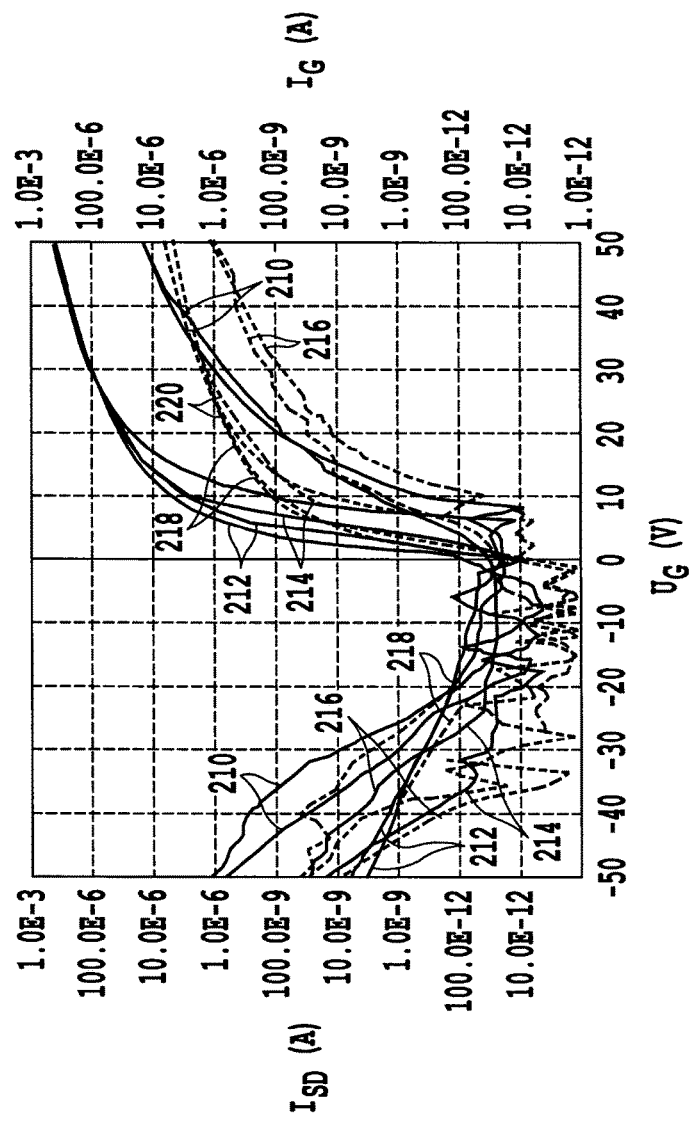
FIGS. 2 and 3 depict source-drain current measurements as a function of the gate voltage for various organic semiconductor devices.
Figure 3:
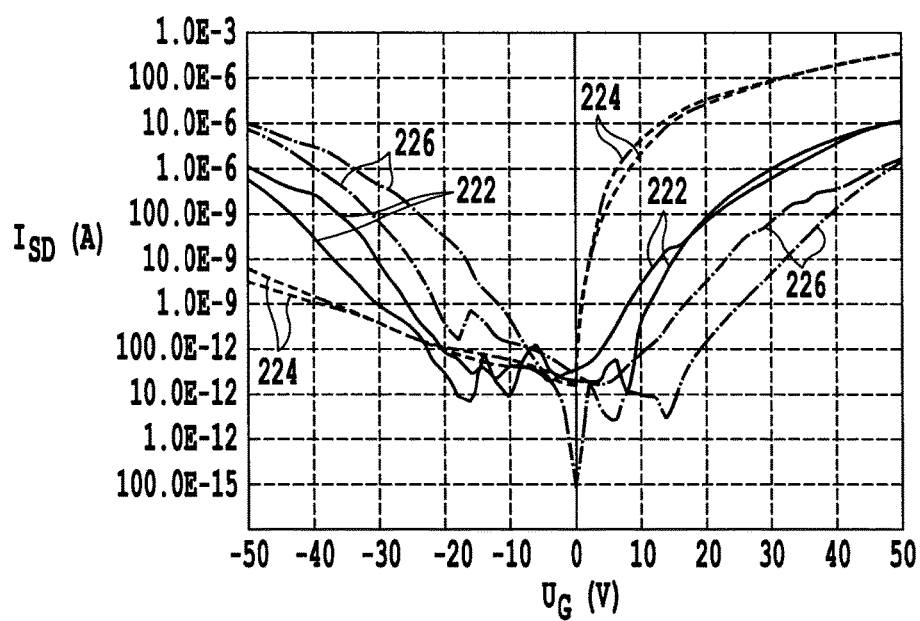

In FIGS. 2 and 3, examples of measurement curves of the OTFTs are shown, which were used to derive the values listed in Table 2. In FIG. 2, source-drain-currents ($I_{SD}$, left vertical axis) and gate leakage currents ($I_G$, right vertical axis) are depicted as a function of the gate voltage $U_G$, using equal gate-source-voltages and drain-source-voltages $U_G = U_{GS} = U_{DS}$. Therein, curves 210 denote typical measurements of source-drain-currents for samples with no intermediate layer (sample type Nr. 1), curves 212 denote typical measurements of source-drain-currents for samples with ABT intermediate layer (sample type Nr. 10), curves 214 denote typical measurements of source-drain-currents for samples with MBT intermediate layer (sample type Nr. 4), dotted curves 216 denote typical measurements of gate leakage currents for samples with no intermediate layer (sample type Nr. 1), dotted curves 218 denote typical measurements of gate leakage currents for samples with ABT intermediate layer (sample type Nr. 10), and dotted curves 220 denote typical measurements of gate leakage currents for samples with MBT intermediate layer (sample type Nr. 4).

As opposed to curves 210, the transfer curves 212 (ABT) and 214 (MBT) in FIG. 2 show p-channel suppression. With regard to the gate leakage currents, curves 218 (ABT) and 220 (MBT) show that these gate leakage currents are equal to the p-channel current, indicating full suppression of p-channel current.

In order to show the impact of the dipole moment of the thiol compounds, in FIG. 3, source-drain-currents $I_{SD}$ are depicted as a function of the gate voltage $U_G$ for electron withdrawing residues (PFBT) and electron donating residues (ABT). Therein:

curves 222 denote typical measurements of source-drain-currents for samples with no intermediate layer (sample type Nr. 1), curves 224 denote typical measurements of source-drain-currents for samples with ABT intermediate layer (sample type Nr. 10), curves 226 denote typical measurements of source-drain-currents for samples with PFBT intermediate layer (sample type Nr. 2).

As opposed to samples without intermediate layer (curves 222), ABT treated sample (curves 224) clearly exhibit a p-channel suppression, whereas PFBT treated samples (curves 226) clearly show the opposite effect, i.e. a n-channel suppression.

Summarizing, the results in Table 2 and FIGS. 2 and 3 clearly show that thiol compounds having an electron donating residue R exhibit a pronounced suppression of p-channel performance as can be seen from higher $I_{on,n}:I_{on,p}$ ratio, while obtaining improved n-channel performance. MBT and ABT treatment, in particular, have shown to fully suppress the injection of holes. On the other hand, by using electron withdrawing thiol compounds, the reverse effect of enhanced p-channel performance can be attained. Thus, by using intermediate layers having thiol compounds according to the present teachings, ambipolar behavior of the OTFTs may be suppressed in favor of unipolar charge carrier transport, specifically in favor of unipolar n-type charge carrier transport.

Figure 4A:
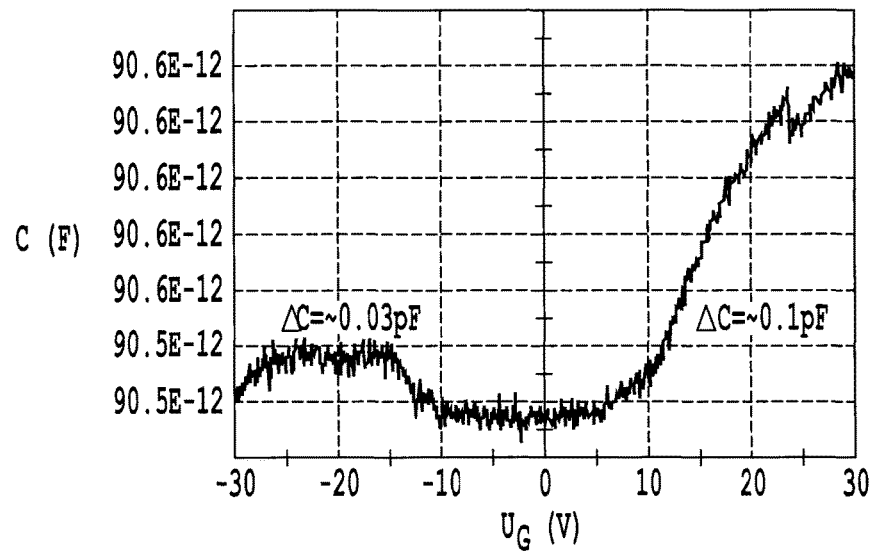
FIGS. 4A to 4D depict capacitance measurements of various organic semiconductor devices.
Figure 4B:
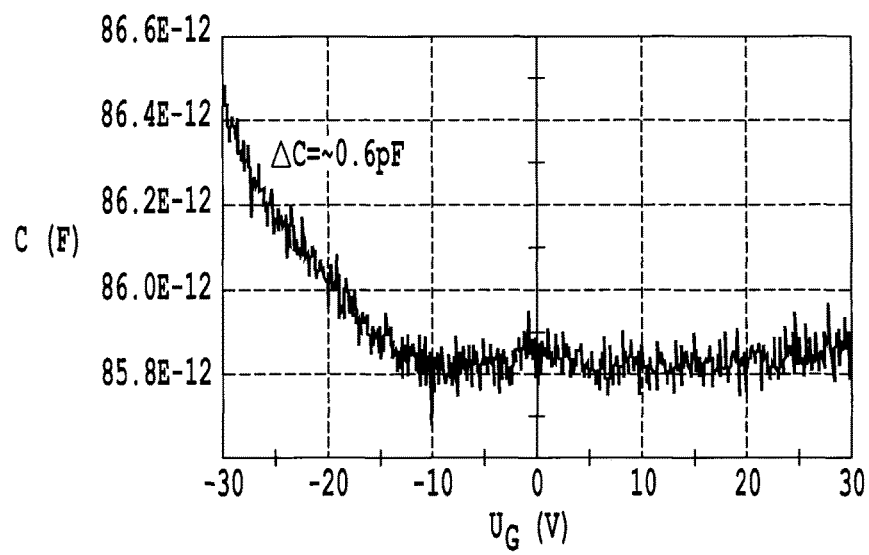

This result was further confirmed by various capacitance measurements, the results of which are depicted in FIGS. 4A to 4B. Upon applying voltage to the top electrode (gate electrode 126), charges will be injected from one of the bottom electrodes 114 into the organic semiconducting material 122 (OS), which then will accumulate at the interface between the insulating layer 124 (dielectric) and the organic semiconducting material 122 and, hence, be measured as a capacitance in series with the dielectric. An increase of capacitance value in the positive and negative applied voltage signifies electrons and holes accumulation at the dielectric/OS interface respectively. The difference in capacitance value (ΔC) indicates the ease of charge injection. The higher the value, the lower the injection barrier is.

Figure 4C:
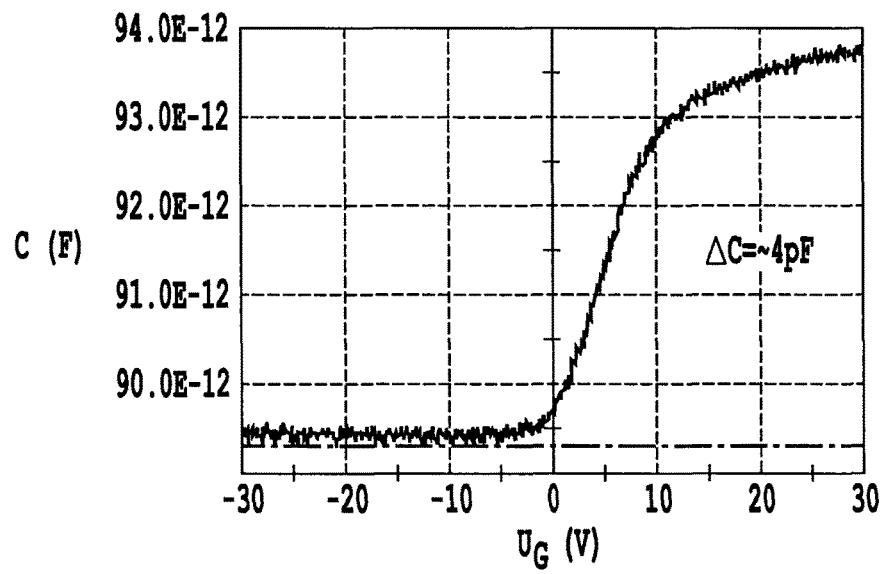
Figure 4D:
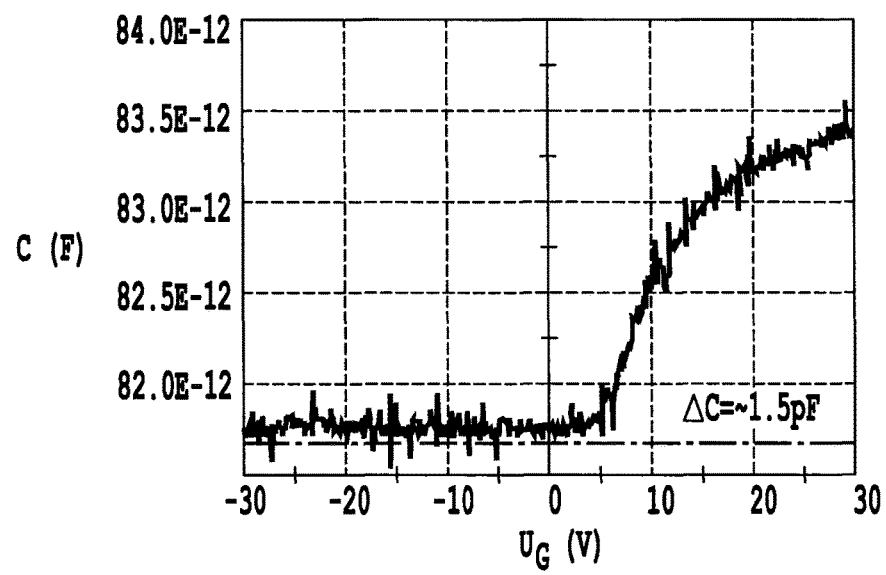

FIGS. 4A to 4B show Capacitance measurements C, given in Farad (F), as a function of the gate voltage $U_G$, for various device setups having different types of thiol compounds. Therein:

FIG. 4A shows typical capacitance measurements of samples with no intermediate layer (sample type Nr. 1), FIG. 4B shows typical capacitance measurements of samples with PFBT intermediate layer (sample type Nr. 2), FIG. 4C shows typical capacitance measurements of samples with ABT intermediate layer (sample type Nr. 10), and FIG. 4D shows typical capacitance measurements of samples with MBT intermediate layer (sample type Nr. 4).

FIGS. 4A to 4D demonstrate that samples without treatment (no intermediate layer, FIG. 4A) show accumulation of charges in both positive and negative applied voltages, indicating ambipolarity. Samples which are PFBT treated (PFBT intermediate layer, FIG. 4B) show stronger charge accumulation in negative gate voltage, suggesting more efficient injection of holes. Samples which are ABT treated (ABT intermediate layer, FIG. 4C) and MBT treated samples (MBT intermediate layer, FIG. 4D) show accumulation only in positive applied voltage, confirming the unipolar n-channel performance of these OTFTs.

Examples of Organic Semiconducting Materials

In the following, examples of preparations of polymers to be used in the organic semiconducting material of the organic semiconductor device are given. However, the examples are provided to illustrate further and to facilitate the understanding of the present teachings and are not in any way intended to limit the invention. Further reference may be made to WO 2009/098253 A1.

All reagents were purchased from commercial sources and used without further purification unless otherwise noted. Specifically, dioxane, dichlorobenzene (DCB), chloroform (CHCl$_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under N$_2$ unless otherwise noted. The compound 5,5'-bis(trimethylstannyl)-2,2'-bithiophene was prepared according to the procedures described in Goto et al., Angew. Chem. Int. Ed., vol. 44: 4322 (2005).

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest microlab, LLC. Polymer molecular weights were determined on a Waters GPC system (Waters Pump 510) in THF at room temperature versus polystyrene standards.

Example 1: Polymer Synthesis

The following examples describe the preparation of certain polymers of the present teachings and related intermediates.

Example 1A. Preparation of poly{[N,N'-bis(2-ethylhexyl)-1,4,5,8-naphthalene diimide-2,6-diyl]-alt-5,5'-(2,2'-bithiophene)} [P(NDI2EH-T2)]

Preparation of 2,6-dibromonaphthalene-1,4,5,8-tetracarboxydianhydride (NDA-Br$_2$)

A mixture of 1,4,5,8-naphthalenetetracarboxylic dianhydride (2.8 g, 10.3 mmol) and oleum (20% SO$_3$, 100 mL) was stirred at 55° C. for 2 hours. To this mixture, a solution of dibromoisocyanuric acid (3.0 g, 10.5 mmol) in oleum (50 mL) was added over 40 mins. The resulting mixture was then warmed to 85° C. and maintained at this temperature for 43 hours. After cooling to room temperature, the reaction mixture was poured onto crushed ice (420 g), diluted with water (400 mL), and then stirred at room temperature for 1 hour. The resulting precipitates were collected by centrifugation, washed with water and methanol, collected by centrifugation and finally dried under vacuum, leading to a greenish yellow solid (3.6 g, 8.5 mmol, yield 82.2%). Elemental Analysis (calc. C, 39.47; H, 0.47; N, 0.00). found C, 38.20; H, 0.79; N, 0.00.

Preparation of N,N'-bis(2-ethylhexyl)-2,6-dibromonaphthalene-1,4,5,8-bis(dicarboximide) (NDI2EH-Br$_2$)

A mixture of NDA-Br$_2$ (above, 1.6 g, 3.9 mmol), 2-ethylhexylamine (1.4 mL, 8.5 mmol), o-xylene (6 mL), and propionic acid (2 mL) was stirred at 140° C. for 1 h. After cooling to room temperature, methanol (10 mL) was added to the reaction mixture and the resulting precipitate was collected by filtration, washed with methanol, and dried in vacuum leading to the crude product as a red solid (0.81 g). Further purification was carried out by column chromatography on silica gel using a mixture of chloroform:hexane (5:1, v/v) as eluent, affording a slightly yellow solid as the product (0.61 g, 0.94 mmol, yield 24.4%).
$^1$H NMR (CDCl$_3$, 500 MHz): δ 9.01 (s, 2H), 4.10-4.25 (m, 4H), 19.4-1.97 (m, 2H), 1.20-1.40 (m, 16H), 0.87-1.03 (m, 12H). $^{13}$C NMR (CDCl$_3$, 125 MHz): δ 161.4, 161.2, 139.4, 128.6, 127.9, 125.5, 124.3, 45.3, 38.0, 30.8, 28.7, 24.2, 23.3, 14.3, 10.8.

Preparation of copolymer P(NDI2EH-T2)

Under argon, a mixture of NDI2EH-Br$_2$ (above, 98 mg, 0.15 mmol), 5,5'-bis(trimethylstannyl)-2,2'-bithiophene (74 mg, 0.15 mmol), and Pd(PPh$_3$)$_2$Cl$_2$ (3.5 mg, 0.005 mmol) in anhydrous toluene (5 mL) was stirred at 90° C. for 4 days. Bromobenzene (0.3 mL) was then added to the reaction and the resulting mixture was stirred for an additional 12 hours. After cooling to room temperature, a solution of potassium fluoride (1.2 g) in water (2.5 mL) was added. This mixture was stirred at room temperature for 2 hours and the precipitate was collected by filtration. The solid was taken with a small amount of chloroform, methanol was added, and the solid collected by filtration. This procedure was repeated using chloroform and acetone, leading to a deep blue solid as the crude product. This crude product was purified by Soxhlet extraction with acetone for 24 hours (80 mg, yield 80.7%).
$^1$H NMR (CDCl$_3$, 500 MHz): δ 8.82 (br, 2H), 7.35 (br, 4H), 4.15 (br, 4H), 1.97 (br, 2H), 1.18-1.70 (m, br, 16H). 0.80-1.12 (m, br, 12H). Elemental Analysis (calc. C, 69.91; H, 6.18; N, 4.29). found C, 69.63; H, 5.66; N, 3.71.

Example 1B. Preparation of poly{[N,N'-bis(2-ethylhexyl)-1,4,5,8-naphthalene diimide-2,6-diyl]-alt-2,5-thiophene} [P(NDI2EH-T1)]

Preparation of Copolymer P(NDI2EH-T1)

Under argon, a mixture of NDI2EH-Br$_2$ (Example 1A, 84 mg, 0.13 mmol), 2,5-bis(trimethylstannyl)thiophene (53 mg, 0.13 mmol), and Pd(PPh$_3$)$_2$Cl$_2$ (3.0 mg, 0.004 mmol) in anhydrous toluene (5 mL) was stirred at 90° C. for 4 days. Bromobenzene (0.3 mL) was then added and the resulting mixture was stirred at 90° C. for an additional 12 hours. Upon cooling to room temperature, a solution of potassium fluoride (1.2 g) in water (2.5 mL) was added. This mixture was stirred at room temperature for 2 hours and the precipitate collected by filtration. The solid was taken with a small amount of chloroform, methanol was added, and the resulting solid collected by filtration. This procedure was repeated using chloroform and acetone, leading to a deep blue solid as the crude product (20.0 mg, yield 20.7%). Elemental Analysis (calc. C, 71.55; H, 6.71; N, 4.91). found C, 71.59; H, 6.00; N, 4.56.

Example 1C. Preparation of Poly{[N,N'-bis(2-octyldodecyl)-1,4,5,8-naphthalene diimide-2,6-diyl]-alt-5,5'-(2,2'-bithiophene)} [P(NDI2OD-T2)]

Preparation of 1-iodo-2-octyldodecane

Iodine (12.25 g, 48.3 mmol) was added to a solution of 2-octyl-1-dodecanol (12.42 g, 41.6 mmol), triphenylphosphine (13.17 g, 50.2 mmol), and imidazole (3.42 g, 50.2 mmol) in 80 mL dichloromethane at 0° C. After stirring for 30 min, the reaction mixture was allowed to warm to room temperature over 4 h before 12 mL of saturated Na$_2$SO$_3$ (aq) was added. The organics were concentrated by evaporation and the mixture taken up in 500 mL pentane, washed three times with 200 mL water, and once with 150 mL brine. The mixture was then passed through a 3 cm silica gel plug, and dried over Na$_2$SO$_4$. The organics were concentrated by evaporation to give a colorless oil (15.78 g, yield 92.9%).
$^1$H NMR (CDCl$_3$ 500 MHz): δ: 2.60 (d, J=5.0 Hz, 2H), 2.00 (t, J=5.0 Hz, 1H), 1.30-1.20 (b, 32H), 0.89 (t, J=7.5 Hz, 6H); MS (EI): m/z (%) 408.23 (100) [M$^+$]. Elemental Analysis (calc. C, 58.81; H, 10.12). found C, 58.70; H, 9.97.

Preparation of 2-octyldodecylamine

1-Iodo-2-octyldodecane (5.90 g, 14.5 mmol) and potassium phthalimide (2.94 g, 15.9 mmol) were dissolved in 25 mL of DMF and vigorously stirred for 72 h at 25° C. The reaction mixture was poured into 200 mL of pentane, and washed four times with 100 mL water. The mixture was then passed through a 3 cm silica gel plug, and concentrated to give a colorless oil. The oil was next dissolved in 150 mL of ethanol, and 4 mL of hydrazine hydrate were added leading to a mixture which was refluxed overnight. The resulting precipitates were collected by filtration, dissolved in 100 mL water, and the solution was made alkaline by addition of 6 M NaOH (aq). The resulting mixture was dissolved in 200 mL pentane, washed four times with 100 mL water, once with 70 mL brine, dried over MgSO$_4$, and concentrated to give a colorless oil (3.08 g, 72% yield).
$^1$H NMR (CDCl$_3$ 500 MHz): δ: 2.60 (d, J=5.0 Hz, 2H), 2.00 (t, J=5.0 Hz, 1H), 1.30-1.20 (b, 32H), 0.89 (t, J=7.5 Hz, 6H); MS (EI): m/z (%) 297.34 (100) [M$^+$]. Elemental Analysis (calc. C, 80.73; H, 14.57). found C, 80.78; H, 14.52.

Preparation of N,N'-bis(2-octyldodecyl)-2,6-dibromonaphthalene-1,4,5,8-bis(dicarboximide) (NDI2OD-Br$_2$)

A mixture of NDA-Br$_2$ (Example 1A, 2.34 g, 5.49 mmol), 2-octyldodecylamine (4.10 g, 13.78 mmol), o-xylene (18 mL), and propionic acid (6 mL) was stirred at 140° C. for 1 h. Upon cooling to room temperature, most of the solvent was removed in vacuo, and the residue was purified by a column chromatography on silica gel with a mixture of chloroform:hexane (1:1, v/v) as the eluent, affording a slightly yellow solid as the product (1.98 g, 2.01 mmol, yield 36.7%).

$^1$H NMR (CDCl$_3$ 500 MHz): δ: 8.95 (s, 2H), 4.12 (d, J=7.5 Hz, 4H), 1.97 (m, 2H), 1.20-1.40 (m, 64H), 0.84-0.89 (m, 12H). $^{13}$C NMR (CDCl$_3$, 125 MHz): δ: 161.3, 161.1, 139.3, 128.5, 127.8, 125.4, 124.2, 45.6, 36.6, 32.1, 32.0, 31.7, 30.2, 29.9, 29.8, 29.7, 29.6, 29.5, 26.5, 22.9, 22.8, 14.3. Elemental Analysis (calc. C, 65.84; H, 8.60; N, 2.84). found C, 65.68; H, 8.60; N, 2.89.

Preparation of Copolymer P(NDI2OD-T2)

Under argon, a mixture of NDI-2OD-Br$_2$ (95 mg, 0.096 mmol), 5,5'-bis(trimethylstannyl)-2,2'-bithiophene (48 mg, 0.096 mmol), and Pd(PPh$_3$)$_2$Cl$_2$ (3.5 mg, 0.005 mmol) in anhydrous toluene (5 mL) was stirred at 90° C. for 4 days. Bromobenzene (0.2 mL) was then added and the reaction mixture was maintained at 90° C. for an additional 12 hours. Upon cooling to room temperature, a solution of potassium fluoride (1 g) in water (2 mL) was added. This mixture was stirred at room temperature for 2 hours before it was extracted with chloroform (60 mL×2). Organic layers were combined, washed with water (50 mL×2), dried over anhydrous sodium sulfate, and concentrated on a rotary evaporator. The residue was taken with a small amount of chloroform and precipitated in methanol and acetone in sequence. The obtained blue solid product was purified by Soxhlet extraction with acetone for 48 hours. The remaining solid residue was redissolved in chloroform (50 mL) and the resulting mixture was heated to boil. Upon cooling to room temperature, the chloroform solution was filtered through a 5 μm filter, and the filtrate was added slowly to methanol (50 mL). The precipitates were collected by filtration, washed with methanol, and dried in vacuum, leading to a deep blue solid as the product (88.0 mg, yield 92.1%).

$^1$H NMR (CDCl$_3$ 500 MHz): δ: 8.53-8.84 (m, br, 2H), 7.20-7.48 (br, 4H), 4.13 (s, br, 2H), 2.00 (s, br, 4H), 1.05-1.30 (s, br, 64H), 0.87 (s, br, 12H). GPC: M$_n$=47.8K Da, M$_w$=264.4K Da, PDI=5.53. Elemental Analysis (calc. C, 75.26; H, 8.96; N, 2.83, Br, 0.00). found C, 75.22; H, 9.01; N, 2.77, Br, 0.00. FIG. 6 shows a representative GPC chromatogram of P(NDI2OD-T2).

Example 10: Preparation of Poly{[N,N'-bis(1-methylhexyl)-1,4,5,8-naphthalene diimide-2,6-diyl]-alt-5, 5'-(2,2'-bithiophene)} [P(NDI1MH-T2)]

Preparation of N,N'-bis(1-methylhexyl)-2,6-dibromonaphthalene-1,4,5,8-bis(dicarboximide) (NDI1MH-Br$_2$)

A mixture of NDA-Br$_2$ (Example 1A, 2.42 g, 5.68 mmol), 1-methylhexylamine (2.5 mL, 16.55 mmol), propionic acid (12 mL), and o-xylene (36 mL) was stirred under argon at 140° C. for 17 hours. Upon cooling to room temperature, solvents were removed in vacuo and the residue was subject to a column chromatography on silica gel using a mixture of CHCl$_3$:hexane (1:1, v/v) as the eluent, leading to slightly yellow solid as the product (0.24 g, 0.39 mmol, yield 6.9%).

$^1$H NMR (CDCl$_3$, 500 MHz): δ 8.96 (s, 2H), 5.24 (m, 2H), 2.13 (m, 2H), 1.94 (m, 2H), 1.56 (d, J=7.0 Hz, 6H), 1.10-1.40 (m, 12H), 0.81-0.86 (t, J=7.0 Hz, 6H). $^{13}$C NMR (CDCl$_3$, 125 MHz): δ: 161.3, 161.3, 139.3, 128.3, 127.8, 125.7, 124.5, 51.5, 33.5, 31.8, 26.9, 22.7, 18.3, 14.2.

Preparation of Copolymer P(NDI1MH-T2)

Under argon, a mixture of NDI1MH-Br$_2$ (above, 151 mg, 0.24 mmol), 5,5'-bis(trimethylstannyl)-2,2'-bithiophene (120 mg, 0.24 mmol), and Pd(PPh$_3$)$_2$Cl$_2$ (6.5 mg, 0.009 mmol) in anhydrous toluene (12 mL) was stirred at 90° C. for 24 hours. Bromobenzene (0.2 mL) was then added and the reaction mixture was maintained at 90° C. for an additional 12 hours. Upon cooling to room temperature, the reaction mixture was added slowly to methanol (50 mL) and the resulting mixture was stirred at room temperature for 10 mins. The precipitates were collected by filtration and washed with methanol. The isolated solid was then taken with chloroform (30 mL) and sonicated for 5 mins. A solution of potassium fluoride (4 g) in water (8 mL) was added, and this mixture was vigorously stirred at room temperature for 1 hour. The mixture was then diluted with chloroform (100 mL), and washed with water (100 mL×2). The organic layer was concentrated on rotary evaporator. The residue was taken with chloroform (30 mL), followed by sonication for 5 mins. This mixture was precipitated in methanol (150 mL), leading to deep blue precipitates, which were collected by filtration, washed with methanol, and dried in a vacuum (143 mg, yield 94%). Further purification involved Soxhlet extraction with acetone and then another precipitation in methanol.

$^1$H NMR (CDCl$_3$, 500 MHz): δ 8.70-8.82 (br, 2H), 7.05-7.73 (m, br, 3H), 6.64 (br, 1H), 5.15-5.50 (m, br, 2H), 0.71-2.43 (m, br, 28H).

Example 1E. Preparation of poly{[N,N'-bis(2-octyldodecyl)-1,4,5,8-naphthalene diimide-2,6-diyl]-alt-5,5'''-(quarterthiophene)} [P(NDI2OD-T4)]

Preparation of N,N'-bis(2-octyldodecyl)-2,6-bis(2-thienyl)naphthalene-1,4,5,8-bis(dicarboximide) (NDI2OD-T1)

Under argon, a mixture of NDI2OD-Br$_2$ (Example 1A, 280.0 mg, 0.28 mmol), 2-trimethylstannylthiophene (400.0 mg, 1.62 mmol), Pd(PPh$_3$)$_2$Cl$_2$ (28.0 mg, 0.04 mmol) in anhydrous toluene (20 mL) was stirred at 90° C. for 22 h. Upon cooling to room temperature, the reaction mixture was diluted with chloroform (100 mL), and the resulting mixture was washed with water (80 mL×2), dried over anhydrous sodium sulfate (Na$_2$SO$_4$), and concentrated on rotary evaporator. The residue was subject to column chromatography on silica gel with a mixture of chloroform:hexane (3:2, v/v) as eluent, leading to an orange solid as the product (240.0 mg, 0.24 mmol, 85.2%).

$^1$H NMR (CDCl$_3$ 500 MHz): δ: 8.77 (s, 2H), 7.57 (d, J=5.0 Hz, 2H), 7.31 (d, J=3.5 Hz, 2H), 7.21 (m, 2H), 4.07 (d, J=7.5 Hz, 4H), 1.95 (m, 2H), 1.18-40 (m, br, 64H), 0.84-0.88 (m, 12H); $^{13}$C NMR (CDCl$_3$, 125 MHz): δ: 162.8, 162.6, 141.1, 140.4, 136.8, 128.4, 128.2, 127.7, 127.6, 125.6, 123.6, 45.0, 36.6, 32.1, 31.7. 30.2, 29.9, 29.8, 29.7, 29.6, 29.5, 26.6, 22.9, 14.4, 14.3.

Preparation of N,N'-bis(2-octyldodecyl)-2,6-bis(5-bromo-2-thienyl)naphthalene-1,4,5,8-bis(dicarboximide) (NDI2OD-BrT1)

Under argon, a mixture of NDI2OD-T1 (200.0 mg, 0.20 mmol) and NBS (125.0 mg, 0.70 mmol) in DMF (20 mL) was stirred at 80° C. for 25 h. Upon cooling to room temperature, the reaction mixture was poured into water (100 mL), and the resulting mixture was extracted with chloroform (100 mL). The organic layer was separated, washed with water (100 mL×2), dried over anhydrous $Na_2SO_4$, and concentrated on rotary evaporator. The residue was subject to column chromatography on silica gel with a mixture of chloroform:hexane (2:3, v/v, slowly up to 1:1) as eluent, leading to a red solid as the product (145.0 mg, 0.13 mmol, 62.5%).

$^1$H NMR (CDCl$_3$, 500 MHz): δ: 8.73 (s, 2H), 7.15 (d, J=4.0 Hz, 2H), 7.09 (d, J=4.0, 2H), 4.08 (d, J=7.5 Hz, 4H), 1.93-1.98 (m, 2H), 1.20-1.40 (br, m, 64H), 0.83-0.89 (m, 12H).

Elemental Analysis (calc. C, 64.79; H, 7.72; N, 2.44). found C, 64.50; H, 7.74; N, 2.49.

Preparation of Copolymer P(NDI2OD-T4)

Under argon, a mixture of NDI2OD-BrT1 (92.1 mg, 0.08 mmol), 5,5'-bis(trimethylstannyl)-2,2'-bithiophene (39.4 mg, 0.08 mmol), and Pd(PPh$_3$)$_2$Cl$_2$ (2.8 mg, 0.004 mmol) in anhydrous toluene (5 mL) was stirred at 90° C. for 4 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous $Na_2SO_4$, and concentrated on rotary evaporator. The residue was taken with chloroform (30 mL) and precipitated in methanol (50 mL). This procedure was repeated using chloroform and acetone, leading to a dark blue solid as crude product. This crude product was purified by Soxhlet extraction with acetone for 48 hours. The isolated solid was dissolved in chloroform (50 mL) and then heated to boil. After cooling to room temperature, the chloroform solution was passed through a syringe filter (5 μm), and the filtrate was precipitated in methanol (50 mL). The precipitates were collected by filtration, washed with methanol, and dried in vacuum, leading to a dark blue solid (87.0 mg, 94.1%).

$^1$H NMR (CDCl$_2$CDCl$_2$, 500 MHz): δ: 8.70-8.81 (m, br, 2H), 7.10-7.40 (m, br, 8H), 4.10 (br, 4H), 1.99 (s, br, 2H), 1.10-1.45 (m, br, 64H), 0.86 (m, br, 12H). GPC: $M_n$=67.4K Da, $M_w$=170.3K Da, PDI=2.5. Elemental Analysis (calc. C, 72.87; H, 8.04; N, 2.43). found C, 72.69; H, 8.06; N, 2.47.

Example 1F. Preparation of Poly{[N,N'-bis(2-octyldodecyl)-1,4,5,8-naphthalene diimide-2,6-diyl]-alt-5,5'-(2,2'-bithiazole)} [P(NDI2OD-TZ2)]

Preparation of Copolymer P(NDI2OD-TZ2)

Under argon, a mixture of NDI2OD-Br$_2$ (Example 1A, 235 mg, 0.239 mmol), 5,5'-bis(trimethylstannyl)-2,2'-bithiazole (118 mg, 0.239 mmol), and Pd(PPh$_3$)$_2$Cl$_2$ (7.0 mg, 0.010 mmol) in anhydrous toluene (12 mL) was stirred at 90° C. for 3 days. Bromobenzene (0.3 mL) was then added and the resulting mixture was stirred for an additional 12 hours. After cooling to room temperature, a solution of potassium fluoride (2 g) in water (4 mL) was added. This mixture was stirred and shaken at room temperature for 1 hour, before it was diluted with chloroform (150 mL). The resulting mixture was washed with water (100 mL×3), dried over anhydrous $Na_2SO_4$, and concentrated on a rotary evaporator. The residue was taken with chloroform (50 mL) and precipitated in methanol (100 mL). This procedure was repeated using chloroform and acetone, leading to a dark red solid as the crude product. This crude product was purified by Soxhlet extraction with acetone for 72 hours. The isolated solid was dissolved in chloroform (80 mL) and then heated to boil. Upon cooling to room temperature, this chloroform solution was passed through a syringe filter (5 μm), and the filtrate was precipitated in methanol (80 mL). The precipitates were collected by filtration, washed with methanol, and dried in vacuum, leading to a dark red solid (222 mg, 93.7%).

$^1$H NMR (CDCl$_3$, 500 MHz): δ: 7.71 (m, br, 2H), 7.54 (m, br, 2H), 4.20-4.25 (m, br, 4H), 1.69 (m, br, 2H), 1.15-1.50 (m, br, 64H) 0.80-0.95 (m, br, 12H). Elemental Analysis (calc. C, 72.68; H, 8.74; N, 5.65). found C, 72.07; H, 8.61; N, 5.56.

Example 1G. Preparation of Poly{[N,N'-bis(2-octyldodecyl)-1,4,5,8-naphthalene diimide-2,6-diyl]-alt-5,5-(4',7'-di-2-thienyl-2',1',3'-benzothiadiazole)} [P(NDI2OD-TBT)]

Preparation of Copolymer P(NDI2OD-TBT) (Suzuki Coupling Reaction)

Under argon, a mixture of N,N'-bis(2-octyldodecyl)-2,6-bis(5'-bromo-2'-thienyl)naphthalene-1,4,5,8-bis(dicarboximide) (NDI2OD-BrT1) (Example 1E, 85.0 mg, 0.074 mmol), 4,7-bis(4,4,5,5-tetramethyl-1,3,2-dioxaborolan-2-yl)-2,1,3-benzothiadiazole (28.7 mg, 0.074 mmol), potassium carbonate (81.0 mg, 0.586 mmol), and Pd(PPh$_3$)$_4$ (1.8 mg, 0.002 mmol) in anhydrous toluene (4 mL) and DMF (2 mL) was stirred at 100° C. for 3 days. Bromobenzene (0.3 mL) was then added and the resulting mixture was stirred for an additional 12 hours. After cooling to room temperature, the reaction mixture was poured into methanol (200 mL), and the resulting mixture was stirred at room temperature for 15 mins. The precipitates were collected by filtration, washed with methanol, and dried in vacuum, leading a dark solid as the product (62.0 mg, 74.6%).

Elemental Analysis (calc. C, 72.68; H, 8.07; N, 4.99). found C, 72.41; H, 7.90; N, 5.00.

Preparation of Copolymer P(NDI2OD-TBT) (Stille Coupling Reaction)

Under argon, a mixture of NDI2OD-Br$_2$ (Example 1A, 84.3 mg, 0.086 mmol), 5,5-bis(trimethylstannyl)-4',7'-di-2-thienyl)-2',1',3'-benzothiadiazole (53.6 mg, 0.086 mmol), and Pd(PPh$_3$)$_2$Cl$_2$ (2.5 mg, 0.004 mmol) in anhydrous toluene (6.5 mL) was stirred at 90° C. for 3 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous $Na_2SO_4$, and concentrated on a rotary evaporator. The residue was taken with chloroform (50 mL) and precipitated in methanol (100 mL). This procedure was repeated using chloroform and acetone, leading to a dark solid as the crude product (58.0 mg, 60.3%).

Example 1H. Preparation of Poly{[N,N'-bis(2-octyldodecyl)-1,4,5,8-naphthalene diimide-2,6-diyl]-alt-5,5-(1',4'-di-2-thienyl-2',3',5',6'-tetrafluorobenzene)} [P(NDI2OD-TFBT)]

Preparation of Copolymer P(NDI2OD-TFBT)

Under argon, a mixture of NDI2OD-BrT1 (Example 1E, 94.3 mg, 0.082 mmol), 1,4-bis(trimethylstannyl)-2,3,5,6- tetrafluorobenzene (39.0 mg, 0.082 mmol), and Pd(PPh$_3$)$_2$Cl$_2$ (1.8 mg, 0.003 mmol) in anhydrous toluene (6 mL) was stirred at 90° C. for 4 days. Bromobenzene (0.3 mL) was then added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (150 mL). The resulting mixture was washed with water (100 mL×3), dried over anhydrous Na$_2$SO$_4$, and concentrated on a rotary evaporator. The residue was taken with chloroform (20 mL) and precipitated in methanol (50 mL). The precipitates were collected by filtration, washed with methanol, and dried in vacuum, leading to a purple/blue solid as the product (134 mg, yield 94.4%).

$^1$H NMR (CDCl$_3$, 500 MHz): δ: 8.72-8.75 (m, 2H), 7.14-7.16 (m, 2H), 7.09-7.11 (m, 2H), 4.08 (m, 4H), 1.96 (s, br, 2H), 1.15-1.45 (m, br, 64H) 0.80-0.92 (m, br, 12H). Elemental Analysis (calc. C, 71.80; H, 7.80; N, 2.48). found C, 69.73; H, 8.56; N, 1.83.

Example 1I. Preparation of Poly{[N,N'-bis(2-octyldodecyl)-1,4,5,8-naphthalene diimide-2,6-diyl]-alt-5,5'-(1,2-bis(2'-thienyl)vinyl)} [P(NDI2OD-TVT)]

Preparation of Copolymer P(NDI2OD-TVT)

Under argon, a mixture of NDI2OD-Br$_2$ (86.5 mg, 0.088 mmol), 5,5'-bis(trimethylstannyl)-(1,2-bis(2'-thienyl)vinyl (45.5 mg, 0.088 mmol), and Pd(PPh$_3$)$_2$Cl$_2$ (3.1 mg, 0.004 mmol) in anhydrous toluene (7 mL) was stirred at 90° C. for 3 days. Bromobenzene (0.3 mL) was then added and the resulting mixture was stirred for an additional 12 hours. After cooling to room temperature, a solution of potassium fluoride (1.5 g) in water (3 mL) was added. This mixture was stirred and shaken at room temperature for 1 hour, before it was diluted with chloroform (150 mL). The resulting mixture was washed with water (80 mL×3), dried over anhydrous Na$_2$SO$_4$, and concentrated on a rotary evaporator. The residue was taken with chloroform (50 mL) and precipitated in methanol (100 mL). The precipitate was collected by filtration and redissolved in chloroform (50 mL). This chloroform solution was precipitated again in acetone (100 mL), leading to a deep blue solid as the crude product. This crude product was purified by Soxhlet extraction with acetone for 48 hours. The isolated solid was dissolved in chloroform (60 mL) and then heated to boil. Upon cooling to room temperature, the chloroform solution was passed through a syringe filter (5 μm), and the filtrate was precipitated in methanol (60 mL). The precipitate was collected by filtration, washed with methanol, and dried in vacuum, leading to a blue solid (84.0 mg, 94.2%).

$^1$H NMR (CDCl$_2$CDCl$_2$, 500 MHz): δ: 8.79 (br, 2H), 7.33 (br, 2H), 7.20 (br, 4H), 4.10 (br, 4H), 2.00 (br, 2H), 1.20-1.60 (br, 64H), 0.80-91 (br, 12H). GPC: M$_n$=185.6 K Da, M$_w$=713.0 K Da, PDI=3.8. Elemental Analysis (calc. C, 75.69; H, 8.93; N, 2.76). found C, 75.42; H, 8.79; N, 2.84.

Example 1K. Preparation of Poly{[N,N'-bis(2-octyldodecyl)-1,4,5,8-naphthalene diimide-2,6-diyl]-alt-5,5'-[2,6-bis(2'-thienyl)naphthalene]} [P(NDI2OD-TNT)]

Preparation of Copolymer P(NDI2OD-TNT)

Under argon, a mixture of N,N-bis(2-octyldodecyl)-2,6-bis(2'-(5'-bromothienyl))naphthalene-1,4,5,8-bis(dicarboximide) (39.1 mg, 0.034 mmol), 2,6-bis(trimethylstannyl)naphthalene (15.4 mg, 0.034 mmol), and Pd(PPh$_3$)$_2$Cl$_2$ (1.2 mg, 0.002 mmol) in anhydrous toluene (4 mL) was stirred at 90° C. for 2 days. Bromobenzene (0.3 mL) was then added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (100 mL). The resulting mixture was washed with water (80 mL×3), dried over anhydrous Na$_2$SO$_4$, and concentrated on a rotary evaporator. The residue was taken with THF (5 mL) and precipitated in methanol (75 mL). The precipitate was collected by filtration, washed with methanol, and dried in vacuum, leading to a blue solid, which was further purified by Soxhlet extraction with methanol for 72 hours. The isolated solid residue was redissolved in THF (2 mL), and the resulting solution was passed through a syringe filter (5 μm). The filtrate was precipitated in methanol (70 mL). The precipitate was collected by filtration, washed with methanol, and dried in vacuum, leading to a blue solid as the product (33.2 mg, yield 87.5%).

$^1$H NMR (CDCl$_2$CDCl$_2$, 500 MHz): δ: 8.80-8.90 (m, br, 2H), 6.83-8.20 (m, br, 10H), 4.11 (s, br, 4H), 2.02 (br, 2H), 1.10-1.50 (br, 64H) 0.76-0.92 (br, 12H). Elemental Analysis (calc. C, 77.51; H, 8.49; N, 2.51). found C, 76.89; H, 8.65; N, 2.16.

Example 1L. Preparation of Poly{[N,N'-bis(2-octyldodecyl)-1,4,5,8-naphthalene diimide-2,6-diyl]-alt-5,5'-(1,1'-dimethyl-2,2'-bipyrrole)} [P(NDI2OD-Py2)]

Preparation of N,N'-bis(2-octyldodecyl)-2,6-bis(1-methyl-1H-pyrrol-2-yl)naphthalene-1,4,5,8-bis(dicarboximide) (NDI2OD-Py)

Under argon, a mixture of NDI2OD-Br$_2$ (489.7 mg, 0.50 mmol), 1-methyl-2-trimethylstannylpyrrole (736.1 mg, 1.99 mmol), Pd(PPh$_3$)$_2$Cl$_2$ (35.0 mg, 0.050 mmol) in anhydrous toluene (35 mL) was stirred at 90° C. for 48 h. Upon cooling to room temperature, the reaction mixture was poured into water (100 mL), and the resulting mixture was extracted with chloroform (100 mL×2). The combined organic layers were washed with water (100 mL×2), dried over anhydrous sodium sulfate (Na$_2$SO$_4$), and concentrated on rotary evaporator. The residue was subject to column chromatography on silica gel with a mixture of chloroform:hexane (3:2, v/v) as eluent, leading to a purple/blue solid as the product (450.0 mg, 0.457 mmol, 91.9%).

$^1$H NMR (CDCl$_3$ 500 MHz): δ: 8.77 (s, 2H), 6.91 (m, 2H), 6.38 (m, 4H), 4.08 (d, J=7.0 Hz, 4H), 3.41 (s, 6H), 1.98 (m, 2H), 1.16-1.40 (m, br, 64H), 0.83-0.90 (m, 12H); $^{13}$C NMR (CDCl$_3$ 125 MHz): δ: 163.1, 162.6, 137.7, 137.4, 132.3, 127.4, 125.5, 125.0, 123.2, 110.7, 109.1, 45.2, 36.6, 34.6, 32.1, 31.7. 30.3, 29.9, 29.8, 29.7, 29.6, 29.5, 26.6, 22.9, 14.3.

Preparation of Copolymer P(NDI2OD-Py2)

Under argon, a solution of NDI2OD-Py (70.0 mg, 0.071 mmol) in anhydrous chlorobenzene (3.5 mL) was added dropwise to a suspension of FeCl$_3$ (65 mg, 0.40 mmol) in chlorobenzene (2.5 mL). The resulting mixture was warmed to 65° C. and maintained at this temperature for 48 h. Upon cooling to room temperature, additional chlorobenzene (10 mL) was added to the reaction mixture, which was then precipitated in methanol (100 mL). This mixture was sonicated for 10 mins and filtered to collect a black solid, which was washed thoroughly with methanol and dried in vacuum (28.2 mg, 40.4%).

Example 2: Characterization of Polymers

P(NDI2OD-T2) was purified by multiple dissolution-precipitation procedures and was fully characterized by elemental analysis, GPC measurements ($M_w$=~265 k, PD=5.5), and $^1$H NMR spectroscopy. The room temperature solubilities of this polymer in conventional organic solvents such as xylene, dichlorobenzene (DCB), $CHCl_3$ and other chlorinated hydrocarbons (CHCs) was found to be as high as 60 g/L. Differential scanning calorimetry (DSC) of P(NDI2OD-T2) exhibits no thermal transitions up to ~300° C.

To investigate the redox properties of the new polymers, cyclic voltammetry experiments were performed on P(NDI2OD-T2), P(NDI1MH-T2), P(NDI2EH-T2), P(NDI2EH-T1), P(NDI1MH-T2), P(NDI2OD-TZ2), and P(NDI2OD-T4), using a THF-$(NBu)_4PF_6$ solvent-electrolyte solution, Pt as the working electrode, silver as the pseudo reference electrode and ferrocene (0.54 V vs SCE) as the internal standard. The Pt working electrode was coated with a thin polymer film by drop-casting a $CHCl_3$ solution. Cyclic voltammograms as well as exemplary redox potential data are given in WO 2009/098253 A1 (see FIGS. 1-3 and Tables 1a and 1b of WO 2009/098253 A1).

For all polymers, two semi-reversible reductions but no oxidation were observed, suggesting that all polymers are intrinsically n-dopable. Analysis of the half-wave potentials reveals the importance of naphthalene imide functionalization of the polymer backbone in modulating the reduction behavior, hence the LUMO energies. The first and second reduction potentials of these polymers are located at ~0.5 V and ~1 V, respectively, independent of the N-alkyl functionalization and co-monomer type. These values are among the lowest recorded for semiconducting polymers, approaching, for example, those of strongly electron-depleted core-cyanated rylenes. These values also support the stability of the corresponding transistor under ambient conditions.

With regard to thin-film polymer optical absorption spectra of the polymers and potential device setups (except for the at least one intermediate layers and its preparation), as well as with regard to device characterization including measurement of charge carrier mobility, reference may be made to WO 2009/098253 A1.

LIST OF REFERENCE NUMERALS 110 organic semiconductor device
112 substrate
114 electrode
116 source electrode
118 drain electrode
120 intermediate layer
122 organic semiconducting material
124 insulating layer
126 gate electrode
128 organic thin-film transistor
210 $I_{SD}$ for samples without intermediate layer
212 $I_{SD}$ for samples with ABT intermediate layer
214 $I_{SD}$ for samples with MBT intermediate layer
216 gate leakage current of samples without intermediate layer
218 gate leakage current of samples with ABT intermediate layer
220 gate leakage current of samples with MBT intermediate layer
222 $I_{SD}$ for samples without intermediate layer
224 $I_{SD}$ for samples with ABT intermediate layer
226 $I_{SD}$ for samples with PFBT intermediate layer

The invention claimed is:
1. A method for producing an organic semiconductor device comprising an n-channel transistor said organic semiconductor device having at least one organic semiconducting material and at least two electrodes adapted to support an electric charge carrier transport through the organic semiconducting material, wherein the organic semiconducting material is at least one polymer selected from a polymer of the formula

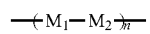

wherein:
$M_1$ is an optionally substituted naphthalene imide selected from:

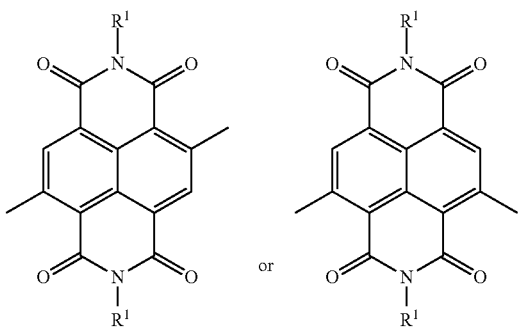

$R^1$, at each occurrence, is independently selected from H, a $C_{1-40}$ alkyl group, a $C_{2-40}$ alkenyl group, a $C_{1-40}$ haloalkyl group, and 1-4 cyclic moieties,
wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;
each of the $C_{1-40}$ alkyl group, the $C_{2-40}$ alkenyl group, and the $C_{1-40}$ haloalkyl group can be covalently bonded to the imide nitrogen atom via an optional linker; and
each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —$NH_2$, —NH($C_{1-20}$ alkyl), —N ($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N ($C_{1-20}$ alkyl)$_2$, —$SiH_3$, —SiH($C_{1-20}$ alkyl)$_2$, —$SiH_2$ ($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group;

$M_2$ is a repeating unit comprising one or more monocyclic moieties; and n is an integer between 2 and 5,000, wherein $M_2$ is selected from:

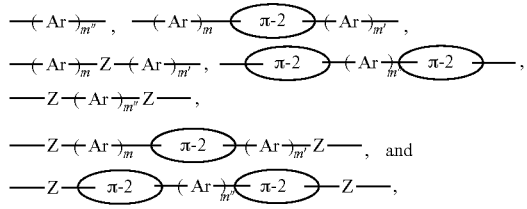

wherein:

π-2 is a polycyclic moiety optionally substituted with 1-6 $R^e$ groups;

Ar, at each occurrence, is independently a 5- or 6-membered aryl or heteroaryl group, wherein each of these groups optionally is substituted with 1-6 $R^e$ groups; wherein:

$R^e$, at each occurrence, is independently a) halogen, b) —CN, c) —$NO_2$, d) oxo, e) —OH, f) =$C(R^f)_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —$NO_2$, d) oxo, e) —OH, f) —$NH_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —$S(O)_wH$, l) —$S(O)_w$—$C_{1-20}$ alkyl, m) —$S(O)_2OH$, n) —$S(O)_w$—$OC_{1-20}$ alkyl, o) —$S(O)_w$—$OC_{6-14}$ aryl, p) —CHO, q) —C(O)—$C_{1-20}$ alkyl, r) —C(O)—$C_{6-14}$ aryl, s) —C(O)OH, t) —C(O)—$OC_{1-20}$ alkyl, u) —C(O)—$OC_{6-14}$ aryl, v) —C(O)$NH_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)$NH_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —$S(O)_wNH_2$, ai) —$S(O)_wNH(C_{1-20}$ alkyl), aj) —$S(O)_wN(C_{1-20}$ alkyl)$_2$, ak) —$S(O)_wNH(C_{6-14}$ aryl), al) —$S(O)_wN(C_{1-20}$ alkyl)-$C_{6-14}$ aryl, am) —$S(O)_wN(C_{6-14}$ aryl)$_2$, an) —$SiH_3$, ao) —$SiH(C_{1-20}$ alkyl)$_2$, ap) —$SiH_2(C_{1-20}$ alkyl), aq) —$Si(C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-2}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is independently selected from a divalent $C_{1-6}$ alkyl group, a divalent $C_{1-6}$ haloalkyl group, and a covalent bond; and w is 0, 1, or 2;

Z is a conjugated linear linker; and m, m' and m'' independently are 1, 2, 3, or 4, and which intrinsically has ambipolar semiconducting properties, wherein the method comprises at least generating at least one intermediate layer which at least partially is interposed between the organic semiconducting material and at least one of the electrodes of the organic semiconductor device, wherein the intermediate layer comprises at least one thiol compound selected from the group consisting of: 1-Decanethiol; 4-Methylthiophenol; 4-(Methylthio)thiophenol; 3,4-Dimethoxythiophenol; 4-Phenylthiophenol; 2-Thionaphthol; 4-(Dimethylamino)thiphenol; Benzyl mercaptan; 2,3,4,5,6-Pentamethylbenzene-1-thiol, wherein by the intermediate layer an ambipolar charge carrier transport between the electrodes is suppressed in favor of a unipolar negative charge carrier transport having a difference between electron and hole mobilities of at least two orders of magnitude.

2. The method according to claim 1, wherein the thiol compound forms at least one self-assembled monolayer.

3. The method according to claim 1, the method further comprising providing at least one gate electrode, wherein the gate electrode is adapted to influence the electric charge carrier transport between the electrodes by an electric field.

4. The method according to claim 1, wherein the electrodes comprise a material selected from the group consisting of silver and gold.

5. The method according to claim 1, wherein the organic semiconducting material comprises at least one semiconducting polymer.

6. The method according to claim 1, wherein the organic semiconducting material is at least one polymer selected from a polymer of the formula

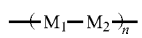

wherein $M_1$ is selected from:

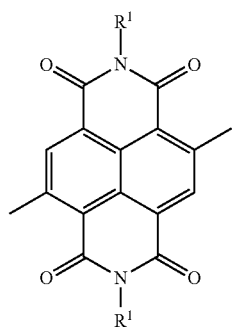 or 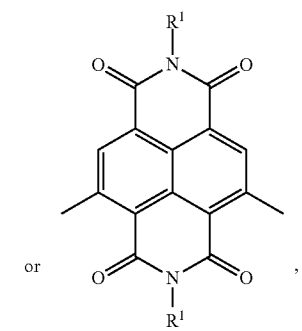

wherein R$^1$ is 2-octyldodecyl; and
M$_2$ is a polymer of the following formula:

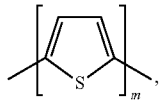

wherein m is selected from a number in the range of 2 to 50.

7. The method according to claim 1, wherein the intermediate layer is generated by processing from a solution comprising at least one solvent and the thiol compound.

8. The method according to claim 7, wherein the processing from the solution comprises at least one step of applying the solution onto at least one of the electrodes and at least one step of removing the solvent.

9. The method according to claim 1, wherein the unipolar negative charge carrier has a difference between electron and hole mobilities of three orders of magnitude or more.

10. The method according to claim 1, wherein the thiol compound is at least one selected from the group consisting of: 4-Methylthiophenol; 4-(Methylthio)thiophenol; 3,4-Dimethoxythiophenol; 4-Phenylthiophenol; 2-Thionaphthol; 4-(Dimethylamino)thiphenol; Benzyl mercaptan; 2,3,4,5,6-Pentamethylbenzene-1-thiol.

11. The method according to claim 1, wherein the thiol compound is at least one selected from the group consisting of: 4-Methylthiophenol and 4-(Dimethylamino)thiphenol.

12. An organic semiconductor device comprising an n-channel transistor said organic semiconductor device having at least one organic semiconducting material and at least two electrodes adapted to support an electric charge carrier transport through the organic semiconducting material, wherein the organic semiconducting material is at least one polymer selected from a polymer of the formula

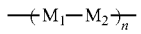

wherein:
M$_1$ is an optionally substituted naphthalene imide selected from:

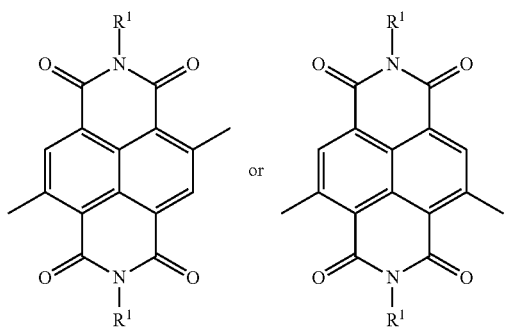

R$^1$, at each occurrence, is independently selected from H, a C$_{1-40}$ alkyl group, a C$_{2-40}$ alkenyl group, a C$_{1-40}$ haloalkyl group, and 1-4 cyclic moieties,
wherein:
each of the C$_{1-40}$ alkyl group, the C$_{2-40}$ alkenyl group, and the C$_{1-40}$ haloalkyl group can be optionally substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$;

each of the C$_{1-40}$ alkyl group, the C$_{2-40}$ alkenyl group, and the C$_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and can be optionally substituted with 1-5 substituents independently selected from a halogen, oxo, —CN, NO$_2$, OH, =C(CN)$_2$, —NH$_2$, —NH(C$_{1-20}$ alkyl), —N(C$_{1-20}$ alkyl)$_2$, —S(O)$_2$OH, —CHO, —C(O)OH, —C(O)—C$_{1-20}$ alkyl, —C(O)—OC$_{1-20}$ alkyl, —C(O)NH$_2$, —C(O)NH—C$_{1-20}$ alkyl, —C(O)N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, —O—C$_{1-20}$ alkyl, —O—C$_{1-20}$ alkenyl, —O—C$_{1-20}$ haloalkyl, a C$_{1-20}$ alkyl group, a C$_{1-20}$ alkenyl group, and a C$_{1-20}$ haloalkyl group;

M$_2$ is a repeating unit comprising one or more monocyclic moieties; and n is an integer between 2 and 5,000,
wherein M$_2$ is selected from:

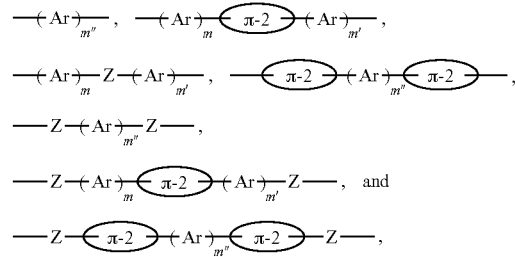

wherein:
π-2 is a polycyclic moiety optionally substituted with 1-6 R$^e$ groups;
Ar, at each occurrence, is independently a 5- or 6-membered aryl or heteroaryl group, wherein each of these groups optionally is substituted with 1-6 R$^e$ groups; wherein:
R$^e$, at each occurrence, is independently a) halogen, b) —CN, c) —NO$_2$, d) oxo, e) —OH, f) =C(R$^f$)$_2$, g) a C$_{1-40}$ alkyl group, h) a C$_{2-40}$ alkenyl group, i) a C$_{2-40}$ alkynyl group, j) a C$_{1-40}$ alkoxy group, k) a C$_{1-40}$ alkylthio group, l) a C$_{1-40}$ haloalkyl group, m) a —Y—C$_{3-10}$ cycloalkyl group, n) a —Y—C$_{6-14}$ aryl group, o) a —Y—C$_{6-14}$ haloaryl group, p) a —Y-3-12 membered cycloheteroalkyl group, or q) a —Y-5-14 membered heteroaryl group, wherein each of the C$_{1-40}$ alkyl group, the C$_{2-40}$ alkenyl group, the C$_{2-40}$ alkynyl group, the C$_{3-10}$ cycloalkyl group, the C$_{6-14}$ aryl group, the C$_{6-14}$ haloaryl group, the 3-12 membered cycloheteroalkyl group, and the 5-14 membered heteroaryl group is optionally substituted with 1-4 R$^f$ groups:
R$^f$, at each occurrence, is independently a) halogen, b) —CN, c) —NO$_2$, d) oxo, e) —OH, f) —NH$_2$, g)

—NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_w$—OC$_{1-20}$ alkyl, o) —S(O)$_w$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)-C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, is independently selected from a divalent C$_{1-6}$ alkyl group, a divalent C$_{1-6}$ haloalkyl group, and a covalent bond; and w is 0, 1, or 2;

Z is a conjugated linear linker; and m, m' and m" independently are 1, 2, 3, or 4, and which intrinsically has ambipolar semiconducting properties, wherein at least one intermediate layer at least partially is interposed between the organic semiconducting material and at least one of the electrodes of the organic semiconductor device, wherein the intermediate layer comprises at least one thiol compound selected from the group consisting of: 1-Decanethiol; 4-Methylthiophenol; 4-(Methylthio)thiophenol; 3,4-Dimethoxythiophenol; 4-Phenylthiophenol; 2-Thionaphthol; 4-(Dimethylamino)thiphenol; Benzyl mercaptan; 2,3,4,5,6-Pentamethylbenzene-1-thiol, wherein by the intermediate layer an ambipolar charge carrier transport between the electrodes is suppressed in favor of a unipolar negative charge carrier transport having a difference between electron and hole mobilities of at least two orders of magnitude.

13. The organic semiconductor device according to claim 12, wherein the thiol compound is at least one selected from the group consisting of: 4-Methylthiophenol; 4-(Methylthio)thiophenol; 3,4-Dimethoxythiophenol; 4-Phenylthiophenol; 2-Thionaphthol; 4-(Dimethylamino)thiphenol; Benzyl mercaptan; 2,3,4,5,6-Pentamethylbenzene-1-thiol.

14. The organic semiconductor device according to claim 12, wherein the thiol compound is at least one selected from the group consisting of: 4-Methylthiophenol and 4-(Dimethylamino)thiphenol.

15. An organic semiconductor device comprising an n-channel transistor, said organic semiconductor device having at least one organic semiconducting material and at least two electrodes adapted to support an electric charge carrier transport through the organic semiconducting material, wherein the organic semiconducting material is at least one polymer selected from a polymer of the formula

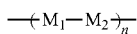

wherein:

M$_1$ is an optionally substituted naphthalene imide selected from:

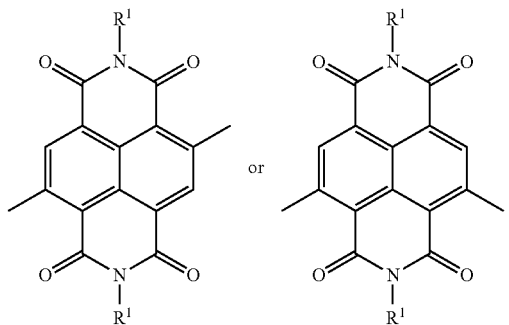

R$^1$, at each occurrence, is independently selected from H, a C$_{1-40}$ alkyl group, a C$_{2-40}$ alkenyl group, a C$_{1-40}$ haloalkyl group, and 1-4 cyclic moieties, wherein:

each of the C$_{1-40}$ alkyl group, the C$_{2-40}$ alkenyl group, and the C$_{1-40}$ haloalkyl group can be optionally substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$;

each of the C$_{1-40}$ alkyl group, the C$_{2-40}$ alkenyl group, and the C$_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and can be optionally substituted with 1-5 substituents independently selected from a halogen, oxo, —CN, NO$_2$, OH, =C(CN)$_2$, —NH$_2$, —NH(C$_{1-20}$ alkyl), —N(C$_{1-20}$ alkyl)$_2$, —S(O)$_2$OH, —CHO, —C(O)OH, —C(O)—C$_{1-20}$ alkyl, —C(O)—OC$_{1-20}$ alkyl, —C(O)NH$_2$, —C(O)NH—C$_{1-20}$ alkyl, —C(O)N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, —O—C$_{1-20}$ alkyl, —O—C$_{1-20}$ alkenyl, —O—C$_{1-20}$ haloalkyl, a C$_{1-20}$ alkyl group, a C$_{1-20}$ alkenyl group, and a C$_{1-20}$ haloalkyl group;

M$_2$ is a repeating unit comprising one or more monocyclic moieties; and n is an integer between 2 and 5,000, wherein M$_2$ is selected from:

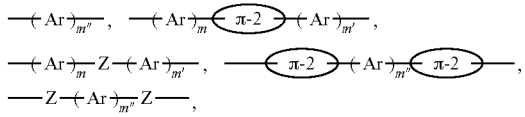

-continued

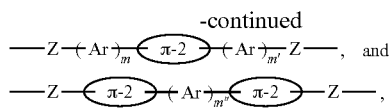

wherein:
π-2 is a polycyclic moiety optionally substituted with 1-6 $R^e$ groups;
Ar, at each occurrence, is independently a 5- or 6-membered aryl or heteroaryl group, wherein each of these groups optionally is substituted with 1-6 $R^e$ groups; wherein:
$R^e$, at each occurrence, is independently a) halogen, b) —CN, c) —NO$_2$, d) oxo, e) —OH, f) =C($R^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;
$R^f$, at each occurrence, is independently a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_w$—OC$_{1-20}$ alkyl, o) —S(O)$_w$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)-C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;
Y, at each occurrence, is independently selected from a divalent C$_{1-6}$ alkyl group, a divalent C$_{1-6}$ haloalkyl group, and a covalent bond; and
w is 0, 1, or 2;
Z is a conjugated linear linker; and
m, m' and m" independently are 1, 2, 3, or 4,
and which intrinsically has ambipolar semiconducting properties, wherein at least one intermediate layer at least partially is interposed between the organic semiconducting material and at least one of the electrodes of the organic semiconductor device, wherein the intermediate layer comprises at least one thiol compound selected from the group consisting of: 1-Decanethiol; 4-Methylthiophenol; 4-(Methylthio)thiophenol; 3,4-Dimethoxythiophenol; 4-Phenylthiophenol; 2-Thionaphthol; 4-(Dimethylamino)thiphenol; Benzyl mercaptan; 2,3,4,5,6-Pentamethylbenzene-1-thiol, wherein by the intermediate layer an ambipolar charge carrier transport between the electrodes is suppressed in favor of a unipolar negative charge carrier transport having a difference between electron and hole mobilities of at least two orders of magnitude, wherein the organic semiconductor device is producible by the method according to the method of claim 1.

16. The organic semiconductor device according to claim 12 or 15, wherein the organic semiconductor device comprises a channel for charge carrier transport between the electrodes, the channel having a channel length from 1 μm to 500 μm.

17. The organic semiconductor device according to claim 12 or 15, wherein the organic semiconductor device comprises a channel for charge carrier transport between the electrodes, the channel having a channel length from 5 μm to 200 μm.

18. A method for suppressing an ambipolar charge carrier transport in favor of a unipolar negative charge carrier transport in an organic semiconductor device comprising an n-channel transistor, said organic semiconductor device having at least one organic semiconducting material and at least two electrodes adapted to support an electric charge carrier transport through the organic semiconducting material is at least one polymer selected from a polymer of the formula

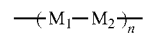

wherein:
$M_1$ is an optionally substituted naphthalene imide selected from:

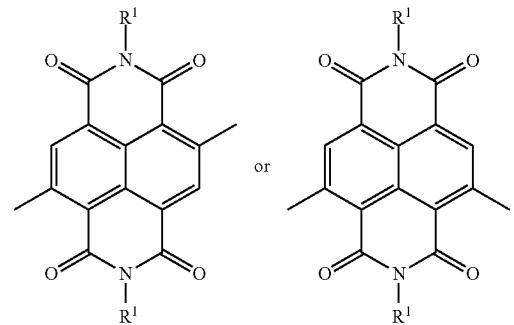

$R^1$, at each occurrence, is independently selected from H, a $C_{1-40}$ alkyl group, a $C_{2-40}$ alkenyl group, a $C_{1-40}$ haloalkyl group, and 1-4 cyclic moieties,
wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$;

each of the $C_{1-40}$ alkyl group, the $C_{2-40}$ alkenyl group, and the $C_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —NH$_2$, —NH(C$_{1-20}$ alkyl), —N(C$_{1-20}$ alkyl)$_2$, —S(O)$_2$OH, —CHO, —C(O)OH, —C(O)—C$_{1-20}$ alkyl, —C(O)—OC$_{1-20}$ alkyl, —C(O)NH$_2$, —C(O)NH—C$_{1-20}$ alkyl, —C(O)N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, —O—C$_{1-20}$ alkyl, —O—C$_{1-20}$ alkenyl, —O—C$_{1-20}$ haloalkyl, a $C_{1-12}$ alkyl group, a $C_{1-20}$ alkenyl group, and a $C_{1-20}$ haloalkyl group;

$M_2$ is a repeating unit comprising one or more monocyclic moieties; and n is an integer between 2 and 5,000, wherein $M_2$ is selected from:

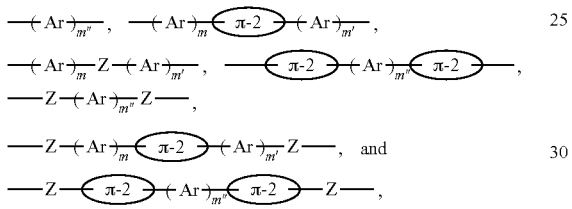

wherein:
π-2 is a polycyclic moiety optionally substituted with 1-6 $R^e$ groups;

Ar, at each occurrence, is independently a 5- or 6-membered aryl or heteroaryl group, wherein each of these groups optionally is substituted with 1-6 $R^e$ groups; wherein:

$R^e$, at each occurrence, is independently a) halogen, b) —CN, c) —NO$_2$, d) oxo, e) —OH, f) =C($R^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—C$_{3-10}$ cycloalkyl group, n) a —Y—C$_{6-14}$ aryl group, o) a —Y—C$_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_w$—OC$_{1-20}$ alkyl, o) —S(O)$_w$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)-C$_{6-14}$ aryl, am) —S(O)$_w$N(C$_{6-14}$ aryl)$_2$, an) —SiH$_3$, ao) —SiH(C$_{1-2}$ alkyl)$_2$, ap) —SiH$_2$(C$_{1-20}$ alkyl), aq) —Si(C$_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is independently selected from a divalent $C_{1-6}$ alkyl group, a divalent $C_{1-6}$ haloalkyl group, and a covalent bond; and w is 0, 1, or 2;

Z is a conjugated linear linker; and m, m' and m" independently are 1, 2, 3, or 4, comprising at least partially interposing an intermediate layer between at least one of the electrodes and the organic semiconducting material, wherein the intermediate layer comprises at least one thiol selected from the group consisting of: 1-Decanethiol; 4-Methylthiophenol; 4-(Methylthio)thiophenol; 3,4-Dimethoxythiophenol; 4-Phenylthiophenol; 2-Thionaphthol; 4-(Dimethylamino)thiophenol; Benzyl mercaptan; 2,3,4,5,6-Pentamethylbenzene-1-thiol, wherein by the intermediate layer an ambipolar charge carrier transport between the electrodes is suppressed in favor of a unipolar negative charge carrier transport having a difference between electron and hole mobilities of at least two orders of magnitude.

* * * * *